United States Patent
Watanabe et al.

(10) Patent No.: US 6,925,255 B2
(45) Date of Patent: Aug. 2, 2005

(54) CAMERA

(75) Inventors: Sayuri Watanabe, Hachioji (JP); Sumito Honda, Akishima (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 10/964,115

(22) Filed: Oct. 13, 2004

(65) Prior Publication Data

US 2005/0047776 A1 Mar. 3, 2005

Related U.S. Application Data

(62) Division of application No. 10/417,411, filed on Apr. 16, 2003, now Pat. No. 6,842,585.

(30) Foreign Application Priority Data

| Apr. 18, 2002 | (JP) | ..... 2002-116578 |
| May 22, 2002 | (JP) | ..... 2002-148163 |
| May 14, 2002 | (JP) | ..... 2002-139051 |
| Jun. 12, 2002 | (JP) | ..... 2002-171593 |
| Jun. 12, 2002 | (JP) | ..... 2002-171621 |
| Jun. 12, 2002 | (JP) | ..... 2002-171624 |
| Jun. 18, 2002 | (JP) | ..... 2002-177048 |
| Jun. 18, 2002 | (JP) | ..... 2002-177432 |
| Aug. 2, 2002 | (JP) | ..... 2002-226397 |
| Aug. 8, 2002 | (JP) | ..... 2002-231983 |

(51) Int. Cl.$^7$ ............ G03B 7/026; G03B 17/02
(52) U.S. Cl. .............. 396/301; 396/535
(58) Field of Search ............... 396/205, 206, 396/301, 535, 542; 348/374

(56) References Cited

U.S. PATENT DOCUMENTS

| 5,150,140 A | * | 9/1992 | Kitazawa ............ 396/176 |
| 5,458,506 A | | 10/1995 | Yamaguchi et al. |
| 5,752,119 A | | 5/1998 | Miyamoto et al. |
| 6,219,495 B1 | | 4/2001 | Miyamoto et al. |
| 6,456,797 B1 | * | 9/2002 | Boyd et al. ............ 396/155 |
| 6,654,064 B2 | | 11/2003 | Ishikawa |

FOREIGN PATENT DOCUMENTS

| JP | 54-93455 A | 7/1979 |
| JP | 01-230931 A | 9/1989 |
| JP | 07-142130 A | 6/1995 |
| JP | 07-153532 A | 6/1995 |
| JP | 07-212044 A | 8/1995 |
| JP | 07-225422 A | 8/1995 |
| JP | 07-335341 A | 12/1995 |
| JP | 08-018297 A | 1/1996 |
| JP | 09-160181 A | 6/1997 |
| JP | 2000-003747 A | 1/2000 |
| JP | 2000-075378 A | 3/2000 |
| JP | 2001-005061 A | 1/2001 |
| JP | 2001-196130 A | 7/2001 |
| JP | 3218768 B2 | 8/2001 |

* cited by examiner

*Primary Examiner*—W. B. Perkey
(74) *Attorney, Agent, or Firm*—Frishauf, Holtz, Goodman & Chick, P.C.

(57) ABSTRACT

A camera is provided which includes a camera exterior housing which covers the camera and which has an inclined surface. A first electric part and a second electric part are provided such that longitudinal directions thereof are parallel. A first end surface of the first electric part and a first end surface of the second electric part are disposed along an inner wall of the inclined surface of the exterior housing so as to form a step. In addition, a connector for connection of a flexible printed substrate is provided which includes a connector terminal array provided in a connector main body and a holding member which is adapted to switch between a holding position and a releasing position. The flexible printed substrate is insertable and removable with respect to a first side of the connector main body when the holding member is in the releasing position.

27 Claims, 45 Drawing Sheets

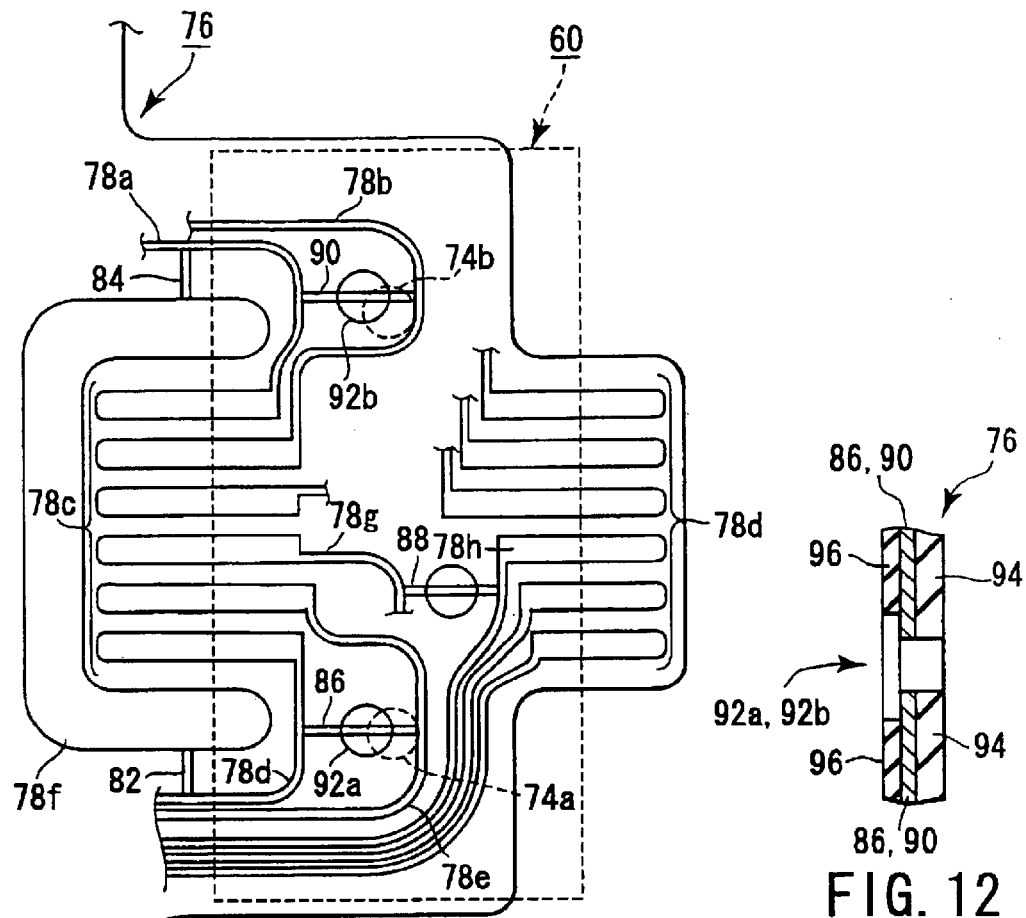
FIG. 11
FIG. 12
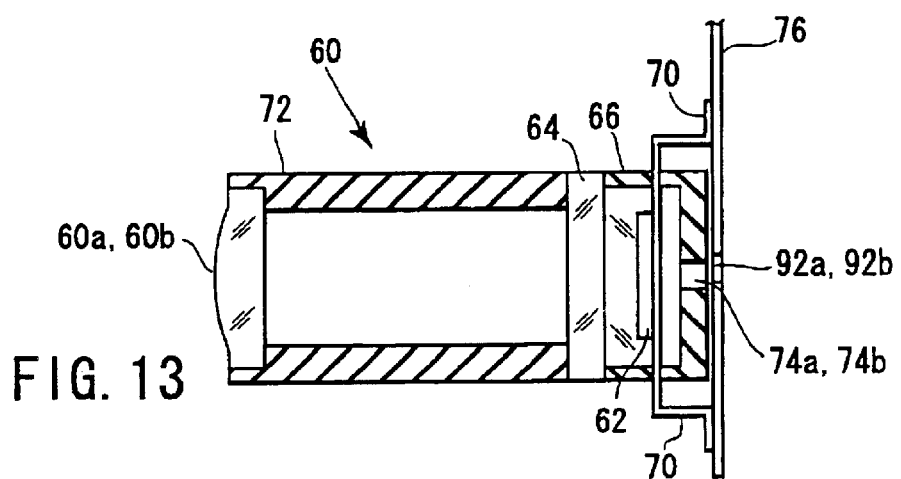
FIG. 13

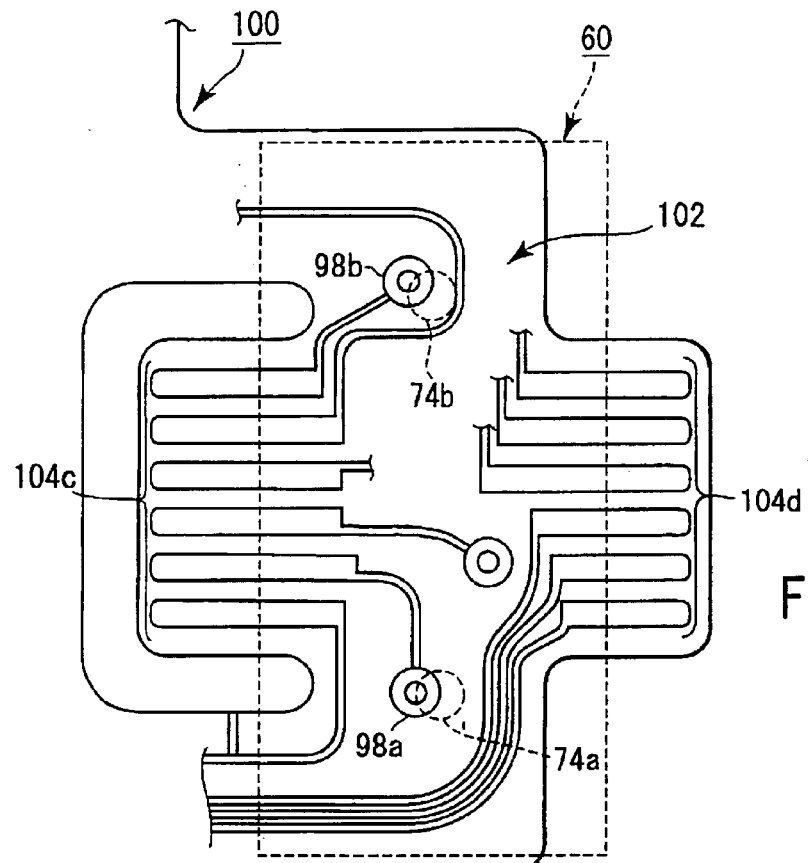
FIG. 14
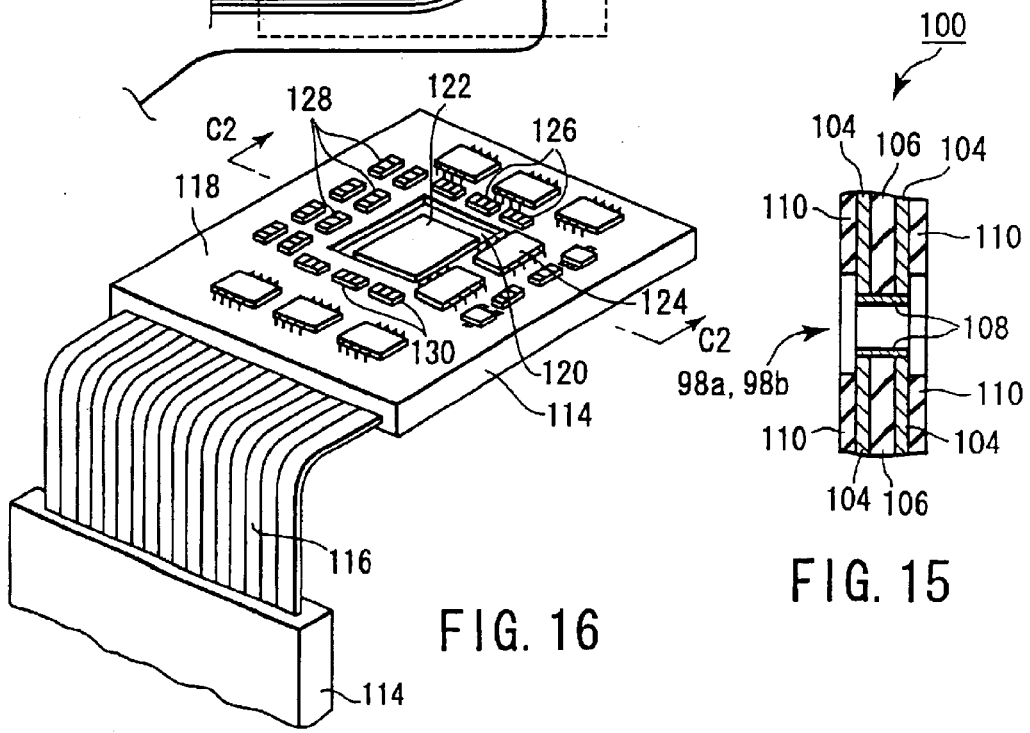
FIG. 15
FIG. 16

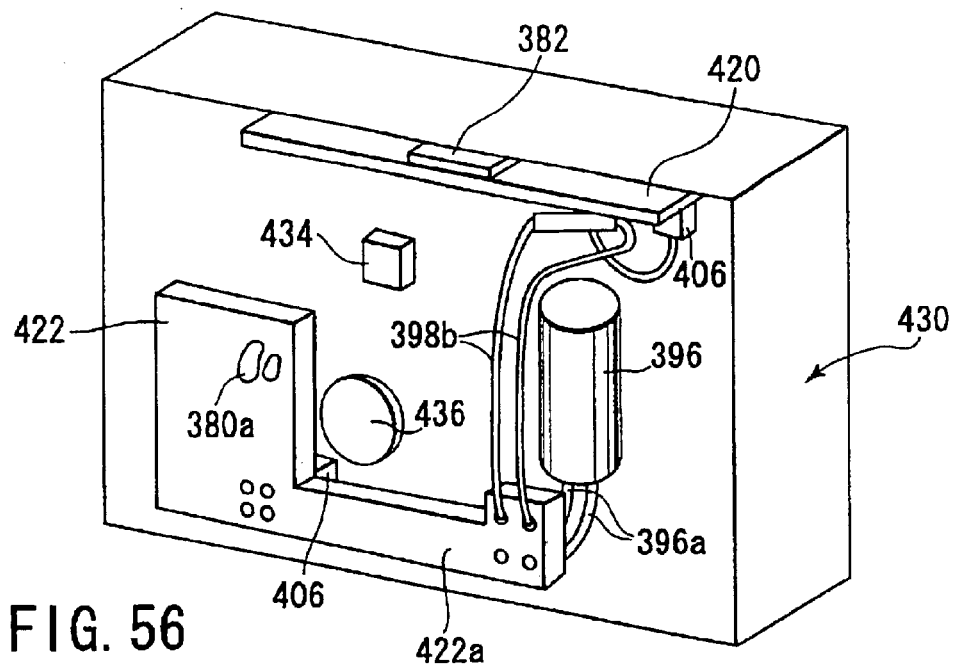
FIG. 56
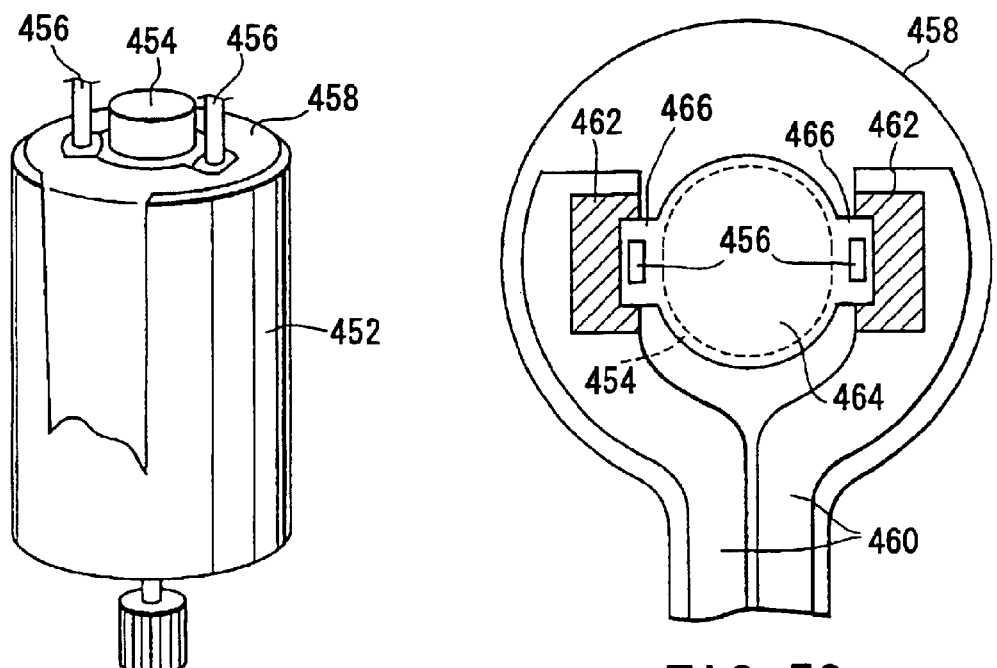
FIG. 57
FIG. 58

CAMERA

CROSS-REFERENCE TO RELATED APPLICATIONS

The present application is a divisional application of U.S. application Ser. No. 10/417,411, filed Apr. 16, 2003, now U.S. Pat. No. 6,842,585, which is based upon and claims the benefit of priority from the prior Japanese Patent Application Nos. 2002-116578, Apr. 18, 2002; No. 2002-139051, May 14, 2002; No. 2002-148163, May 22, 2002; No. 2002-171593, Jun. 12, 2002; No. 2002-171621, Jun. 12, 2002; No. 2002-171624, Jun. 12, 2002; No. 2002-177048, Jun. 18, 2002; No. 2002-177432, Jun. 18, 2002; No. 2002-226397, Aug. 2, 2002; and No. 2002-231983, Aug. 8, 2002.

BACKGROUND OF THE INVENTION

1. Field of the Invention

The present invention relates to a camera.

2. Description of the Related Art

In a related-art mounting technique of components employed in a camera, as shown in FIGS. 1 and 2, sensor units such as an AF sensor 2 have, in some cases, heretofore been mounted directly on a substrate 4.

In this example, the AF sensor 2 is disposed in such a manner that a sensor array including arranged pixels for light receiving elements (not shown) is disposed opposite to a subject as a ranging object. Moreover, in order to form a subject image, two light receiving lenses 2a, 2b in front of the sensor array are disposed apart from the sensor array by a focal distance f. When a predetermined parallax (distance interval) is given to these light receiving lenses 2a, 2b, a subject distance is obtained by a known "principle of triangular ranging" in a constitution.

The accuracy of the AF sensor is sometimes deteriorated by ambient environments such as temperature, and it has been necessary to devise various features in an implementation method.

For example, in Jpn. Pat. Appin. KOKAI Publication No. 2001-5061, a technique is disclosed comprising: disposing insulation means between a strobe device and AF sensor to prevent ranging accuracy from being deteriorated by heat generated by the strobe device is disclosed.

On the other hand, in recent years, a sensor has been developed which has variously been improved and which includes a new structure. For example, in a structure shown in FIGS. 3A and 3B, a part of the AF sensor 2 is sealed by a gelled material 6. Vent holes 8a, 8b are formed in the AF sensor in order to prevent an error from being superimposed on breakage of the sensor itself or a sensor output, even when the gelled material expands/contracts by a change of temperature or air pressure (details are described later).

Moreover, when a hard (print) substrate is held or superimposed on the FPC substrate, both multilayer and bend are realized, and connector-less and three-dimensional arrangement of the substrate is possible. A so-called "rigid flexible substrate" is brought in practical use. Furthermore, a technique has been brought in the practical use, comprising: using a flip chip bonding process to mount semiconductor elements (hereinafter referred to as bare chips) such as a CPU directly on the printed substrate; and enhancing a mounting density.

That is, as shown in FIG. 4, rigid substrates 12 are held or superimposed on FPC substrates 10 to constitute rigid FPC substrates 14. Subsequently, a bare chip 16 is mounted (hereinafter referred to as the flip chip mounting) on the rigid substrate 12.

Furthermore, with miniaturization of an electronic apparatus, the miniaturization of an electric substrate including a built-in electric circuit has been advanced, and various connectors for electrically connecting the electric substrates to one another have been provided.

For example, FIG. 5 is a perspective view showing a state at a time when an FPC substrate for connection is inserted into and connected to a related-art vertical-type connector for connecting the FPC substrate. FIG. 6 is a perspective view showing appearance of a compact camera as one of electronic apparatuses to which the related-art vertical-type connector for connecting the FPC substrate shown in FIG. 5 is applied. FIG. 7 is a sectional view taken along line C1—C1 of FIG. 6, showing the periphery of the vertical-type printed substrate connector in the camera of FIG. 6.

A related-art vertical-type connector for connecting the FPC substrate (hereinafter referred to as the FPC connector) 20 shown in FIG. 5 is mounted to be upright on a rigid substrate 22. A connection pattern is disposed in a tip-end connection portion in an FPC substrate for connection 24 inserted into and connected to the FPC connector 20. Furthermore, the tip-end connection portion includes a double structure including a reinforcing substrate 26 which prevents deformation at an insertion time and which secures a contact pressure between the connection pattern and connector-side connector terminal array.

When the FPC substrate 24 is connected to the FPC connector 20, the connection-pattern surface is inserted from a direction B1 (substrate vertical direction) crossing at right angles to an arrangement direction of the connector-side terminal array and brought into the connector-side terminal array. Thereafter, a fixing member 20a is pressed to fix the FPC substrate 24, and a connection state to connector-side connector terminals is obtained.

As shown in FIG. 6, in a camera 30 to which the related-art vertical-type FPC connector 20 is applied, a photography lens 34, flash light emitting window 36, and release operation button 38 are disposed in a camera front cover portion 32a. On the other hand, an LCD display portion 40, and mode setting switch buttons 42 are disposed in a camera back cover portion 32b.

Moreover, as shown in FIG. 7, the rigid substrate 22 is disposed under the mode setting switch buttons 42. Electronic members 44 and vertical-type FPC connector 20 are mounted on the mounting surface of the rigid substrate 22. The FPC connector 20 is connected to an FPC substrate for connection 46 for transmitting a control signal, a switch signal output for setting a photographing mode, and the like to a main substrate (not shown).

On the other hand, a related-art horizontal-type FPC connector 52 shown in FIG. 8 is mounted in parallel with the mounting surface of a rigid substrate 54. A connection pattern surface is also disposed in the tip-end connection portion of an FPC substrate for connection 56 which is inserted/connected into the FPC connector 52. Moreover, the tip-end connection portion includes a double structure to which a reinforcing substrate 58 is attached.

When the FPC substrate 56 is connected to the FPC connector 52, the substrate is pressed in from a direction B2 (substrate parallel direction) crossing at right angles to an arrangement direction of the connector terminal array, and brought in contact with the connection pattern surface. Thereafter, a fixing member 52a is pressed, fixed, and connected.

Furthermore, as well known, in recent years, sophistication of the camera has advanced with multiplication of functions. As a result, a mounted electric circuit is complicated. Also for a main condenser for emitting a flash light which is incorporated in the camera including a flash light emitting device, enlargement of a capacity has advanced so as to obtain a high-luminance flash light emitting device.

On the other hand, the miniaturization of a camera body housing in which the condenser for emitting the flash light is incorporated has advanced. However, with the advance of capacity enlargement of the condenser, a volume of the condenser has accordingly increased. Therefore, there is a problem that it is difficult to mount a large-volume condenser in the miniaturized camera.

To solve the problem, for example, in Jpn. Pat. Appln. KOKAI Publication No. 7-225422, the following method of efficiently disposing the large-capacity condenser in the camera is disclosed. That is, two condensers are used, one condenser is disposed in a hollow portion in a spool for winding up a film, and the other condenser is disposed along a spool chamber wall. By this technique, the condenser which saves space and which has a large volume can be mounted.

Moreover, there are many relatively large components such as the condenser for the flash light emitting device and a transformer, which handle a high voltage. Therefore, it is difficult to dispose these components in a small-sized camera. It is also difficult to mount these components on the printed substrate in the camera. As a result, it has been difficult to miniaturize the camera including the flash light emitting device because of the above-described large-sized components.

To solve the difficulty, a technique of disposing the components of the above-described flash light emitting device in a spaced formed in accordance with a film chamber for containing the film is disclosed, for example, in Jpn. Pat. Appln. KOKAI Publication No. 9-160181.

Moreover, in recent years, the following type of a display portion for displaying a photographing mode or date of the camera has increased. That is, examples of this include a camera including a liquid crystal. panel, and a camera which reads film sensitivity information by an electrode pattern disposed in a cartridge portion of a film, so-called "DX code" to control exposure in accordance with the read information.

The liquid crystal panel is disposed on the upper surface of the camera in many cases. A contact for reading the DX code by the camera is disposed on a front-surface side in the camera in accordance with a position of a film cartridge in many cases. Therefore, to mount these components on the printed substrate, two printed substrates are prepared, and the printed substrates on which the liquid crystal panels are mounted are disposed on the upper-surface side in the camera. Moreover, the printed substrate on which the contact for reading the DX code is mounted is disposed on the front-surface side in the camera in many cases.

That is, to miniaturize the camera or to reduce the cost, the respective components of the camera need to be efficiently disposed on the two printed substrates. When the printed substrate is simply enlarged, the arrangement of the components is simplified, but the cost increases. On the other hand, when the printed substrate is simply miniaturized, the cost can be reduced, but it is difficult to efficiently arrange the components.

Particularly, the components relating to the flash light emitting device include many large-sized components. Since the components handle the high voltage, these easily become sources of noises. Therefore, it is important to more appropriately arrange the components relating to the flash light emitting device.

Furthermore, a camera including the condenser for the flash light emitting device is disclosed, for example, in Jap. Pat. No. 3218768. In the camera disclosed in this publication, two cameras for emitting the flash light are arranged at a predetermined interval in an internal space of the camera, and a charge capacity necessary for emitting the flash light is secured. Moreover, a hard electric circuit substrate on which a plurality of electric components are mounted is disposed and constituted in a space formed between two cameras, and thereby an internal space is effectively used. Furthermore, in this case, the electric circuit substrate is engaged with and fixed to another electric circuit substrate which is disposed on the upper-surface side of the camera.

Moreover, when electric components such as a motor including a lead as a connector terminal are mounted on the electric substrate, a groove-shaped terminal insertion hole for inserting the lead is sometimes disposed in the substrate. In this case, when the terminal insertion hole is formed in a circular arc shape, it is easily to position the connector terminal of the electric component with reference to the connection portion on the electric substrate. However, when a solder land is formed around the terminal insertion hole to solder the component, much time is required form the soldering. Therefore, a proposal for shortening the soldering time in forming the terminal insertion hole is disclosed in Jpn. Pat. Appln. KOKAI Publication No. 1-230931.

The technique disclosed in the Jpn. Pat. Appln. KOKAI Publication No. 1-230931 comprises: forming the groove-shaped terminal insertion hole for inserting the lead in the electric substrate; and dividing a solder pad disposed along the outer periphery of the terminal insertion hole into a plurality of regions at intervals for boundary slits. In each of these divided regions, the solder pad can be molted in a short time and with a small heat capacity. Therefore, the soldering operation can be ended in the short time, and a possibility of failure in solder connection can also be reduced.

Furthermore, in the electronic apparatus, there is a constitution in which an internal apparatus is contained/disposed in an apparatus housing, and a battery contained in a battery containing chamber disposed in the apparatus housing is used as a driving source to control the operation of the internal apparatus. In the electronic apparatus, a contact piece for a cathode for contacting the cathode of the battery, and a contact piece for an anode for contacting the anode of the battery are separately disposed in the battery containing chamber, and a power of the battery contained in the battery containing chamber is supplied to the internal apparatus via the contact piece for the cathode and the contact piece for the anode.

Additionally, a manufacturing method of the electronic apparatus comprises: preparing a large number of constituting components beforehand; and assembling the constituting components into the apparatus housing in order. Therefore, when the electronic apparatus is manufactured, it is very intricate to store/manage a large number of constituting components.

Especially, there is a battery contact piece as an object of the constituting component whose storage/management is intricate. For the battery contact piece, the contact piece for the cathode and the contact piece for the anode forming a pair are disposed in the battery containing chamber of the apparatus housing. Therefore, a very large number of contact pieces are disposed.

Accordingly, for the battery contact pieces, there is a possibility that the numbers of the contact piece for the cathode and the contact piece for the anode constituting the pair are not matched, and the storage/management is very intricate.

Furthermore, in a small-sized electric apparatus in which the FPC substrate is incorporated, if possible, a single FPC substrate is applied in order to reduce the connection of lead wires and to simplify the handling of the FPC substrate. When the FPC substrate is incorporated in an apparatus main body, it is necessary to shape and incorporate the FPC substrate in accordance with the shape of the apparatus main body. Therefore, the substrate is not easily incorporated. In some cases, there is fear that the FPC substrate is caught and broken by another member.

To solve the problem, for example, in Jpn. Pat. Appln. KOKAI Publication No. 54-93455, a proposal relating to a printed wiring board structure for mounting the small-sized electronic apparatus is described in which the FPC substrate is formed in a box shape and incorporated into the apparatus. In this related-art printed wiring board structure, the rigid substrate is attached to the FPC substrate, the rigid substrate and FPC substrate are simultaneously bent along a fold line disposed in the rigid substrate, and thereby the FPC substrate is shaped in a predetermined box shape. Since the FPC substrate shaped in the box shape and the rigid substrate are incorporated into the apparatus main body, there is no wobble of the FPC substrate at an assembly time, and it is easy to assemble to the substrate.

BRIEF SUMMARY OF THE INVENTION

According to a first aspect of the present invention, there is provided a camera comprising:
  a sensor unit which measures a distance to a subject;
  the sensor unit comprising:
  a photoelectric conversion element;
  a housing with which the photoelectric conversion element is covered and in which a first through hole is formed in a predetermined position; and
  an electric substrate which is electrically connected to the photoelectric conversion element and in which a second through hole is formed in the predetermined position,
  wherein the second through hole formed in the electric substrate is disposed opposite to the first through hole formed in the housing in a state in which the electric substrate is electrically connected to the photoelectric conversion element.

According to a second aspect of the present invention, there is provided an electric substrate on which a sensor unit is to be mounted, comprising:
  a mounting portion on which the sensor unit is mounted and in which a through hole is formed in a predetermined position; and
  a land for sensor unit connection, which is formed in the mounting portion,
  wherein the through hole is disposed opposite to an opening formed in a housing of the sensor unit.

According to a third aspect of the present invention, there is provided a camera including an electric substrate, comprising:
  a flexible substrate;
  a rigid substrate which is superimposed on the flexible substrate and which is formed integrally with the flexible substrate and which includes an opening in a predetermined position;
  an exposed portion which is exposed from the opening on the flexible substrate; and
  a semiconductor element which is flip-chip-mounted on the exposed portion.

According to a fourth aspect of the present invention, there is provided a camera including an electric substrate, comprising:
  a flexible substrate;
  a rigid substrate which is superimposed on the flexible printed substrate and which is formed integrally with the flexible substrate and which includes a cutout portion in an end;
  an exposed portion which is formed in the flexible substrate and which is exposed from the cutout portion;
  an extended portion which is formed in the flexible substrate and which is extended from the exposed portion;
  an electric component connected to the extended portion; and
  a semiconductor element which is flip-chip-mounted on the exposed portion.

According to a fifth aspect of the present invention, there is provided a camera comprising:
  a first electric substrate;
  a second electric substrate; and
  a connector for connection, which is disposed on the first electric substrate and in which the second electric substrate is inserted,
  the connector for connection, including:
  a connector terminal array including a plurality of connector terminals which are electrically connected to the second electric substrate,
  wherein the second electric substrate is insertable in the connector for connection along an arrangement direction of the connector terminal array.

According to a sixth aspect of the present invention, there is provided a camera comprising:
  a plurality of condensers disposed in parallel with one another with respect to a longitudinal direction; and
  a camera exterior housing in which camera constituting components including the plurality of condensers are built in,
  wherein the camera exterior housing includes an inclined surface, and a one-end surface of each of the plurality of condensers is disposed with a step along an inner wall of the inclined surface.

According to a seventh aspect of the present invention, there is provided a camera comprising:
  a first printed substrate on which a circuit is mounted to control a photography sequence of the camera; and
  a second printed substrate on which a discharge emission tube for flash, and a condenser to charge the discharge emission tube and to allow the discharge emission tube to discharge electricity/emit light are mounted,
  wherein the first printed substrate is electrically connected to the second printed substrate via a lead member which forms an electrode of the condenser.

According to an eighth aspect of the present invention, there is provided a camera comprising:
  a photography lens which photographs a subject;
  a cartridge chamber in which a film cartridge is loaded;
  a spool chamber in which a film is wound and contained;
  a transformer disposed in a space portion between one of the cartridge chamber and the spool chamber, and the photography lens;
  a condenser which is disposed in the space portion between the other of the cartridge chamber and the spool chamber, and the photography lens and which is charged by the transformer;

a printed substrate on which the transformer and condenser are mounted; and an arm portion disposed integrally with the printed substrate and extended to a side on which the condenser is mounted from a side on which the transformer is mounted, wherein an electrode portion of the condenser is mounted on the arm portion.

According to a ninth aspect of the present invention, there is provided a camera comprising:

a first printed substrate including a circuit which controls a photography sequence of the camera, and a display device which displays photography information of the camera, the first printed substrate being disposed on an upper-surface side in the camera;

a second printed substrate including a discharge emission tube for flash, and a circuit in which an energy is stored to allow the discharge emission tube to discharge electricity/emit light, the second printed substrate being disposed in a front surface unit on a grip side in the camera; and a trigger circuit which is disposed on the first printed substrate and which allows the discharge emission tube to discharge electricity/emit light, wherein the trigger circuit is disposed in such a manner that a distance between the trigger circuit and the discharge emission tube mounted on the second printed substrate is short.

According to a tenth aspect of the present invention, there is provided a camera comprising:

a first printed substrate disposed on an upper-surface side in the camera;

a second printed substrate disposed on a front-surface side in the camera;

a condenser for flash charge, which includes a lead member to form an electrode of the condenser;

a first switch pattern which is disposed in the first printed substrate and which is connected to a first switch;

a first connection pattern which is disposed in the first printed substrate and which is connected to a display device of the camera;

a second switch pattern which is disposed in the second printed substrate and which is connected to a second switch different from the first switch; and a second connection pattern which is disposed in the second printed substrate and which is connected to the lead member.

According to an eleventh aspect of the present invention, there is provided a camera comprising:

a cartridge chamber in which a film cartridge is loaded;

a spool chamber in which a film is wound;

a photography lens which photographs a subject;

a condenser which includes a discharge emission tube for flash and in which an energy is stored to allow the discharge emission tube to discharge electricity;

a transformer which charges the condenser; and a rigid substrate on which the condenser and the transformer electrically connected to the condenser are mounted, wherein the photography lens is disposed between the cartridge chamber and the spool chamber, and the transformer and condenser mounted on the rigid substrate are disposed in a space portion between the cartridge chamber and photography lens and a space portion between the spool chamber and photography lens, respectively.

According to a twelfth aspect of the present invention, there is provided a camera comprising:

a discharge emission tube which discharges electricity/emits light for flash;

a first transformer which allows the discharge emission tube to discharge electricity/emit light;

a first printed substrate which is disposed on an upper-surface side in the camera and which is connected to the first transformer;

a condenser in which an energy is stored to discharge the electricity from the discharge emission tube;

a second transformer which charges the condenser; and a second printed substrate which is disposed on a front-surface side in the camera and which is connected to the condenser, second transformer, and discharge emission tube, wherein the first transformer is disposed in a space between the discharge emission tube and the first printed substrate.

According to a thirteenth aspect of the present invention, there is provided a camera comprising:

two condensers for flash light emission, which are disposed to store a charge for the flash light emission and which are arranged in a row in the same direction and which are disposed in the vicinity so that outer-diameter portions of the condensers substantially abut on each other; and an electric circuit substrate on which a plurality of electric components are mounted, wherein some of the plurality of electric components mounted on the electric circuit substrate are disposed in a space having a substantially triangular section including an abutment point on which the two condensers for the flash light emission abut as one vertex and including a tangent line which connects the outer-diameter portions of two condensers for the flash light emission to each other as a bottom side, and at least a part of the electric circuit substrate is fixed to the outer-diameter portions of the two condensers for the flash light emission.

According to a fourteenth aspect of the present invention, there is provided a camera comprising:

two condensers for flash light emission which are arranged in a row in the same direction and which are disposed in the vicinity so as to abut on each other and which store a charge for the flash light emission;

two electric circuit substrates including first and second electric circuit substrates; and a connection member which is disposed in a space having a substantially triangular section including an abutment point abutting on the two condensers for the flash light emission as one vertex and including a tangent line connecting outer-diameter portions of the two condensers for the flash light emission to each other as a bottom side and which connects the first electric circuit substrate to the second electric circuit substrate.

According to a fifteenth aspect of the present invention, there is an electric substrate comprising:

a solder land formed in a periphery of an insertion through portion so that a pair of leads of an electric component including at least one pair of leads are disposed in the vicinity of or abut on the solder land and disposed so that the solder land is electrically connectable to the pair of leads of the electric component, wherein the insertion through portion is formed in continuity to a circular opening formed in the electric substrate.

According to a sixteenth aspect of the present invention, there is provided a camera comprising:

a first contact piece which contacts a cathode of a battery; and a second contact piece which contacts an anode of the battery, wherein the first and second contact pieces are integrally formed, and subsequently divided into two contact pieces.

According to a seventeenth aspect of the present invention, there is provided a flexible printed wiring board comprising:

a land; and a conductor which is mounted on the land and which plastically deformable, wherein the conductor is plastically deformed so that the flexible printed wiring board is holdable in a predetermined bent shape.

According to an eighteenth aspect of the present invention, there is provided a camera comprising:

a first assembly unit which is attached to the camera;

a second assembly unit which is attached to the camera; and a flexible printed wiring board comprising:

a land; and a conductor which is mounted on the land and which is plastically deformable, wherein the flexible printed wiring board is mounted on the second assembly unit, and the mounted conductor is plastically deformed in a predetermined bent shape, when the second assembly unit is incorporated into the first assembly unit.

Additional features and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3A is a side view showing appearance of the AF sensor, and FIG. 3B is a plan view seen from below FIG. 3A;

FIG. 9A is a sectional view showing the appearance of the AF sensor, FIG. 9B is a plan view seen from below FIG. 9B, and FIG. 9C is a perspective view showing that the AF sensor is mounted on the substrate for mounting the AF sensor;

FIG. 11 is a partial enlarged view showing an AF sensor mounting area 80 shown by a broken line in FIG. 10 according to a first embodiment;

FIG. 12 is a sectional view of a through hole in the AF sensor mounting area of the FPC substrate in the first embodiment;

FIG. 13 is a sectional view showing that an AF sensor unit is mounted on the FPC substrate of the first embodiment;

FIG. 14 is a partial enlarged view of the FPC substrate, showing an area exclusive for mounting the AF sensor in an enlarged size according to a second embodiment;

FIG. 15 is a sectional view of the through hole in the AF sensor mounting area of the FPC substrate in the second embodiment;

FIG. 16 is a perspective view of the rigid FPC substrate according to a third embodiment of the present invention;

FIG. 56 is an internal constitution diagram of the camera according to a fourteenth embodiment of the present invention;

FIG. 57 is a constitution diagram of an electric substrate according to a fifteenth embodiment of the present invention;

FIG. 58 is an appearance view in mounting electric components on the electric substrate according to the fifteenth embodiment of the present invention;

DETAILED DESCRIPTION OF THE INVENTION

The following embodiments have been disclosed in Japanese patent application No. 2002-116578 filed on Apr. 18, 2002, in Japan, the entire contents of which are hereby incorporated by reference.

The embodiments of the present invention will be described hereinafter with reference to the drawings.

Figure 9A:
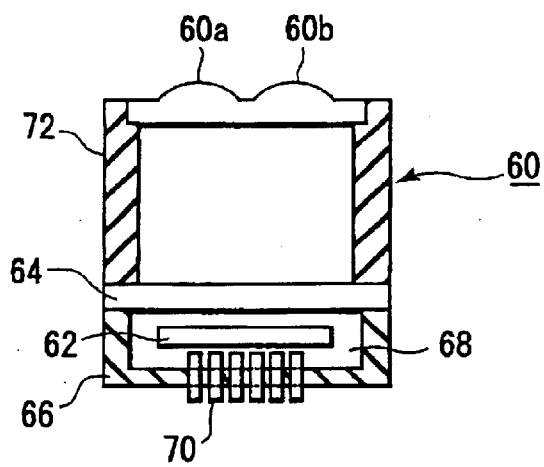
FIGS. 9A to 9C show a combination of the substrate for mounting the AF sensor of a camera of the present invention and the AF sensor to be mounted.
Figure 9B:
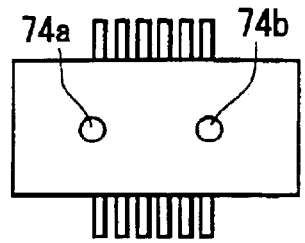
Figure 9C:
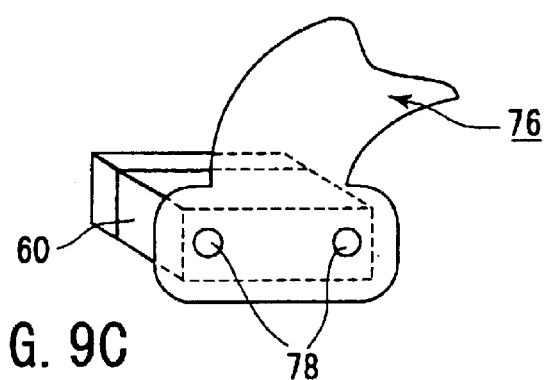

FIGS. 9A to 9C show a case in which an AF sensor unit for use in a camera is mounted on a flexible substrate.

As shown in a side view of FIG. 9A, an AF sensor unit 60 includes a line sensor 62 which is a photo-electric conversion element. The line sensor 62 is covered with a seal cover 64 which has a light transmission property on a light receiving surface side. A side portion and rear surface of the line sensor 62 are covered with a shielding cover 66 which has a shielding property. Moreover, a gelled material 68 is charged among the seal cover 64, shielding cover 66, and line sensor 62, and these components are united in this state.

Furthermore, terminals for connection 70 into the line sensor 62 are exposed to the outside through the shielding cover 66. In this state, the seal cover 64 is attached to a base 72 of the AF sensor unit 60. Light receiving lenses 60a, 60b for guiding a flux into the line sensor 62 are attached to predetermined positions of the base 72. In this manner, the base 72, seal cover 64, and shielding cover 66 form a housing of the AF sensor unit 60.

Moreover, openings 74a, 74b having predetermined sizes are formed opposite to the line sensor 62 of the shielding cover 66. These function as vent holes for introducing an outside air into the gelled material 68 charged inside. Even when the gelled material 68 expands or contracts by a change of temperature or air pressure, the line sensor 62 itself is prevented from being broken, or an error is prevented from being loaded on a sensor output.

For the AF sensor 60 including this structure, as shown in the perspective view of FIG. 9C, through holes for ventilating air 78 have to be disposed in an FPC substrate 76 to be mounted. This will schematically be described along a manufacturing process of the FPC substrate 76.

For example, a plurality of predetermined conductor patterns treated with gold plating are connected to the substrate, and the outer shape holes 78 for eliminating the connection of the conductor patterns after the gold plating treatment are disposed in the vicinity of the vent holes 74a, 74b of the AF sensor 60.

Moreover, to pass a current through the conductor patterns in order to subject the predetermined conductor patterns 78 to electrolytic gold plating treatment, conductor patterns for the gold plating disposed outside (outside an outer shape) are connected as follows. That is, when the conductor patterns are connected to the conductor patterns for the gold plating, a plurality of conductor patterns to be plated with gold are connected. Moreover, after the gold plating treatment, the through holes are disposed in connected portions in order to eliminate the connection of the conductor patterns (details are described later).

Details of a substrate for mounting the AF sensor will be described hereinafter in terms of a plurality of embodiments.

Figure 10:
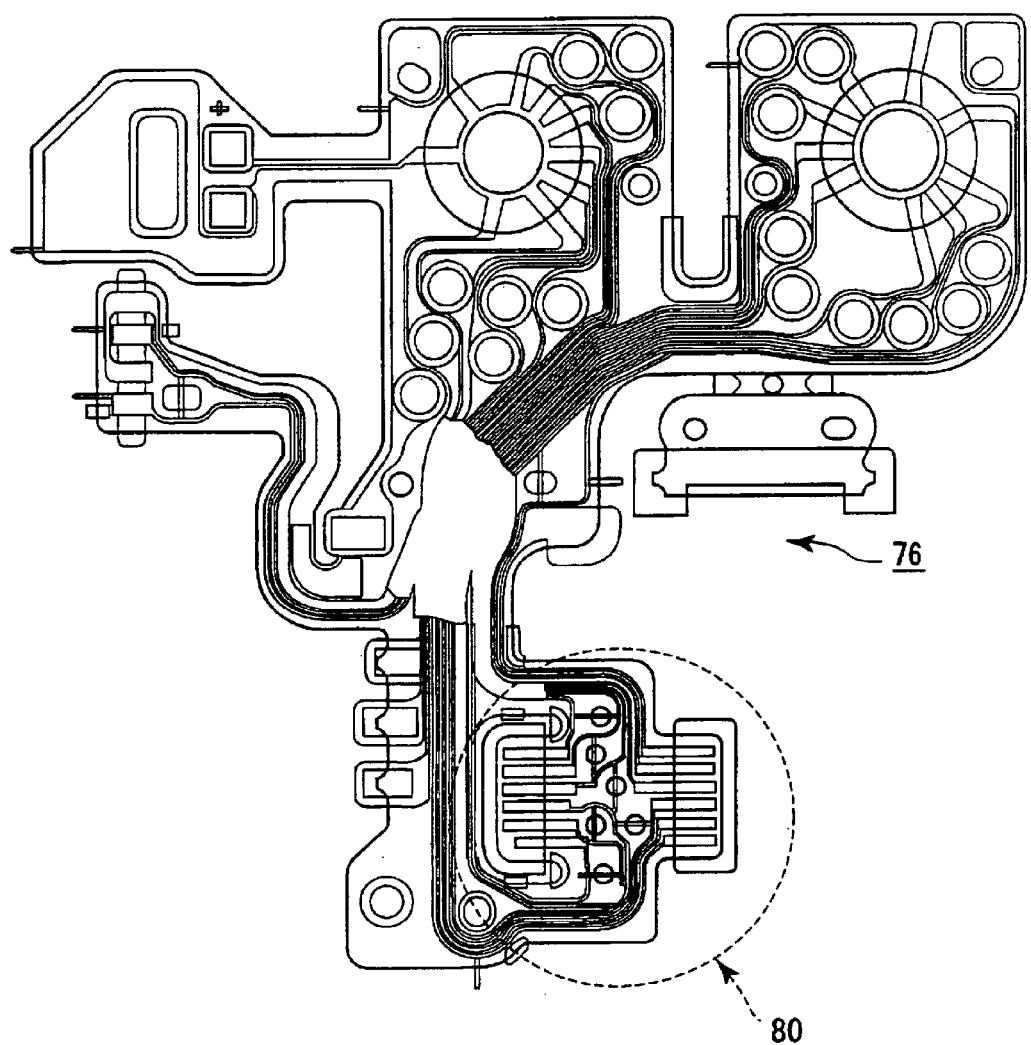
FIG. 10 is a plan view of the FPC substrate which is a concretely illustrated substrate for mounting the AF sensor according to the present invention.

FIG. 10 illustrates the FPC substrate 76 to which characteristics of the substrate for mounting according to the present invention are concretely applied. The FPC substrate 76 illustrated here is a substrate for mounting the AF sensor, and predetermined conductor patterns for operating/controlling an automatic focusing (AF) function for the camera are printed as shown. A mounting area 80 for mounting the AF sensor unit 60 described above is disposed in one end of the substrate 76.

Moreover, FIG. 11 shows the AF sensor mounting area 80 of the FPC substrate 76 illustrated in FIG. 10, for mounting the rectangular AF sensor unit 60 shown by a broken line in an enlarged size.

As seen from a back surface of the FPC substrate 76, the predetermined conductor pattern 78 is also formed in the mounting area 80 disposed for mounting the AF sensor unit 60 which forms a rectangular shape. That is, when the predetermined conductor pattern 78 is treated with the gold plating, conductor patterns for the gold plating treatment 82, 84 disposed to supply/pass the current from the outside are formed between the predetermined conductor patterns in bridge shapes. That is, the conductor pattern for the gold plating treatment 82 is formed to connect a conductor pattern 78f to a conductor pattern 78d, and the conductor pattern for the gold plating treatment 84 is formed to connect the conductor pattern 78f to a conductor pattern 78a.

Moreover, patterns 86, 88, 90 are disposed to be electrically conductive with respect to the conductor patterns for the gold plating treatment 82, 84 so as to pass the current so that the predetermined conductor pattern 78 is subjected to the electrolytic gold plating treatment. These conductor patterns 86, 88, 90 are referred to as connection patterns of the conductor patterns for the gold plating treatment, "connection patterns" in short, and the patterns are formed in the bridge shapes so as to be electrically conductive with respect to the predetermined conductor pattern.

That is, the connection pattern 86 connects the conductor pattern 78d to a conductor pattern 78e. The connection pattern 88 connects a conductor pattern 78g to a conductor pattern 78h. The connection pattern 90 connects the conductor pattern 78a to a conductor pattern 78b.

Furthermore, through holes 92a, 92b for forming the connection of the predetermined conductor patterns after the gold plating treatment are formed in positions (i.e., the same positions as those of the outer shape holes 92a, 92b) such that the connection patterns (86, 90) pass through centers of the positions.

In general, for the FPC substrate, a plurality of FPC substrates are manufactured from one base-material sheet. At this time, after forming the predetermined conductor patterns for the plurality of FPC substrates from one base-material sheet, the individual FPC substrates are cut from the base material and manufactured.

In this manner, when the FPC substrates are cut off, molds such as a punch may also be used in some time. In this case, when the through holes 92a, 92b are formed in the mold for the punch, any manufacturing step does not have to be added.

Moreover, the openings 74a, 74b disposed in the AF sensor unit 60 are formed substantially in the same positions as those of the connection patterns 86, 90, that is, in the vicinity of the through holes 92a, 92b, as shown by a broken-line circle in FIG. 11.

It is to be noted that the through holes 92a, 92b are assumed to be through holes through which a resist or cover lay is opened.

That is, as shown in a sectional view of FIG. 12, for the FPC substrate 76, the conductor patterns 78 or connection patterns 82 to 90 are formed on a base 94 constituted of polyimide. Further on the patterns, a cover lay 96 formed of an insulating material is formed. Moreover, the cover lay 96 is not formed in the positions in which the through holes 92a, 92b are formed.

It is to be noted that in the present embodiment the FPC substrate is shown as the example. However, with the rigid substrate, the conductor pattern is formed on the base formed of an epoxy resin, and the pattern is coated with a resist formed of the insulating material. Therefore, with the use of the rigid substrate, the resist is not formed in the places where the through holes 92a, 92b are formed.

It is to be noted that first and second connection lands 78c, 78d to be connected to the connection terminals 70 of the AF sensor unit 60 are disposed in the mounting area 80, respectively. The first connection land 78c is disposed in a position disposed opposite to the connection terminals 70 extended from one side of the AF sensor unit 60. The second connection land 78b is disposed in a position disposed opposite to the connection terminals 70 extended from the other side of the AF sensor unit 60. Therefore, the first and second connection lands 78c, 78d are. disposed in positions apart from each other by a predetermined amount, and the through holes 92a, 92b are disposed between these first and second connection lands 78c, 78d.

A sectional view in mounting the AF sensor unit 60 on the FPC substrate 76 formed in this manner is shown in FIG. 13.

As shown in FIG. 13, the through holes 92a, 92b are disposed substantially opposite to the openings 74a, 74b formed in the AF sensor unit 60. Therefore, the openings 74a, 74b are not closed by the FPC substrate 76.

As described above, according to the first embodiment, after the gold plating treatment, the outer shape holes for eliminating the connections of the conductor patterns as the bridge-shaped "connection patterns" (86, 88, 90) which have been disposed for the plating treatment are disposed in the vicinity of the vent holes for the AF sensor (substantially in the same position). Accordingly, these vent holes for the AF sensor can be used in common with the outer shape holes. As a result, a mounting space of the FPC substrate 76 can be saved accordingly.

Next, a second embodiment of the present invention will be described.

FIG. 14 shows the AF sensor mounting portion of an FPC substrate 100 on which the above-described AF sensor unit 60 is similarly mounted in an enlarged size according to the second embodiment of the present invention.

In the same manner as in the above-described example of FIG. 11, a rectangular broken line in the figure shows the appearance of the AF sensor seen from the back surface, and broken-line circles show the openings of the AF sensor unit 60. FIG. 15 shows a section of the through hole.

Through holes 98a, 98b are formed as the through holes for setting conductor patterns 104 disposed in the front and back of a base 106 of the AF sensor mounting substrate 100 to be electrically conductive by copper plating 108. These through holes 98a, 98b are formed in positions close to those of the openings 74a, 74b of the AF sensor unit 60 shown by the broken-line circles. Even in this case, in the same manner as in the above-described first embodiment, a cover lay 110 is not formed in the positions of the through holes 98a, 98b. With the use of the rigid substrate, the resist is not formed in the corresponding position.

That is, substantially in the same manner as in the above-described first embodiment, the through holes 98a, 98b are disposed in positions corresponding to the openings 74a, 74b (substantially in the same positions).

Moreover, in the same manner as in the above-described first embodiment, first and second connection lands 104c, 104d are disposed in the FPC substrate 100. Furthermore, the terminals for connection 70 of the AF sensor unit 60 are connected to these lands for connection 104c, 104d. Additionally, the through holes 98a, 98b are disposed between the first and second lands for connection 104c, 104d.

As described above, according to the second embodiment, the through holes 98a, 98b are disposed in the vicinity of the openings of the AF sensor unit 60, so that high-precision ranging can be performed regardless of outer environments such as temperature, air pressure, and humidity. The through holes disposed in the vicinity of the openings of the AF sensor unit are formed by the through holes for forming a desired circuit, so that it is not necessary to newly form the through holes. Accordingly, the mounting space of the FPC substrate 100 can be saved for the holes. Therefore, a smaller FPC substrate can be realized.

(Modification Example of Second Embodiment)

Furthermore, the above-described second embodiment may be modified/implemented as follows, and an effect similar to that of the first embodiment can be expected.

For example, the FPC substrates 76, 100 illustrated in the above-described first and second embodiments may also be hard printed substrates.

Moreover, the FPC substrate 100 described in the second embodiment may also be the hard printed substrate including the structures of the through holes.

It is to be noted that, needless to say, the number and positions of through holes to be formed in the mounting substrate may be matched with those of through holes disposed in the AF sensor which is a mounting object.

When the modifications are carried out, effects similar to or more than those of the above-described first and second embodiments can also be expected.

The present invention has been described above based on the embodiments, but the present specification includes the following invention. For example, to subject the predetermined conductor pattern to the electrolytic gold plating treatment, the current is passed through the conductor pattern. To set the conductor pattern to be electrically conductive with respect to the conductor pattern for the gold plating, disposed outside the outer shape, the conductor pattern is connected to the conductor pattern for the gold plating. In this case, the substrate is connected to a plurality of conductor patterns to be subjected to the gold plating, and the outer shape holes are disposed in the connected portion in order to eliminate the connections of the conductor patterns after the gold plating treatment. There can be provided the substrate for mounting the AF sensor of the camera, characterized as described above, and the camera including the substrate.

The following embodiments have been disclosed in Japanese patent application No. 2002-139051 filed on May 14, 2002, in Japan, the entire contents of which are hereby incorporated by reference.

Figure 1:
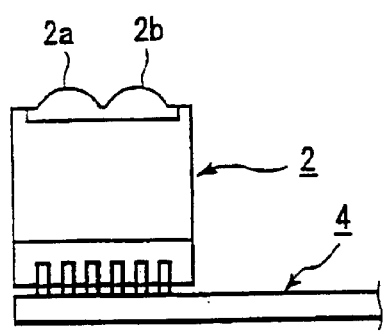
FIG. 1 is a side view of an AF sensor mounted directly on a related-art flexible substrate.
Figure 2:
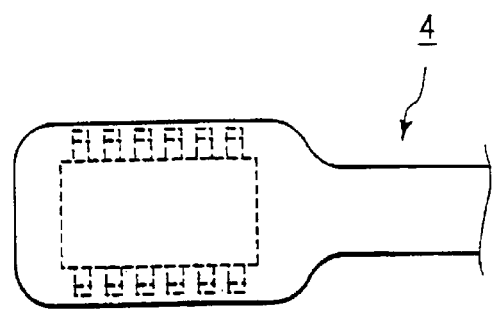
FIG. 2 is a plan view of the AF sensor mounted directly on the related-art flexible substrate of FIG. 1 as seen from below FIG. 1.
Figure 3A:
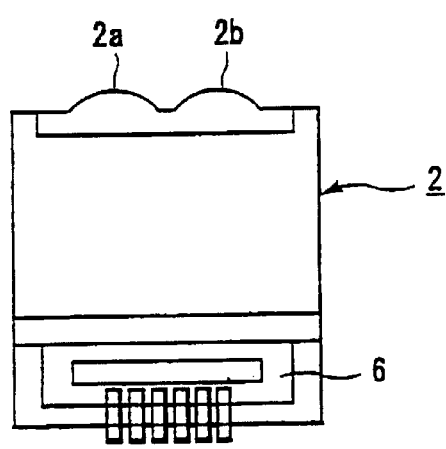
FIGS. 3A and 3B show a combination of a substrate for mounting the AF sensor of a related-art camera and the AF sensor to be mounted.
Figure 3B:
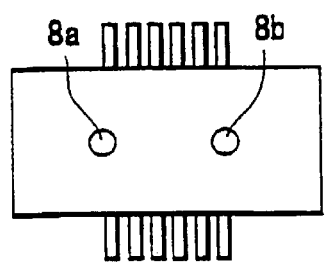
Figure 4:
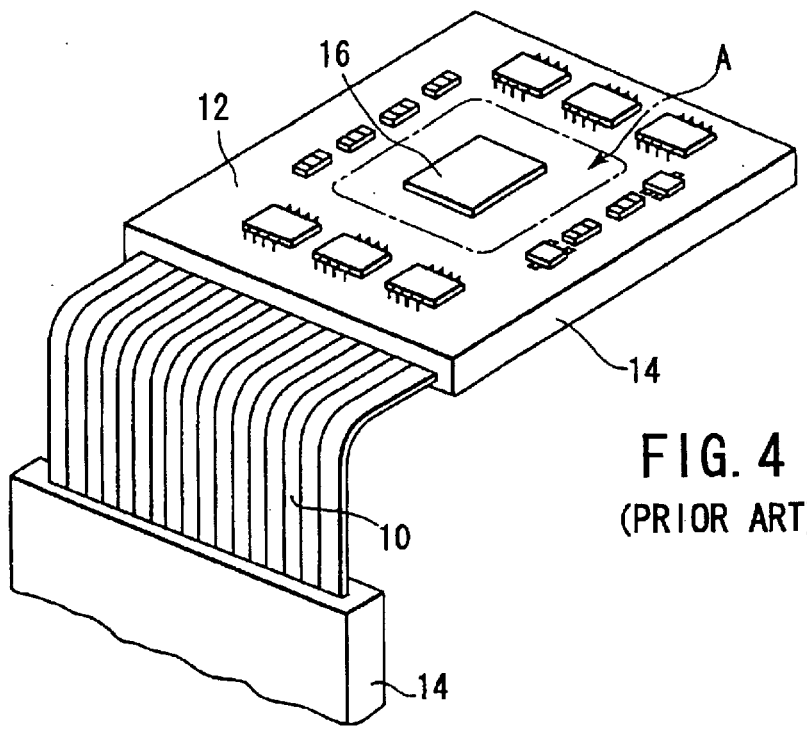
FIG. 4 is a perspective view of a rigid FPC substrate which has heretofore been used.

Additionally, as shown in FIG. 4, for the flip-chip mounting onto the rigid FPC substrate 14, the bare chips 16 such as the CPU are usually mounted on the rigid substrate 12 of the substrate 14. However, when a stress is imposed on the substrate during the assembling or at a fixing time of the substrate, the stress is imposed on an end surface of the flip-chip mounted bare chip. As a result, there is a problem that connection strength becomes unstable and reliability is deteriorated. This is because the rigid substrate has high hardness.

Moreover, since one component cannot mounted together with the other component in the flip-chip mounting, a method of first flip-chip mounting an element and subsequently mounting peripheral components is conventional. However, when the peripheral components are mounted by reflow, a cream solder is printed. Therefore, for a peripheral portion A of the flip-chip mounted element (portion surrounded with a broken line in FIG. 4), a step for escaping from the flip-chip mounted element is disposed in a mask for printing. Therefore, the printing becomes difficult, and the peripheral portion has a restriction that the components cannot be mounted.

A third embodiment will be described hereinafter with reference to the drawing.

FIG. 16 is a perspective view of the rigid FPC substrate according to the third embodiment of the present invention.

A rigid FPC substrate 114 shown in FIG. 16 includes a multilayered structure in which an FPC substrate 116 is held in a rigid substrate 118 and superimposed.

In a middle portion of the surface exposed to the outside of the rigid substrate 118, a round, rectangular, or square opening 120 is formed by a hole extending through the substrate 118. A part of the inner FPC substrate 116 is exposed by the opening 120. Moreover, a bare chip 122 of the CPU is disposed as a semiconductor element in the opening 120, and mounted on the exposed FPC substrate by a flip-chip bonding process.

Figure 17:
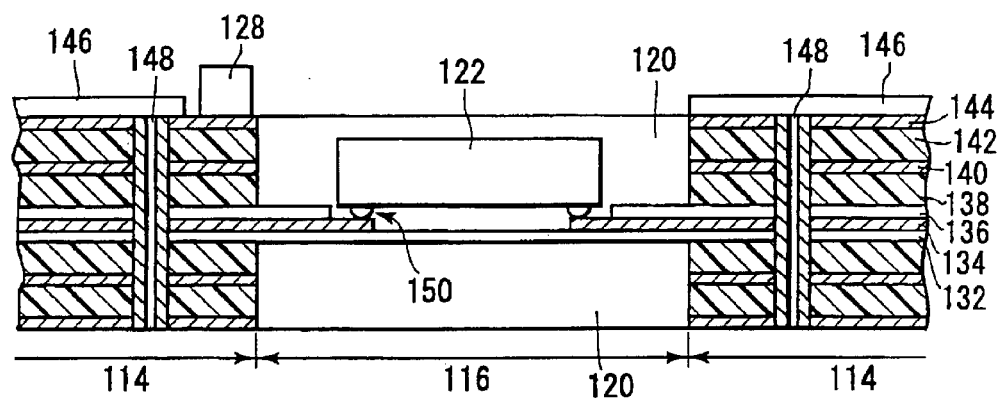
FIG. 17 is a sectional enlarged view along line C2—C2 of FIG. 16.

FIG. 17 is an enlarged sectional view along line C2—C2 of the rigid FPC substrate 62 shown in FIG. 16.

The FPC substrate 116 is constituted of a base film layer 132 generally using insulating materials such as polyimide, a conductor layer 134, and a cover lay film layer 136 including a material similar to that of the base film layer 132. The conductor layer 134 is attached to the upper surface of the base film layer 132 by an adhesive layer (not shown). Moreover, the cover lay film layer 136 is bonded to the upper surface of the conductor layer 134.

Furthermore, in the middle portion of the rigid substrate 118, the rectangular, round, or square opening 120 is formed by the hole extending through the substrate 118, and a part of the FPC substrate 116 is exposed by the opening 120. Further in a part of the exposed FPC substrate 116, the cover lay film layer 136 is removed, and the conductor layer 134 is exposed.

On the other hand, the bare chip 122 disposed in the opening 120 is mounted on the exposed portion of the conductor layer 134 so as to contact a pad (not shown) disposed on the undersurface via a conductive protrusion 150. Additionally, the bare chip 122 is electrically connected to the FPC substrate 116. It is to be noted that examples of a connection method include a method by a conductive adhesive, a method using an adhesive sheet containing fine conductive particles, and a method using mutual diffusion of metals.

The rigid substrate 118 includes a structure in which glass epoxy copper laminate plates are superposed upon opposite surfaces of the FPC substrate 116, and FIG. 17 shows that two layers are superposed on each of the upper and lower surfaces. Therefore, for the rigid substrate 118, a glass epoxy layer 138, conductor layer 140, glass epoxy layer 142, and conductor layer 144 are stacked in order. Furthermore, through holes 148 for connecting all the conductor layers to one another are formed on opposite sides of the opening 120.

That is, the conductor layer 140 is bonded to the upper surface of the glass epoxy layer 138. The glass epoxy layer 142 is bonded to the upper surface of the conductor layer 140. The conductor layer 144 is bonded to the upper surface of the glass epoxy layer 142. Moreover, a solder resist layer 146 is formed on the upper surface of the conductor layer 144 which is an outermost layer. A component land is disposed in the opening of the solder resist layer 146 so that an electronic component 128, and the like can be mounted.

In the rigid FPC substrate according to the third embodiment of the present invention constituted in this manner, the opening 120 by the through hole is disposed in the middle portion of the rigid substrate 118. Further in a part of the FPC substrate exposed in the opening 120, the flip-chip mounting is performed. Therefore, even when the stress is imposed on the rigid substrate 114 during the assembling or at the substrate fixing time, the flexible substrate 116 with the bare chip 122 of the CPU mounted thereon has flexibility. Therefore, the stress is not easily imposed on the end surface of the directly flip-chip mounted bare chip 122, the connection strength can be prevented from being deteriorated, and the reliability of connection can be enhanced.

Moreover, as described above, when the bare chip 122 of the CPU is flip-chip mounted on the rigid FPC substrate 114, the cream solder needs to be printed in order to mount the component around the flip-chip mounting portion with the reflow. However, in the peripheral portion A (see FIG. 4) of the flip-chip mounted element, there is the step for escaping from the flip-chip mounted element in the mask for printing. Therefore, it becomes difficult to print the cream solder, and there is the restriction that the other components cannot be mounted.

However, according to the third embodiment, when the opening 120 is formed in the rigid substrate 118 as shown in FIG. 17, the following results. That is, when the element having a height smaller than the thickness of the rigid substrate 118 is flip-chip mounted, it is not necessary to form the step for escaping from the component in the mask for printing. Accordingly, it is possible to print the cream solder. Therefore, as shown in FIG. 16, many components 124 to 130 can be disposed in the peripheral portion of the bare chip 122 of the CPU. Consequently, the components can be mounted with high density.

Figure 18:
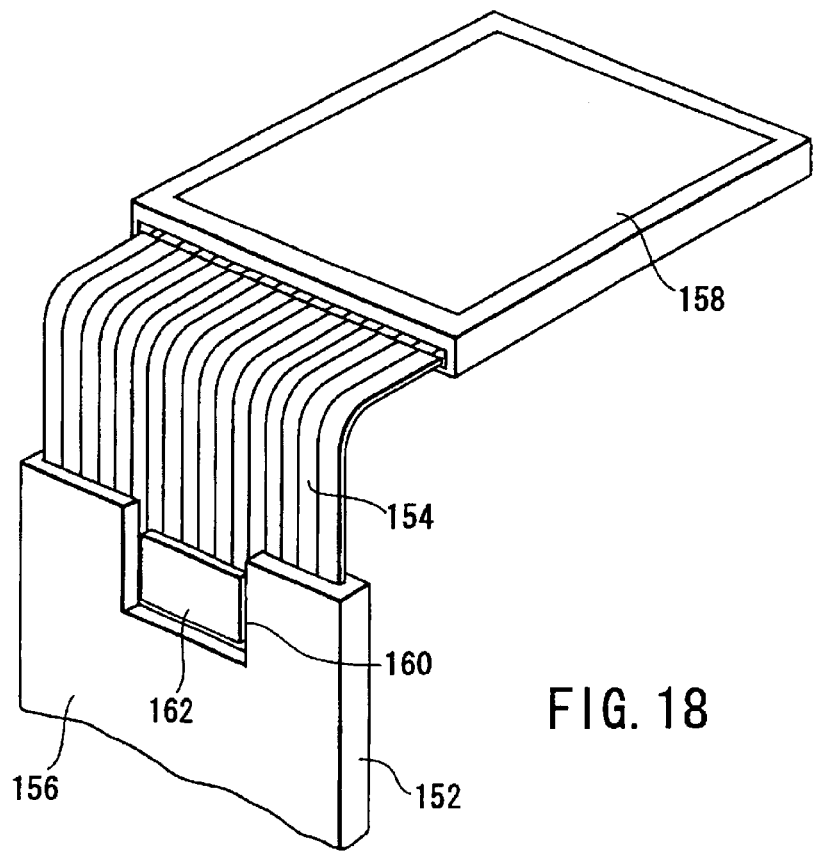
FIG. 18 is a perspective view of the rigid FPC substrate according to a fourth embodiment of the present invention.

FIG. 18 is a perspective view of the rigid FPC substrate according to a fourth embodiment of the present invention.

In FIG. 18, a rigid FPC substrate 152 is constituted in a multilayered structure in which an FPC substrate 154 is held in a rigid substrate 156 and superimposed. An end of the FPC substrate 154 extended from the superimposed portion is connected to a display element 158 constituted of an LCD as an electric component.

Therefore, the display element 158 is disposed opposite to the rigid substrate 156 via the FPC substrate 154 extended from the rigid FPC substrate 152. Moreover, cutouts 160 having U or concave shapes are formed on opposite front and back sides in an edge of the rigid substrate 156 disposed opposite to the display element 158. By these cutouts 160, a part of the inner FPC substrate is exposed.

A bare chip 162 such as the CPU is flip-chip mounted in the cutout 160 so that display signal output terminals, that is, display signal output port group of the bare chip 162 are directed on a display element 158 side.

Accordingly, the display signal output port group of the bare chip 162 such as the CPU has a shortest distance with respect to the display element 158. Therefore, a wiring space is minimized, and wiring efficiency is improved.

Furthermore, the rigid FPC substrate according to the fourth embodiment of the present invention constituted in this manner has the following advantage. That is, in the fourth embodiment, the cutouts 160 are disposed in the edge of the rigid substrate 156, and the bare chip 162 such as the CPU is mounted in the position close to the end in the vicinity of the end surface of the rigid substrate 156 by the cutouts 160. Accordingly, since another space in the rigid substrate can effectively be used, the flip chips can be mounted at the high density.

The following embodiments have been disclosed in Japanese patent application No. 2002-148163 filed on May 22, 2002, in Japan, the entire contents of which are hereby incorporated by reference.

Figure 5:
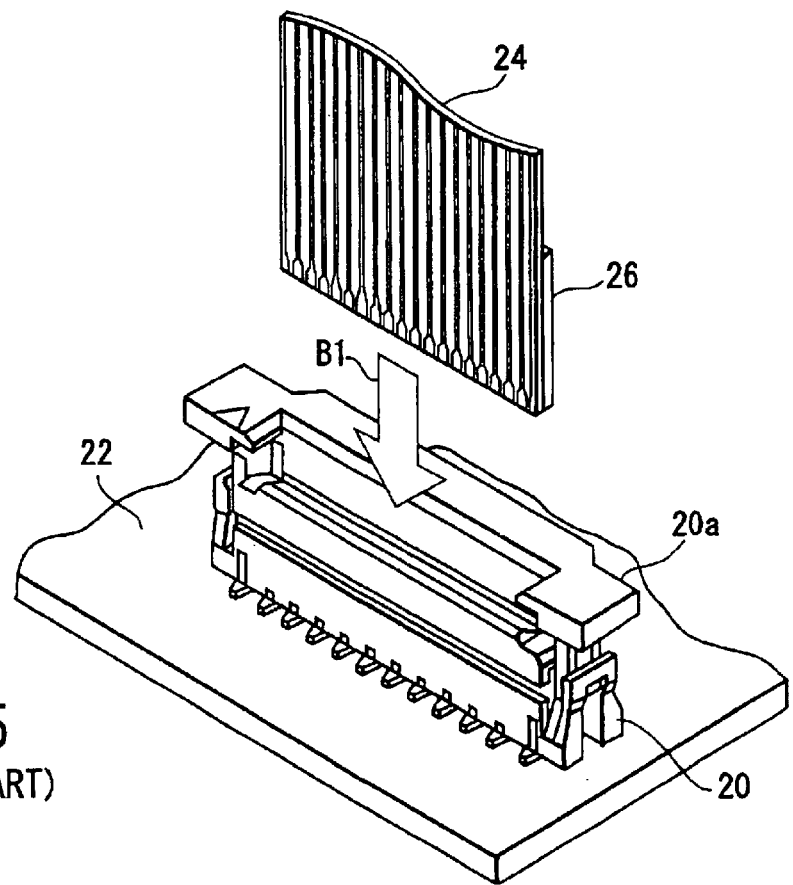
FIG. 5 is a perspective view showing a connection insertion state of a related-art vertical-type connector for connecting the FPC substrate into the FPC substrate for connection.
Figure 7:
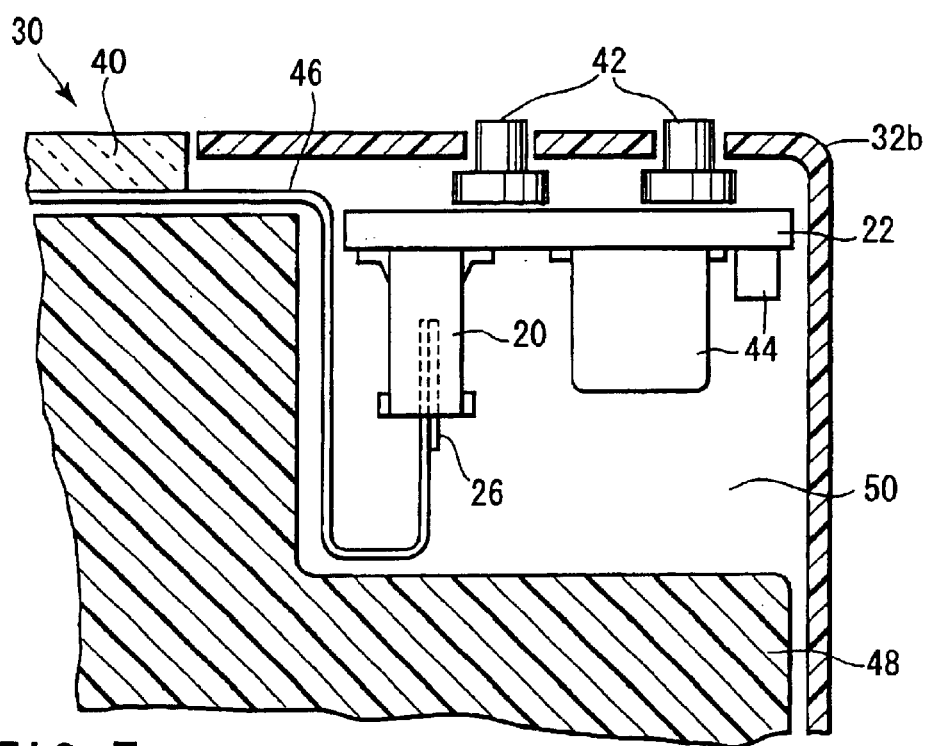
FIG. 7 is a sectional view taken along line C1—C1 of FIG. 6, showing the periphery of the vertical-type printed substrate connector in the camera of FIG. 6.
Figure 8:
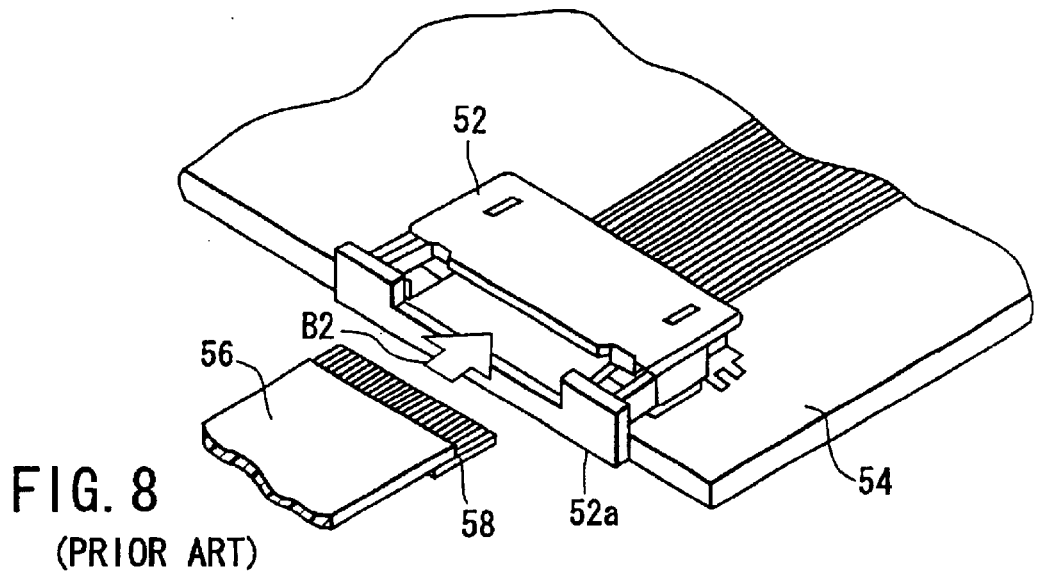
FIG. 8 is a perspective view showing the connection insertion state of a related-art horizontal-type connector for connecting the FPC substrate into the FPC substrate for connection.

Additionally, as described above, when the related-art FPC connector 20 of FIG. 5 is applied to the camera 30 as shown in FIG. 7, the rigid substrate is fixed to a camera main body 48, and subsequently the FPC substrate for connection 46 is connected to the connector, the reinforcing substrate 26 has high hardness and is not easily bent. Therefore, under an insertion port of the FPC connector 20, an empty space 50 whose length is not less than that of the reinforcing substrate 26 is required between the FPC connector 20 and camera main body. This empty space 50 hinders the miniaturization of the camera.

On the other hand, when the rigid substrate 22 is connected to the FPC substrate for connection 46 beforehand, and subsequently fixed to the camera main body 48, the empty space 50 is unnecessary. However, an assembling procedure is restricted. Further on the FPC substrate for connection 46, the electric components such as the LCD display portion 40 displaying the number of photographs are mounted in many cases.

Additionally, when the rigid substrate 22 connected to the FPC substrate for connection 46 is fixed to the camera main body 48, the electric components are obstacles and sometimes damage the disposed components. At an overhaul time, when the FPC substrate for connection 46 is detached, the empty space 50 is not sufficient. Therefore, after removing the rigid substrate 22 which does not have to be essentially removed from the camera main body 48, the FPC substrate for connection 46 is removed from the FPC connector 20. Therefore, the number of overhaul steps increases, and a cost rise is caused.

A fifth embodiment described hereinafter solves this problem. The fifth embodiment will be described hereinafter.

Figure 19:
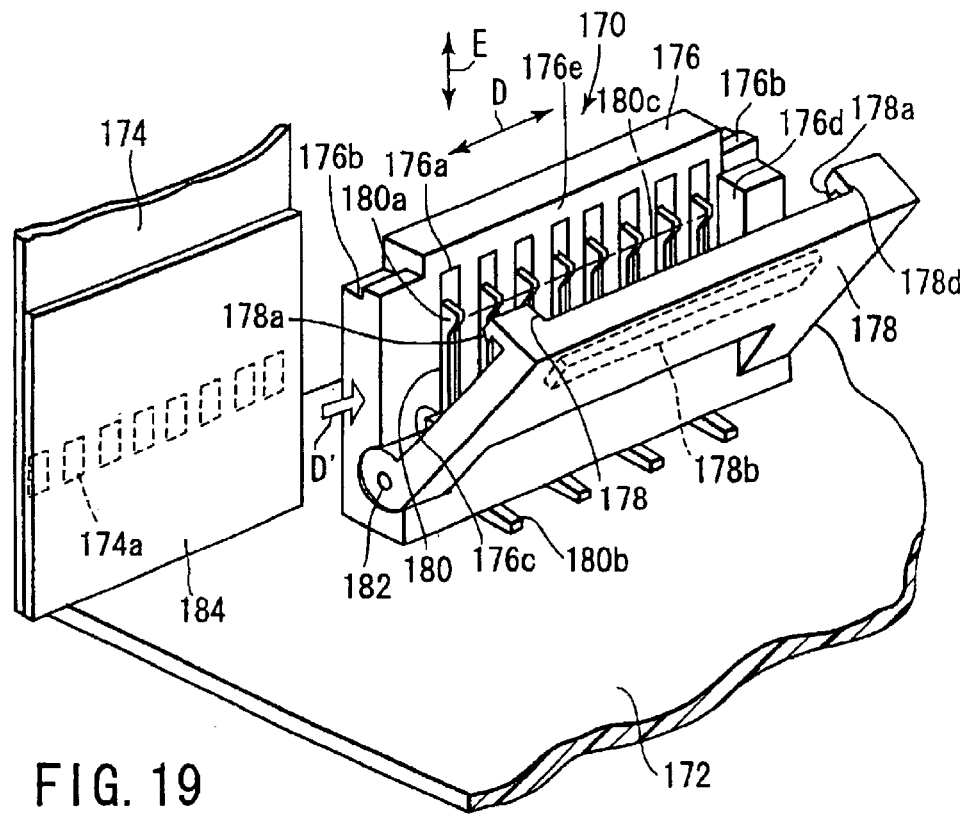
FIG. 19 is a perspective view of an FPC connector and FPC substrate for connection according to a fifth embodiment of the present invention.
Figure 20:
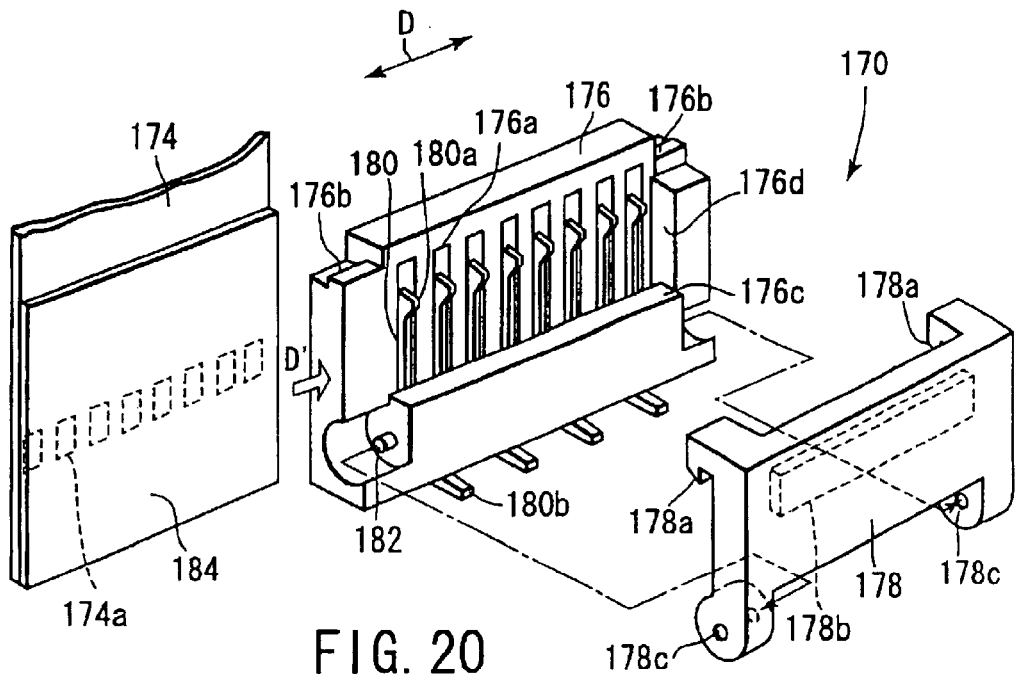
FIG. 20 is an exploded perspective view of the FPC connector and FPC substrate for connection of FIG. 19.
Figure 21:
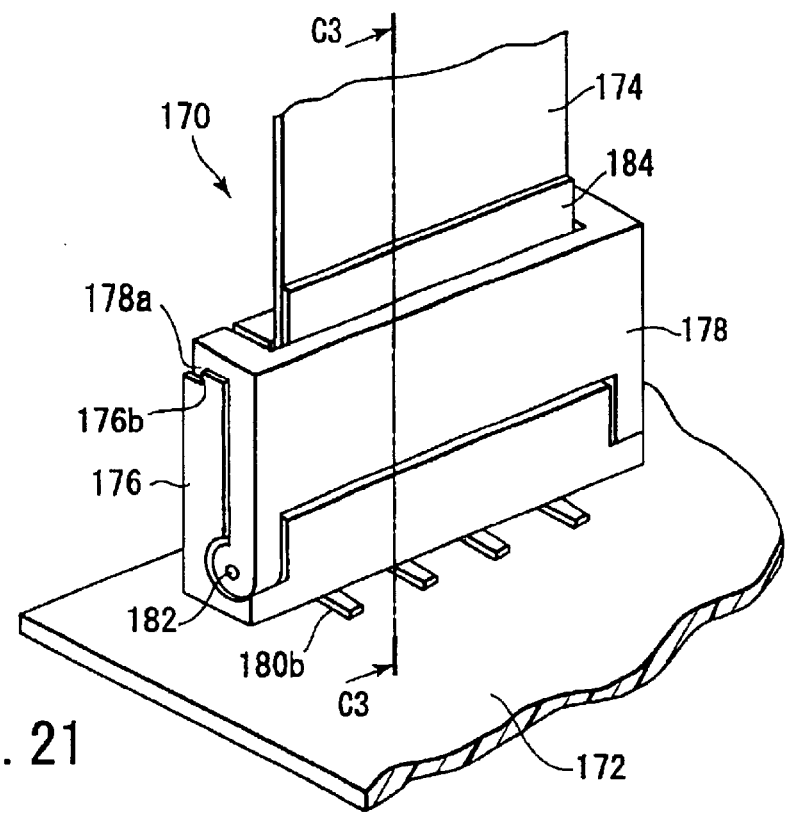
FIG. 21 is a perspective view in a state in which the FPC substrate for connection is connected to the FPC connector of FIG. 19.
Figure 22:
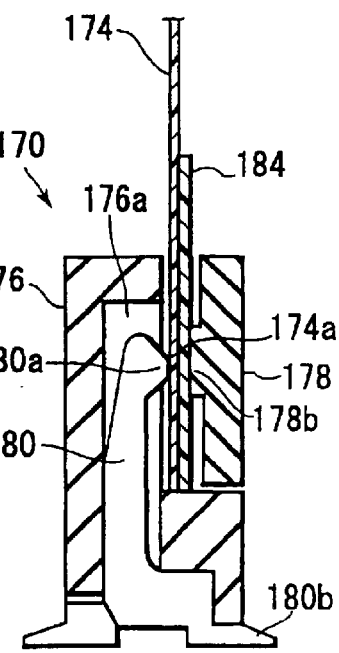
FIG. 22 is a sectional view along line C3—C3 of FIG. 21.

FIG. 19 is a perspective view of the connector for the FPC substrate and the FPC substrate for connection according to the fifth embodiment of the present invention, and a state is shown in which a lock member is released before attaching the FPC substrate for connection. FIG. 20 is an exploded perspective view of the connector for the FPC substrate and the FPC substrate for connection. FIG. 21 is a perspective view in a state in which the FPC substrate for connection is connected to the connector for the FPC substrate, and FIG. 22 is a sectional view along line C3—C3 of FIG. 21.

A connector for FPC substrate connection in the fifth embodiment (hereinafter referred to simply as the FPC connector) 170 is soldered and mounted in an upright state with respect to a rigid substrate 172 as shown in FIGS. 19 and 20. An electric circuit formed or mounted by the FPC connector 170 on a rigid substrate 172 side is electrically connected to an electric circuit formed or mounted on the side of an FPC substrate for connection 174 attached to the FPC connector 170.

The FPC connector 170 mainly includes a connector main body 176, a lock member 178 which is lock means, and a plurality of connection terminal plates 180 held by the connector main body 176.

In the connector main body 176, a plurality of terminal containing concave portions 176a, the number of which corresponds to that of connection contacts, are disposed on an FPC substrate insertion surface 176e, and an FPC substrate tip-end guide surface 176c is disposed on a main body bottom-surface portion. Furthermore, the connector main body 176 includes: an FPC substrate abutment surface 176d in an inner end of an FPC substrate insertion direction (D' direction); stepped engaging portions 176b in opposite ends of a main-body upper width direction; and a support shaft 182 fixed onto a main-body lower side along a D direction.

It is to be noted that the plurality of terminal containing concave portions 176a are disposed on the FPC substrate insertion surface 176e crossing at right angles to the mounting surface of the rigid substrate 172. In the concave portions 176a, the respective connection terminal plates 180 described later are disposed along the D direction (horizontal direction) and incorporated.

The lock member 178 is a member rotatably supported by the support shaft 182 of the connector main body 176. Moreover, the member includes a convex portion 178b which is extended in the D direction in a position disposed opposite to a connection terminal array to press a connection pattern rear surface of the FPC substrate for connection 174. Furthermore, the lock member 178 includes claw portions 178a projecting from the opposite ends in the D direction in the upper part. Support shaft holes 178c are disposed in the opposite ends of the lower D direction.

The connection terminal plates 180 include FPC substrate contact portions 180a which can contact connection pattern portions 174a of the FPC substrate for connection 174. The FPC substrate contact portions 180a are formed of conductive materials. The connection terminal plates 180 also include substrate terminal portions 180b soldered to the connector connection pattern of the rigid substrate 172. Furthermore, the connection terminal plates 180 are fixed/held in the terminal containing concave portions 176a of the connector main body 176 (see FIG. 22).

The connection terminal plates 180, the number of which corresponds to the desired number of connection contacts, are disposed. Moreover, the contacts 180a of the connection terminal plates 180 are exposed and disposed in a projecting state from the FPC substrate insertion surface 176e of the connector main body 176 by a small dimension. These plurality of connection terminal plates 180 form a terminal array (array of connection terminals) 180c along the D direction which is the width direction of the connector main body 176.

When the lock member 178 is rotated to a closed position, the respective contacts 180a of the connection terminal plates 180 are pressed by the convex portion 178b via a reinforcing substrate 184 on the FPC substrate 174 side. Accordingly, the connection terminal plates 180 are slightly elastically deformed. Since the respective connection terminal plates 180 are elastically deformed in this manner, the respective contacts 180a contact the connection pattern 174a of the FPC substrate for connection 174 with an appropriate contact pressure for the electric connection. It is to be noted that the D direction which is the direction of the terminal array 180c is parallel to the mounting surface of the rigid substrate 172 in the mounted state of the FPC connector 170 onto the rigid substrate.

In the FPC substrate for connection 174, the plurality of connection patterns 174a, the number of which corresponds to that of connection contacts, are disposed in the tip-end connection portion. The reinforcing substrate 184 is attached to-the back-surface side of these connection patterns 174a. The plurality of connection patterns 174a are disposed along a connection pattern array (shown D direction). The FPC substrate for connection 174 extends along a vertical direction with respect to the direction (shown D direction) of the arrangement of the connection pattern array.

It is to be noted that the FPC substrate for connection 174 forms any of the following substrates by the constitution of an electric circuit substrate of the apparatus such as the camera to which the substrate is applied. That is, the substrates include an FPC substrate whose other end is connected to a main control FPC substrate (not shown) or which is integral with the main control FPC substrate, or an FPC substrate on which LCD or switch is mounted.

In this manner, the FPC substrate for connection can realize various modes in accordance with the apparatus to which the substrate is applied.

The FPC substrate for connection 174 is connected to the FPC connector 170 of the present embodiment including this constitution as follows.

First, the lock member 178 of the FPC connector 170 mounted on the rigid substrate 172 in the upright state is brought in a released state (lock released state) as shown in FIG. 19. Subsequently, the tip-end connection portion of the FPC substrate for connection 174 is slid/inserted between the connector main body 176 and lock member 178 along the D' direction (horizontal direction) parallel to the shown D direction. At this time, the tip-end surface of the FPC substrate for connection 174 is slid on the FPC substrate tip-end guide surface 176c of the connector main body 176 and inserted, and the side surface of the FPC substrate for connection 174 is allowed to abut on the FPC substrate abutment surface 176d. In the abutment state, the lock member 178 is rotated/operated in a closed direction. As shown in FIG. 21, the claw 178b is engaged with the engaging portion 176b of the connector main body 176 and is locked. Accordingly, a connector connected state is obtained.

In the connector connected state, the FPC substrate for connection 174 in the width direction (the D direction in the figure) is positioned by a width direction step portion 178d of the lock member 178. On the other hand, for a vertical direction (shown E direction), the tip end of the FPC substrate for connection 174 is allowed to contact the FPC substrate tip-end guide surface 176c so that the substrate is positioned.

Moreover, as shown in the sectional view of FIG. 22, the reinforcing substrate 184 of the back-surface portion of the array of the connection patterns 174a is pressed by the convex portion 178b of the lock member 178. Therefore, the connection patterns 174a are pressed in contact with the contacts 180a of the connection terminal plates 180 with a good position accuracy. Accordingly, a secure electric connection state is obtained between the connection patterns 174a and contacts 180a. Furthermore, a circuit formed in the rigid substrate 172, or each line of the mounted electric circuit is connected to each corresponding line of the FPC substrate for connection 174.

When the FPC substrate for connection 174 is disconnected from the FPC connector 170 in the connected state, the claw portion 178a of the lock member 178 is released, and a lock member released state shown in FIG. 19 is obtained. In this state, the FPC substrate for connection 174 can be extracted along an anti-D' direction.

In the above-described connector connection/disconnection method, the FPC substrate for connection 174 is inserted or removed along the D' direction (horizontal direction) parallel to the shown D direction which is the arrangement direction of the terminal array with respect to the FPC connector 170. However, the method is not limited to this. The tip-end connection portion of the FPC substrate for connection 174 can also be inserted/removed, connected, or disconnected along the E direction (vertical direction) crossing at right angles to the D direction.

According to the FPC connector 170 of the present embodiment, when the FPC substrate for connection 174 is attached to/detached from the FPC connector 170, the tip-end connection portion of the FPC substrate for connection 174 is slid/moved along the direction parallel to the rigid substrate 172 (D direction). Accordingly, it is possible to attach or detach the FPC substrate for connection 174.

Therefore, even when a space for extracting the FPC substrate for connection 174 in the mounting surface direction (thickness direction) of the rigid substrate 172 cannot be secured, it is possible to attach or detach the FPC substrate for connection 174. That is, still in the attached state of the rigid substrate 172 onto the apparatus main body, the FPC substrate for connection 174 can be inserted along the mounting surface of the rigid substrate 172, and connected to the FPC connector 170, or extracted and removed.

Moreover, when the FPC substrate for connection 174 is inserted into/removed from the FPC connector 170, the FPC substrate for connection 174 is inserted in the released state of the lock member 178. Therefore, there is a sufficient insertion space around the contact, and there is not a danger that the FPC substrate for connection 174 is damaged or deformed.

Furthermore, the FPC substrate for connection 174 can be inserted into/removed from the FPC connector 170 of the fifth embodiment along the D' direction or the E direction. Therefore, the appropriate inserting/removing direction of the FPC substrate for connection 174 can be selected in accordance with a situation of a disposed position of the FPC connector 170.

Figure 6:
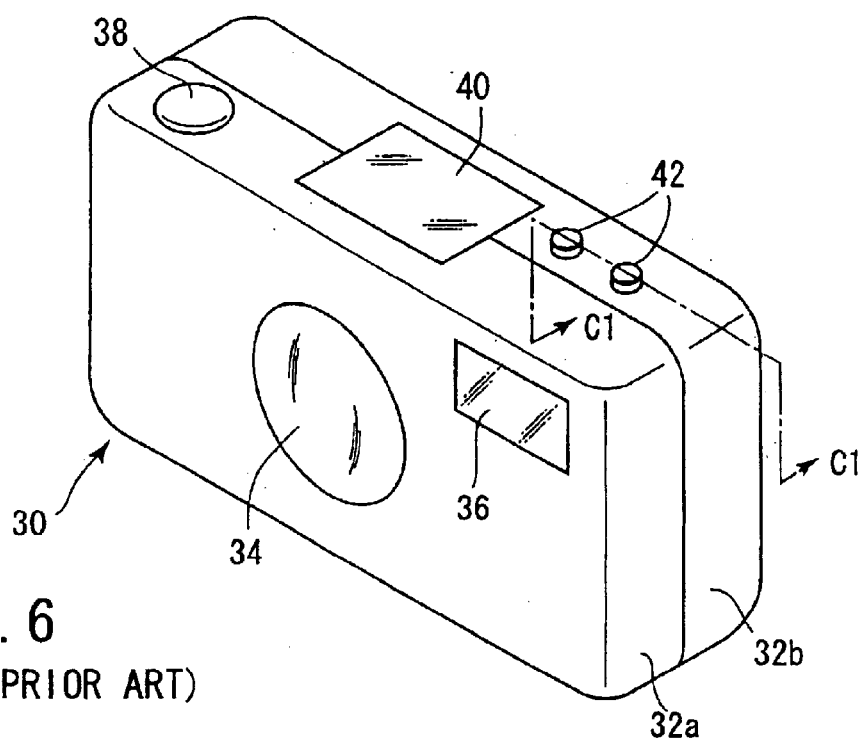
FIG. 6 is a perspective view showing appearance of a compact camera as one of related-art electronic apparatuses to which the related-art vertical-type connector for connecting the FPC substrate is applied.
Figure 23:
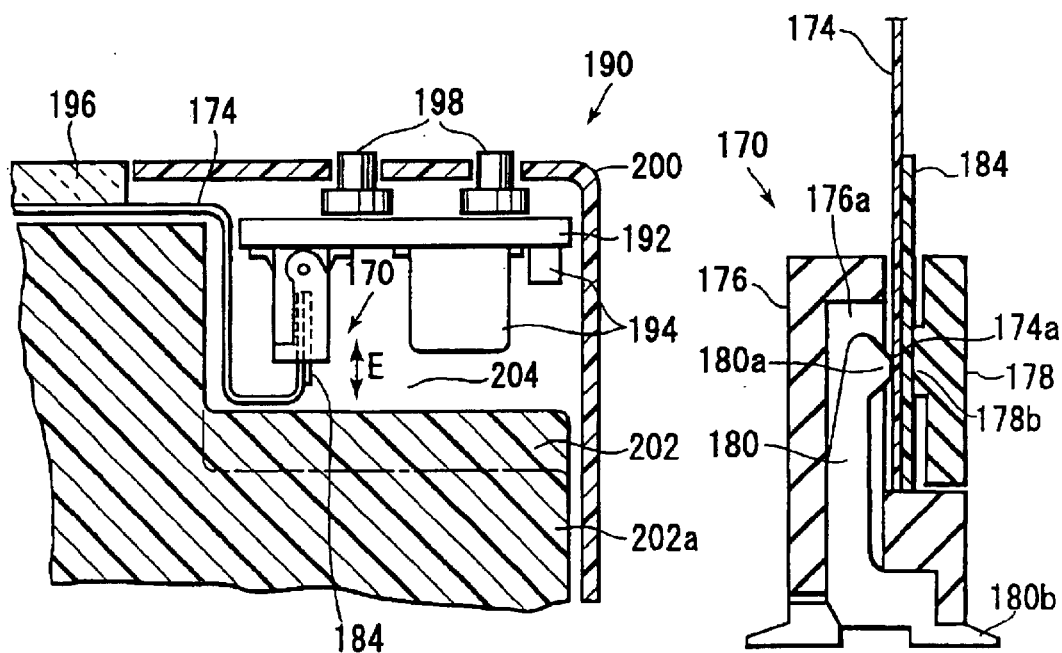
FIG. 23 is a perspective view around the FPC connector at a time of attaching of a rigid substrate to which the FPC connector of FIG. 19 is applied into the camera.

FIG. 23 is a perspective view around the FPC connector at a time of the attaching of the rigid substrate to which the FPC connector of the fifth embodiment is applied into the camera. A camera 190 shown in FIG. 23 includes a constitution similar to that of the camera 30 shown in FIG. 6, and is different in the structure around the FPC connector. A different part will be described hereinafter.

The FPC connector 170 is mounted on a rigid substrate 192 disposed in the camera 190, and connected to the FPC substrate for connection 174. Subsequently, the FPC substrate for connection 174 is bent and disposed in the position of the end of the reinforcing substrate 184. Under mode setting switch buttons 198, the rigid substrate 192 is disposed. Electronic members 194 and the FPC connector 170 are mounted on the mounting surface of the rigid substrate 192. Further on the FPC substrate for connection 174, a camera back cover portion 200 as well as an LCD display portion 196 with which a camera main body 202 is covered are mounted.

While the rigid substrate 192 is fixed to the camera main body 202, the FPC substrate for connection 174 is attached to/detached from the FPC connector 170. In this case, the FPC substrate for connection 174 does not have to be necessarily moved in the E direction crossing at right angles to the mounting surface of the rigid substrate 192. That is, the substrate can be slid in a direction parallel to the D direction (see FIG. 19), that is, in a direction vertical to the sheet surface of FIG. 23 to be attached/detached. Therefore, a space on the mounting surface side of the rigid substrate 192 can be narrowed to a position of 202 from that of a camera main body 202a. That is, as compared with the application of the related-art FPC connector 20 shown in FIG. 7, a smaller space 204 can be used, and it is possible to miniaturize the apparatuses such as the camera.

Next, the FPC connector which is a connector for FPC substrate connection according to a sixth embodiment of the present invention will be described with reference to FIGS. 24 to 26.

Figure 24:
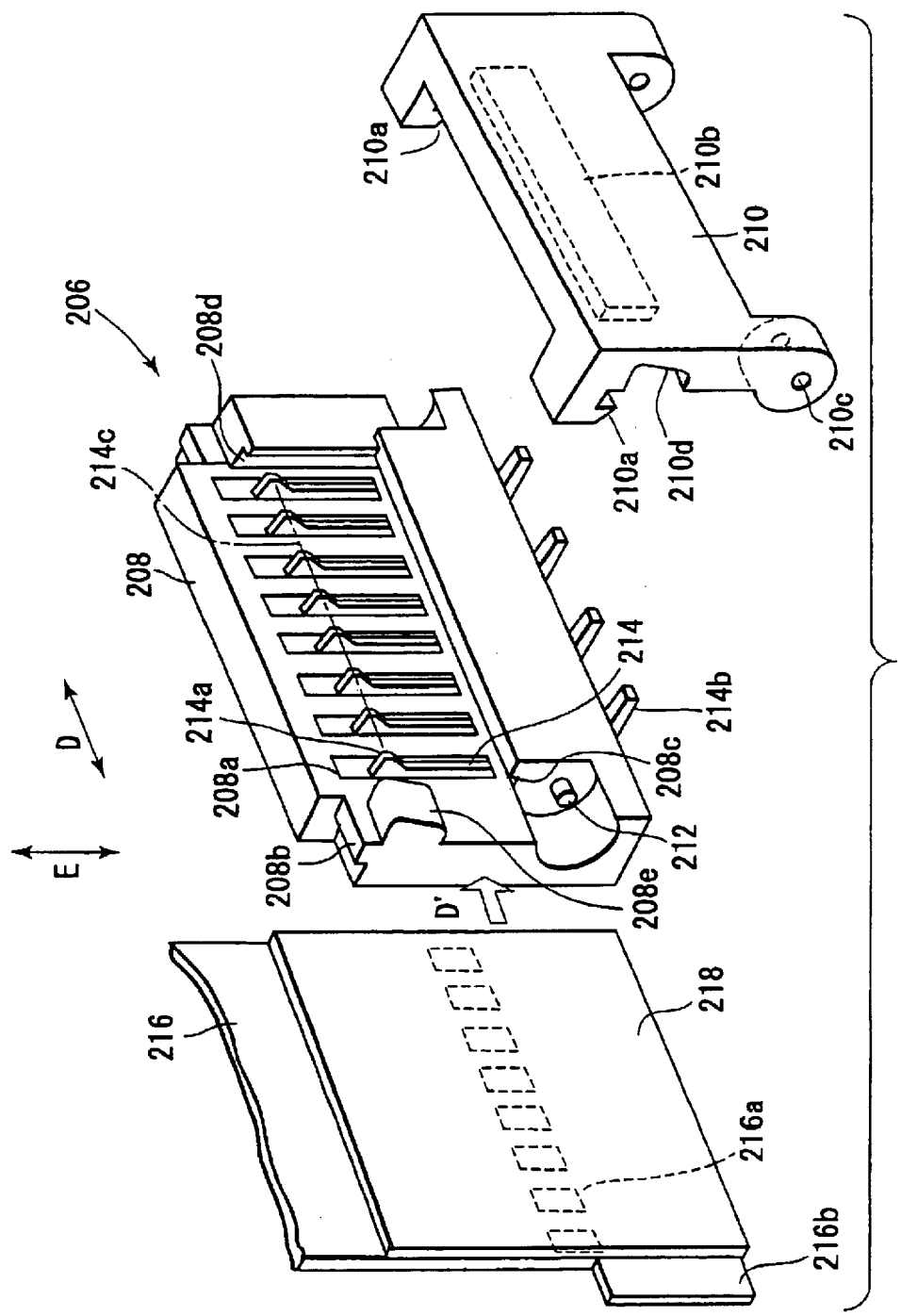
FIG. 24 is an exploded perspective view of the FPC connector and the FPC substrate for connection according to a sixth embodiment of the present invention.

FIG. 24 is an exploded perspective view of the FPC connector and the FPC substrate for connection according to the sixth embodiment. FIG. 25 is a sectional view showing that the FPC substrate for connection is inserted into the FPC connector in the lock member released state. FIG. 26 is a perspective view showing a state of the FPC substrate for connection connected to the FPC connector.

For an FPC connector 206 of the present embodiment, an insertion property of the FPC substrate for connection is further enhanced with respect to the FPC connector 170 of the fifth embodiment. Particularly, a different part from the FPC connector 170 of the fifth embodiment will be described hereinafter.

Figure 25:
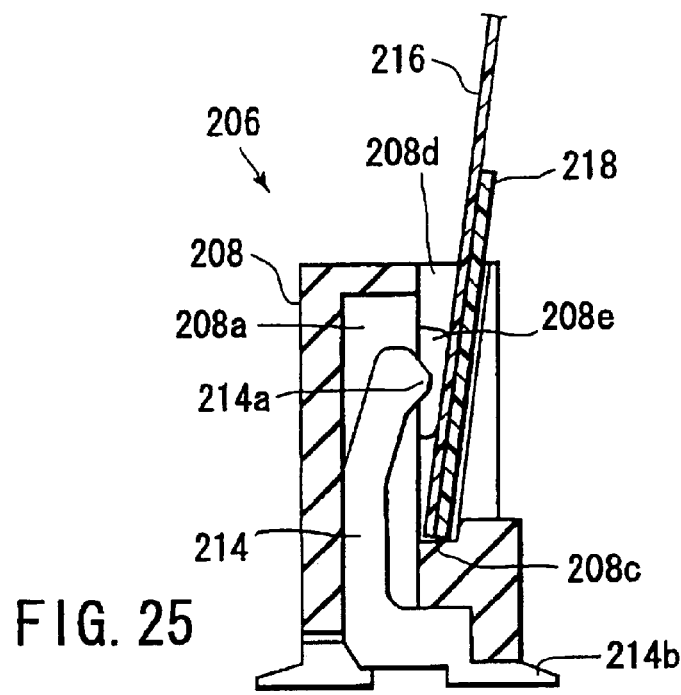
FIG. 25 is a sectional view showing that the FPC substrate for connection is inserted in the FPC connector of FIG. 24 in a lock member released state.
Figure 26:
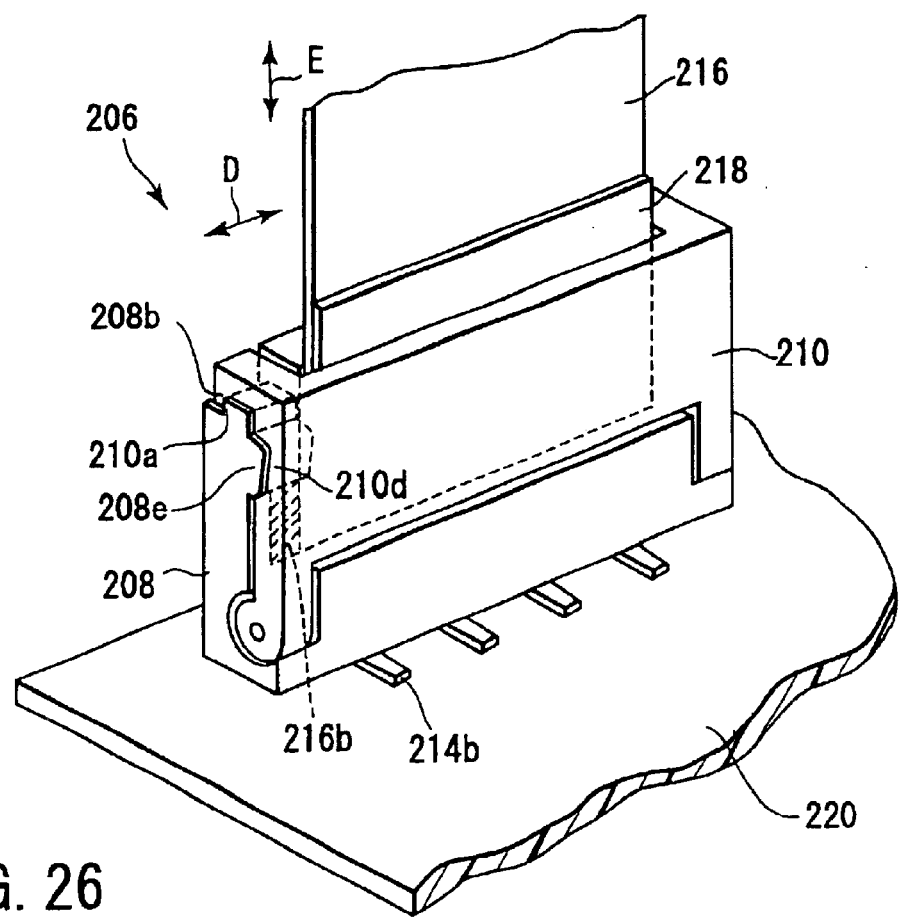
FIG. 26 is a perspective view showing a state of the FPC substrate for connection connected to the FPC connector of FIG. 24.

As shown in FIGS. 24 to 26, the FPC connector 206 of the sixth embodiment is a connector mounted in the upright state with respect to a rigid substrate 220. Moreover, the FPC connector 206 mainly includes a connector main body 208, a lock member 210, and a plurality of connection terminal plates 214 held in the connector main body 208.

In the same manner as the connector main body 176, the connector main body 208 includes a plurality of terminal containing concave portions 208a, stepped engaging portions 208b in the opposite upper ends in the main body width direction, and a support shaft 212 fixed to a main body lower side along the shown arrow D direction. Further in the connector main body 208, a substrate tip-end guide groove 208c on the main-body bottom-surface portion, and an FPC substrate side-surface guide groove 208d along the E direction in an FPC substrate insertion direction (D' direction) inner portion are disposed. Additionally, in the connector main body 208, an FPC substrate guide protrusion 208e is disposed on an FPC substrate insertion port side in the D direction.

It is to be noted that the FPC substrate side-surface guide groove 208d is broadened in the upper part in accordance with an inclination of an FPC substrate for connection 216. The FPC substrate guide protrusion 208e has a height to such a degree that the FPC substrate for connection 216 in the inclined state at the insertion time does not abut on the connection terminal plates 214. That is, the inclination of the FPC substrate for connection 216 at the insertion time is an inclination for preventing the FPC substrate for connection 216 from contacting contacts 214a of the connection terminal plates 214.

The lock member 210 is a member rotatably supported by the support shaft 212 of the connector main body 208. Moreover, the lock member 210 includes a convex portion 210b which presses the connection pattern rear surface of the FPC substrate for connection 216, claw portions 210a projecting from the opposite ends in the shown D direction in the upper part, and support shaft holes 210c. Furthermore, the lock member 210 includes a cutout 210d into which the guide protrusion 208e of the connector main body 208 can fit.

The connection terminal plates 214 are formed of the conductive materials, and include convex FPC substrate contact portions 214a and substrate terminal portions 214b in the same manner as the connection terminal plates 180. The connection terminal plates 214 are also fixed/held in the terminal containing concave portions 208a of the connector main body 208 (see FIG. 25).

The same number of connection terminal plates 214 as the desired number of connection contacts are disposed so as to form a terminal array (array of connection terminals) 214c along the D direction in the figure, which is the width direction of the connector main body 208. Moreover, the contacts 214a of the connection terminal plates 214 are exposed and disposed in the projecting state from the FPC substrate insertion surface of the connector main body 208 by the small dimension.

In the same manner as the FPC substrate for connection 174, the FPC substrate for connection 216 includes the same number of connection patterns 216a as that of connection contacts, and a reinforcing substrate 218 is attached to the back-surface side of the connection patterns 216a. Further in the connection tip end of the FPC substrate for connection 216 on the insertion side, a side convex portion 216b is disposed which is positioned towards the tip end from the connection patterns 216a and which projects on an anti-insertion side (anti-D' direction) of the width direction.

The FPC substrate for connection 216 is connected to the FPC connector 206 of the present embodiment including the above-described constitution as follows. First, the lock member 210 of the FPC connector 208 mounted in the upright state on the rigid substrate 220 is brought into a released state (lock released state). Subsequently, the tip-end connection portion of the FPC substrate for connection 216 is slid/inserted along the D' direction (horizontal direction) parallel to the D direction between the connector main body 208 and lock member 210.

In the inserted state, as shown in FIG. 25, the FPC substrate for connection 216 is kept apart from the contact portions 214a by the FPC substrate guide protrusion 208e of the connector main body 208 in a slightly inclined state. Additionally, the tip end of the FPC substrate for connection 216 is guided by the FPC substrate tip-end guide groove 208c of the connector main body 208. When the FPC substrate for connection 216 is inclined by a predetermined angle and inserted in this manner, the FPC substrate for connection 216 can be inserted without being hooked.

Moreover, the FPC substrate for connection 216 is inserted into a width direction limit position, so that the side surface of the substrate fits into and abuts on the FPC substrate side-surface guide groove 208d. Then, the total width of the FPC substrate for connection 216 is positioned between the FPC substrate side-surface guide groove 208d and the inner surface of the FPC substrate guide protrusion 208e.

After the FPC substrate for connection 216 is inserted into the connector main body 208 and positioned, the lock member 210 is rotated/operated to the closed position. As shown in. FIG. 26, the claws 210a are engaged with the engaging portions 208b of the connector main body 208 and locked. Then, the connector connected state is obtained.

In the connector connected state, since the side convex portion 216b of the FPC substrate for connection 216 is engaged with the lower end surface of the FPC substrate guide protrusion 208e of the connector main body 208, the FPC substrate for connection 28 is securely prevented from coming off in a J direction (see FIG. 26).

When the FPC substrate for connection 216 is disconnected from the FPC connector 206 in the connected state, the claws 210a of the lock member 210 are detached, and a connector lock member released state is obtained. In this state, the FPC substrate for connection 216 can be extracted along the anti-D' direction.

In the connector connection/disconnection method, the FPC substrate for connection 216 is inserted into the D' direction (horizontal direction) parallel to the D direction which is the arrangement direction of the terminal array 214c with respect to the FPC connector 206, but the present invention is not limited to this. For example, it is also possible to insert/remove, connect, or detach the tip-end connection portion of the FPC substrate for connection 216 along an E direction (vertical direction) crossing at right angles to the D direction.

In this manner, according to the FPC connector 206 of the sixth embodiment, an effect similar to that in the FPC connector 170 of the fifth embodiment is produced. Particularly in the FPC connector 206 of the present embodiment, at the inserting/removing time of the FPC substrate for connection 216, the substrate is guided by the FPC substrate guide protrusion 208e, FPC substrate tip-end guide groove 208c, and FPC substrate side-surface guide groove 208d of the connector main body 208. Therefore, the FPC substrate for connection 216 can easily be inserted or extracted without hooking the FPC substrate for connection 216 by the contact portions 214a of the connection terminal plates 214.

Moreover, since the position of the side convex portion 216b of the FPC substrate for connection 216 is regulated by the undersurface of the FPC substrate guide protrusion 208e of the connector main body 208 in the connector connected state, the FPC substrate for connection 216 is prevented from coming off in the E direction.

It is to be noted that the come-off preventing function by the side convex portion 216b also works, even when the lock member 210 is in the opened position. For example, it is assumed that the FPC connector 206 is applied with the mounting surface of the rigid substrate facing downwards. In this case, when the FPC substrate for connection 216 is slid/inserted into the FPC connector 206, and even when the lock member 210 is not brought into the closed state yet, the FPC substrate for connection 216 does not come off. This is because the side convex portion 216b of the FPC substrate for connection 216 is engaged with the FPC substrate guide protrusion 208e of the connector main body 208.

Moreover, for the FPC connector 206 of the sixth embodiment, the FPC substrate for connection 216 can be inserted/removed along the Db direction or along the E direction. Therefore, the appropriate inserting/removing direction of the FPC substrate for connection 216 can be selected in accordance with the situation of the disposed position of the FPC connector 206.

Next, the FPC connector of a seventh embodiment of the present invention will be described with reference to FIGS. 27 and 28.

Figure 27:
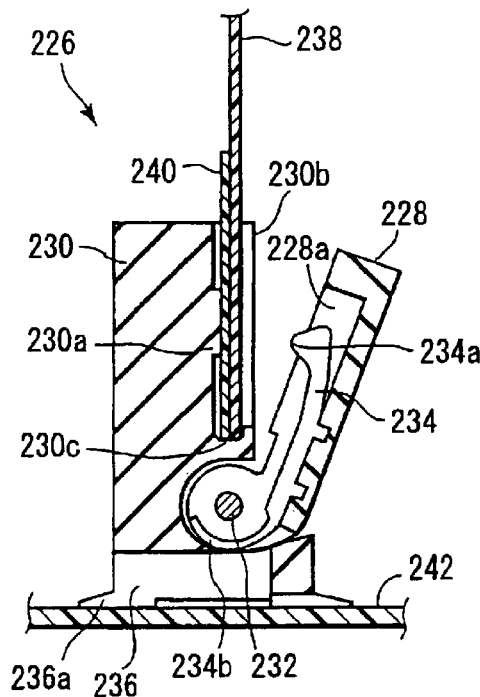
FIG. 27 is a sectional view in the inserted state of the FPC connector into the FPC substrate for connection according to a seventh embodiment of the present invention.

FIG. 27 is a sectional view in the inserted state of the FPC connector into the FPC substrate for connection according to the present embodiment. FIG. 28 is a sectional view of the FPC connector in the connected state in which the lock member is closed.

Also for an FPC connector 226 of the seventh embodiment is an FPC connector, an FPC substrate for connection 238 can be inserted into the FPC connector in the arrangement direction of the array of the contacts of the connection terminals, and an insertion/operation property of the FPC substrate for connection 238 into the connector is improved.

Figure 28:
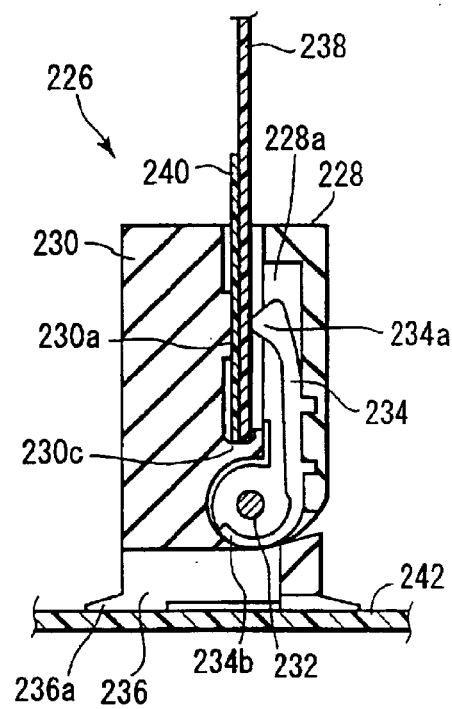
FIG. 28 is a sectional view of the FPC connector in a connected state in which the lock member of the FPC connector of FIG. 27 is closed.

As shown in FIGS. 27 and 28, the FPC connector 226 of the present embodiment is mounted in the upright state on a rigid substrate 242. The FPC connector 226 mainly includes a connector main body 230, a lock member 228, a plurality of connection terminal plates 234 held by the lock member 228, and a plurality of substrate terminal plates 236 held by the connector main body 230.

The connector main body 230 is disposed, while the plurality of substrate terminal plates 236 and a support shaft 232 are fixed under the main body. Moreover, in the connector main body 230, above the support shaft 232, a guide groove 230c is disposed in which the FPC substrate for connection 238 is slid/guided at the insertion time. The connector main body 230 also includes a convex portion 230a which can abut on the rear-surface side of the connection pattern of the FPC substrate for connection 238, and an abutment surface 230b of the FPC substrate for connection 238 in the end of the width direction. Further in the connector main body 230, an engaging portion (not shown) for engaging with the lock member 228 is disposed.

The substrate terminal plates 236 are formed of the conductive material, and include substrate terminal portions 236a. Moreover, the substrate terminal plates 236 are soldered and fixed to the connection pattern portions of the rigid substrate 242.

The lock member 228 is rotatably supported by the support shaft 232. Moreover, the plurality of connection terminal plates 234 are fixed to a concave portion 228a of the lock member 228 on a connector main body 230 side, and claws for engagement (not shown) are disposed in the upper end.

The plurality of connection terminal plates 234 are formed of the conductive material. The plurality of connection terminal plates 234 include contact portions 234a and contact spring portions 234b, and are fixed/supported onto the lock member 228. The contact spring portions 234b have spring properties so as to slide on the substrate terminal plates 236 and to constantly contact the plates. The contact portions 234a can contact the connection patterns of the FPC substrate for connection 238, and constitute a terminal array (array of connection terminals) along a direction parallel to the support shaft 232.

In the same manner as the FPC substrate for connection 174, the FPC substrate for connection 238 includes the same number of connection patterns as that of connection contacts, and a reinforcing substrate 240 is attached to the back-surface side of the connection patterns.

The FPC substrate for connection 238 is connected to the FPC connector 226 of the seventh embodiment including the above-described constitution as follows. First, the lock member 228 of the FPC connector 226 mounted in the upright state on the rigid substrate 242 is brought into the released state (lock released state). The tip-end connection portion of the FPC substrate for connection 238 is slid/inserted on the guide groove 230c between the connector main body 230 and lock member 228 along the arrangement direction (horizontal direction) which is the terminal array direction (see FIG. 27).

Moreover, in a state in which the width direction end of the FPC substrate for connection 238 is attached to the FPC substrate abutment surface 230b, the lock member 228 is rotated to the closed position to obtain the locked state. Then, the contact portions 234a abut on the connection patterns of the FPC substrate for connection 238. Since the connection pattern back-surface side of the FPC substrate for connection 238 is supported by the convex portion 230a of the connector main body 230, the contact portions 234a securely contact the connection patterns, and the connector connected state is obtained (see FIG. 28).

To detach the FPC substrate for connection 238 from the FPC connector 226 in the connected state, the lock member 228 is in the released state. In this state, the FPC substrate for connection 238 can be extracted along an anti-insertion direction.

In the connector connection/disconnection method, the FPC substrate for connection 238 is inserted in the direction parallel to the arrangement direction of the terminal array with respect to the FPC connector 226, but the method is not limited to this. For example, the tip-end connection portion of the FPC substrate for connection 238 can also be inserted/removed along the direction vertical to the arrangement direction of the terminal array, connected, or disconnected.

Moreover, the concave portion or the protrusion for positioning the FPC substrate for connection 238 in the width direction is disposed in the lock member 228 or the connector main body 230, or the convex portion projecting to the side of the FPC substrate for connection 238 is disposed. Accordingly, a structure for preventing the FPC substrate for connection 238 from deviating from the position or coming off can also be incorporated.

In this manner, according to the FPC connector 226 of the seventh embodiment, the FPC substrate for connection 238 is inserted into the connector as follows. That is, since the lock member 228 holding the connection terminal plates 234 including the contact portions 234a is brought into the released state, the contact portions 234a are detached from an insertion path of the FPC substrate for connection 238. Therefore, the FPC substrate for connection 238 is not inhibited from being inserted by reasons such as the FPC substrate for connection 238 hooked by the contact portions 234a, and a connector connection operation is facilitated.

Moreover, for the FPC connector 226 of the present embodiment, the FPC substrate for connection 238 can be inserted/removed along the arrangement direction of the terminal array, or along the direction crossing at right angles to the arrangement direction. Therefore, the appropriate inserting/removing direction of the FPC substrate for connection 238 can be selected in accordance with the situation of the disposed position of the FPC connector 226.

Next, the FPC connector which is the connector for connecting the FPC substrate according to an eighth embodiment of the present invention will be described with reference to FIGS. 29 to 33.

Figure 29:
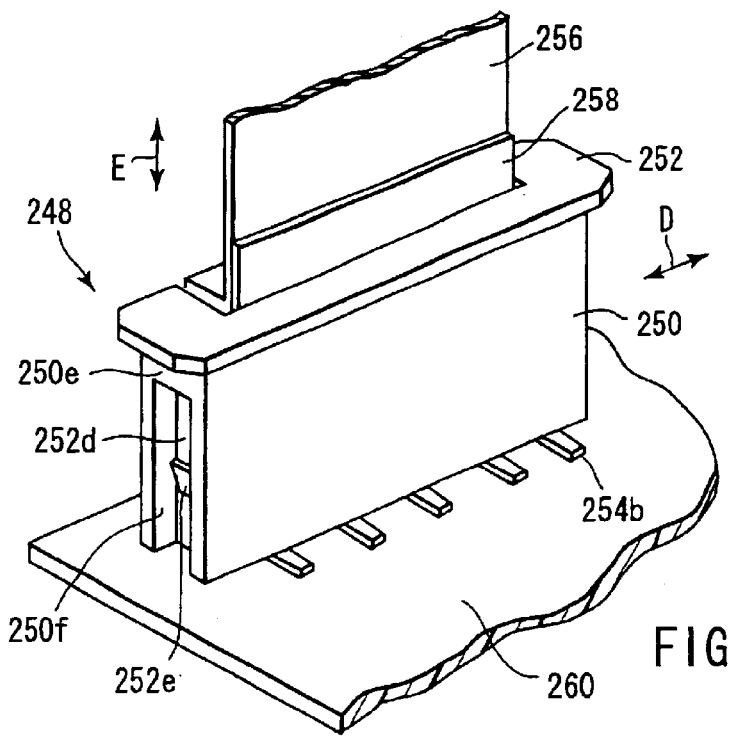
FIG. 29 is a perspective view showing the connected state of the FPC substrate for connection into the FPC connector according to an eighth embodiment of the present invention.
Figure 30:
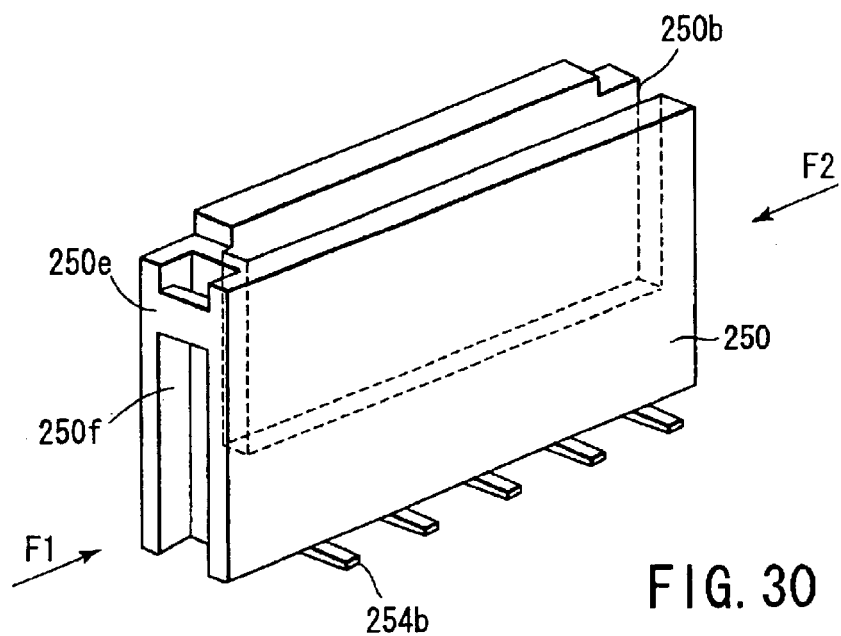
FIG. 30 is a perspective view of a connector main body of the FPC connector of FIG. 29.
Figure 31:
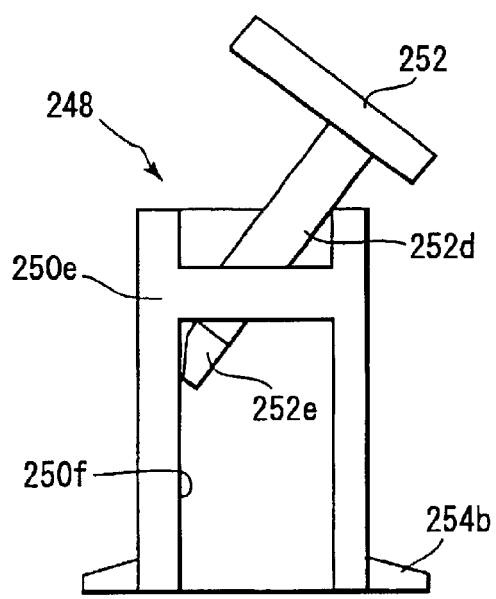
FIG. 31 is a diagram of the released state of the lock member with respect to the connector main body seen from an F1 direction of FIG. 30 in the FPC connector of FIG. 29.
Figure 32:
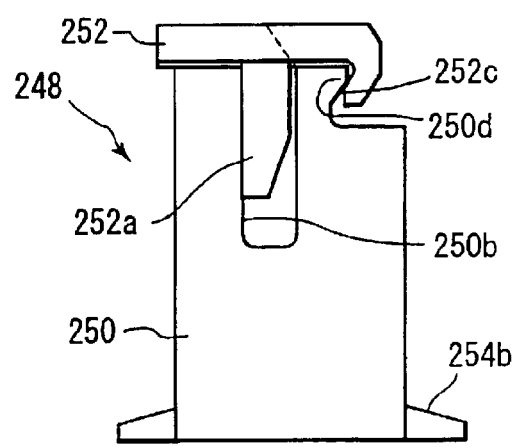
FIG. 32 is a diagram of the closed state of the lock member with respect to the connector main body seen from an F2 direction of FIG. 30 in the FPC connector of FIG. 29.
Figure 33:
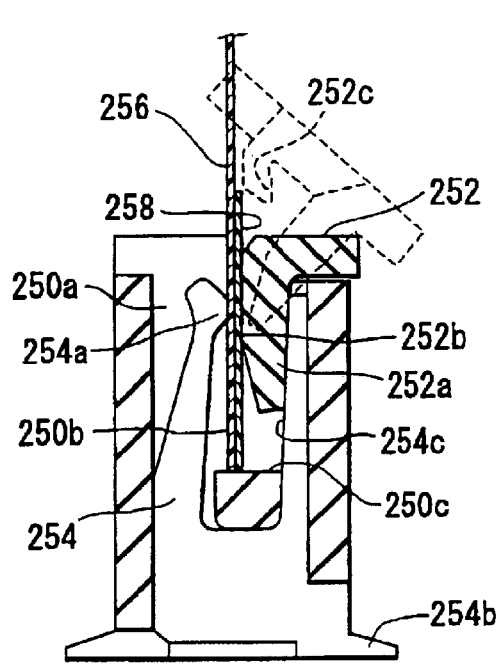
FIG. 33 is a sectional view of the FPC connector in the connected state of the FPC substrate for connection into the FPC connector of FIG. 29.

FIG. 29 is a perspective view showing the connected state of the FPC substrate for connection into the FPC connector according to the present embodiment. FIG. 30 is a perspective view of the connector main body of the FPC connector. FIG. 31 is a diagram of the released state of the lock member with respect to the connector main body seen from an F1 direction of FIG. 30 in the FPC connector. FIG. 32 is a diagram of the closed state of the lock member with respect to the connector main body seen from an F2 direction of FIG. 30 in the FPC connector. FIG. 33 is a sectional view of the FPC connector in the connected state of the FPC substrate for connection into the FPC connector.

As shown in FIGS. 29 and 33, an FPC connector 248 of the eighth embodiment is mounted in the upright state with respect to a rigid substrate 260. The FPC connector 248 mainly includes a connector main body 250, a lock member 252, and a plurality of connection terminal plates 254 held by the connector main body 250.

The connector main body 250 includes a plurality of terminal containing concave portions 250a, an engaging portion 250b in the main body upper part, and a U-shaped guide groove 250b opened on one main body side and upper side and extending along a shown arrow E direction. The connector main body 250 also includes a stopper 250e disposed on the other side of the main body, and a guide wall 250f for guiding the lock member 252 extended downwards below the stopper 250e.

The lock member 252 includes an projecting insertion portion 252a including an FPC substrate press portion 252b, a claw portion 252c which can engage with the engaging portion 250b of the connector main body 250, and an arm portion 252d including a protrusion 252e on one side.

The insertion portion 252a of the lock member 252 is inserted into the guide groove 250b of the connector main body 250 and concave portions 254c of the connection terminal plates 254 described later in an initial inclined state (state shown by a broken line of FIG. 33). Accordingly, a completely inserted state (state shown by a solid line of FIG. 38) is obtained. In the initial inclined state, the protrusion 252e of the lock member 252 abuts on the stopper 250e of the connector main body 250, and prevents the lock member 252 from coming off (see FIG. 31). When the insertion portion 252a moves into the completely inserted state from the initial inclined state, the protrusion 252e is guided along the guide wall 250f of the connector main body 250 to move.

It is to be noted that when the protrusion 252e abuts on the stopper 250e in the initial inclined state, a chamfered portion of the protrusion 252e contacts the guide wall 250f, and the lock member 252 can be inclined as shown in FIG. 31.

The connection terminal plates 254 are formed of the conductive material, and include convex FPC substrate contact portions 254a, substrate terminal portions 254b, and concave portions 254c. The connection terminal plates 254 are fixed/held in the terminal containing concave portions 250a of the connector main body 250 (see FIG. 33).

The same number of contact portions 254a of the connection terminal plates 254 as that of connection contacts are exposed and disposed in the projecting state from the FPC substrate insertion surface of the guide groove 250b of the connector main body 250 by the small dimension. Moreover, the contact portions 254a form the terminal array (array of connection terminals) along the D direction which is the width direction of the connector main body 250.

An FPC substrate for connection 256 includes the same number of connection patterns as that of connection contacts, and a reinforcing substrate 258 is attached to the back-surface side of the connection patterns.

The FPC substrate for connection 256 is connected to the FPC connector 248 of the seventh embodiment including the above-described constitution as follows.

First, the lock member 252 is lifted up to the position of the initial inclined state (FIG. 31). When the lock member 252 is in the position of the initial inclined state, the member retreats from the inserting/removing path of the FPC substrate for connection 256. In this state, the FPC substrate for connection 256 avoids the contact portions 254a of the connection terminal plates 254 and is inserted along the U-shaped guide groove 250b from the D direction. Then, while the protrusion 252e of the lock member 252 is guided into the guide wall 250f, the member is pushed into the position of the completely inserted state (state shown by a solid line of FIG. 33).

In the completely inserted state, the plurality of connection patterns of the FPC substrate for connection 256 are pressed by the FPC substrate press portion 252b of the lock member 252 inserted in the concave portions 254c of the connection terminal plates 254. Moreover, these connection patterns abut on the contact portions 254a of the connection terminal plates 254, and is brought into the connector connected state. It is to be noted that in this state the connection terminal plates 252 are elastically deformed in a left direction in FIG. 33.

Accordingly, the contact portions 254a of the connection terminal plates 254 contact the connection patterns of the FPC substrate for connection 256 in the predetermined contact pressure. The lock member 252 is engaged with the claw portion 252c of the connector main body 250 in the completely inserted state.

To remove the FPC substrate for connection 256 from the FPC connector 248 in the connected state, the lock member 252 is lifted up into the position of the initial inclined state (see FIG. 31). In this state, the FPC substrate for connection 256 can be extracted along the D direction shown in FIG. 29, or the E direction.

According to the FPC connector 248 of the above-described embodiment, the present invention can be applied to a case in which there is not a space for opening/closing/rotating the lock member around the FPC connector, and the lock member 252 is moved substantially in a vertical direction while changing an inclination angle of the member. Accordingly, the FPC substrate for connection 256 can be attached/detached from the D direction or E direction.

For the FPC connector in the above-described fifth to eighth embodiments, a vertical-type connector mounted in the upright state on the rigid substrate has been described, but the scope of the present invention is not limited to the vertical-type connector mounted on the rigid substrate. For example, the similar structure can also be applied to a vertical-type connector mounted on the FPC substrate, or a horizontal-type connector mounted on the rigid substrate or FPC substrate, and the similar effect is obtained.

The following embodiments have been disclosed in Japanese patent application No. 2002-171593 filed on Jun. 12, 2002, in Japan, the entire contents of which are hereby incorporated by reference.

Next, a ninth embodiment of the present invention will be described.

Figure 34:
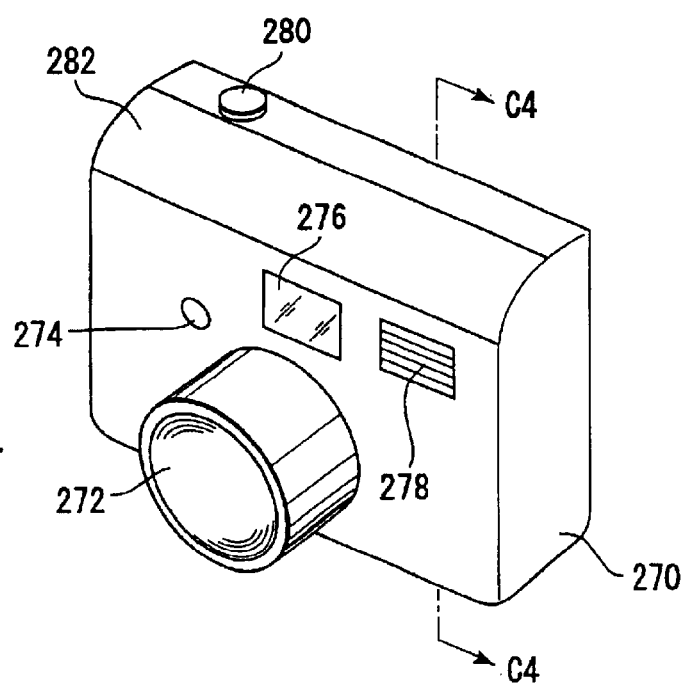
FIG. 34 is a perspective view seen obliquely from above the front of the camera on the right side in a ninth embodiment of the present invention.

FIG. 34 is a perspective view seen obliquely from above the front of the camera on the right side in the ninth embodiment of the present invention. As shown in FIG. 34, a lens body tube 272 including a photography optical system for photographing a subject is disposed in a front surface middle portion of a camera exterior housing 270 which forms a camera main body.

Moreover, a window for AF 274 for focusing the subject is disposed obliquely above the left side of the lens body tube 272. A finder window 276 for optically observing the subject is disposed above the lens body tube 272. A strobe light emitting window 278 for irradiating the subject is disposed in the upper part of a front surface on the right side of the camera exterior housing 270. Furthermore, a release button 280 for starting photography is disposed on the left side of the upper surface of the camera exterior housing 270.

It is to be noted that for the camera exterior housing 270 in the present embodiment, a ridge line portion connecting the front surface to the upper surface is formed by an inclined surface 282 including a curved surface curved toward the front surface in order to miniaturize the camera and to enhance design.

Figure 35:
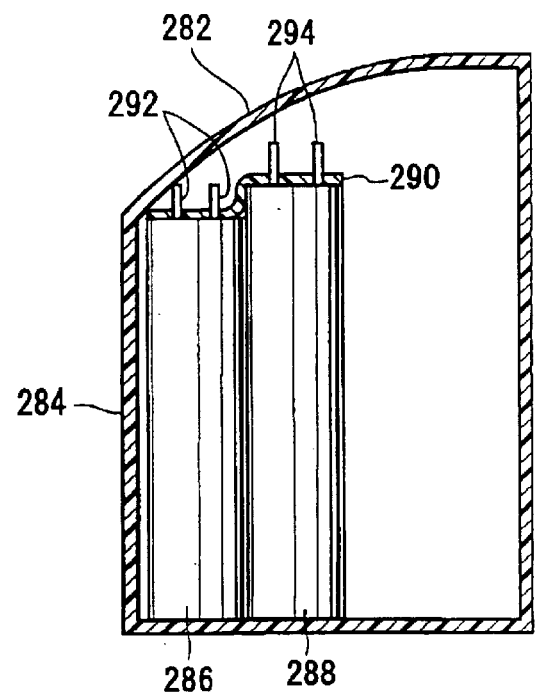
FIG. 35 is a longitudinal sectional view showing a camera exterior housing along line C4—C4 in FIG. 34.

For example, two large-capacity condensers for flash light emission are disposed in the camera exterior housing 270 including the inclined surface 282 as shown in FIG. 35. FIG. 35 shows the disposed position of the condensers for the flash light emission, and is a longitudinal sectional view of the camera exterior housing 270 along line C4—C4 in FIG. 34.

As shown in FIG. 35, two large-capacity condensers for flash light emission (hereinafter referred to simply as the condensers) 286, 288 are formed in columnar shapes different in length from each other. These condensers 286, 288 are disposed in a position disposed opposite to an exterior wall 284 on the right side of the front surface of the camera exterior housing 270 (see FIG. 34). Additionally, one end surface (upper end surface) of each of the condensers 286, 288 is disposed along the inner wall of the inclined surface 282 with a step. Moreover, the condensers 286, 288 are connected to lead terminals for electric connection 292, 294 projecting from the upper surface by an FPC substrate 290.

That is, the one condenser 286 is formed in a shape whose length is shorter than that of the other condenser 288. Moreover, the upper end surface of the condenser 286 is positioned opposite to the inclined surface 282 formed in the camera exterior housing 270, and a part of the side surface in the longitudinal direction is disposed in the vicinity of the front surface inner wall. That is, the condenser 286 is formed in the shape disposed in the position. The lead terminals 292 are formed in one end surface (upper end surface) to extend in the longitudinal direction.

The other condenser 288 is formed to be longer than the one condenser 286, and is disposed in a parallel position with respect to the longitudinal direction of the condenser 286. Additionally, the condenser 288 is disposed adjacent such that the other end surface (lower end surface) of each of the condensers 286, 288 is in the same plane.

In this manner, since the condenser 286 is disposed adjacent to the condenser 288, the space is saved. In one end surface (upper end surface) of the condenser 288, the lead terminals 294 are formed to extend in the longitudinal direction.

It is to be noted that the condensers 286, 288 are connected to a flash light emission circuit (not shown) built in the camera exterior housing 270, and supply a voltage for applying a high voltage to an emission discharge tube (not shown).

Figure 36:
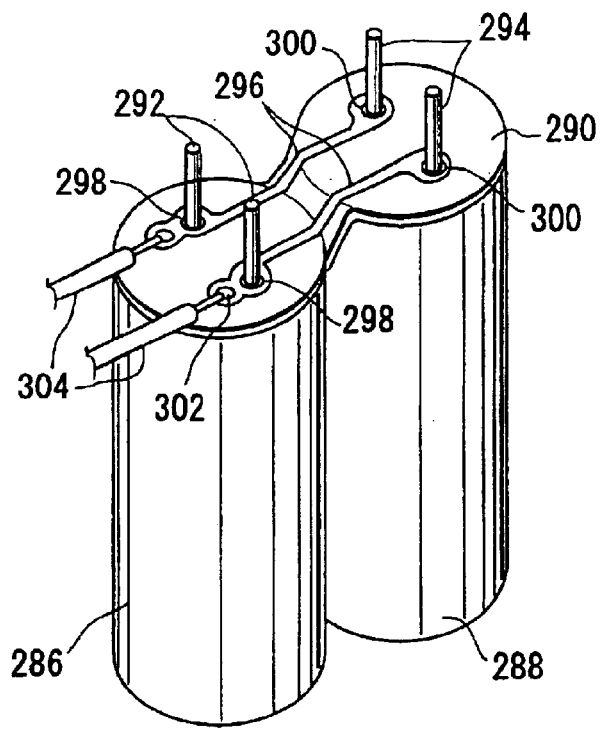
FIG. 36 is an enlarged perspective view showing the connected state of the condensers of FIG. 35.

Next, means for connecting the lead terminals 292, 294 of the condensers 286, 288 to each other will be described. FIG. 36 is an enlarged perspective view showing the connected state of the condensers 286, 288, and FIG. 37 is an enlarged front view of the FPC substrate for connecting the condensers.

As shown in FIG. 36, the condensers 286, 288 are disposed adjacent to each other in the parallel position with respect to the longitudinal direction so that the other end surfaces (lower end surfaces) are in the same plane. As a result, the lead terminals 292, 294 in one end surfaces (upper end surfaces) disposed with the step are constituted to be connected by the FPC substrate 290.

Figures 37, 38:
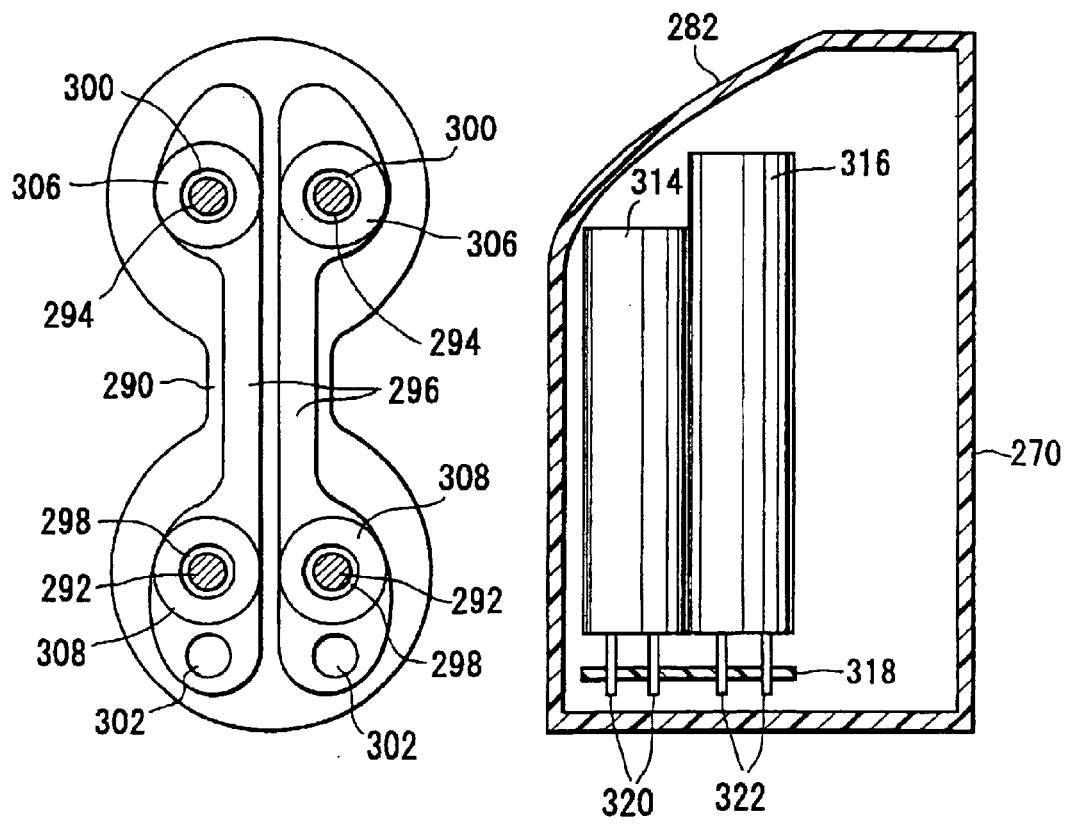
FIG. 37 is an enlarged front view of the FPC substrate for connecting the condensers of FIG. 35.
FIG. 38 is a longitudinal sectional view showing a tenth embodiment of the present invention.

Here, as shown in FIG. 37, the FPC substrate 290 includes through holes 298, 300 for the lead terminals of the condensers described later, which are formed to pass through the rear surface from the front surface of the FPC substrate 290. In peripheral edges of the through holes 298, 300, solder lands for the lead terminals 306, 308 formed on the surface of the FPC substrate 290 are disposed so as to connect the lead terminals 292, 294 of the condensers 286, 288 to each other.

Furthermore, the FPC substrate 290 includes solder lands 302 formed in the surface of the substrate and connected to lead wires for flash light emission circuit connection 304. Furthermore, the FPC substrate 290 includes conductive patterns 296 for connecting the solder lands 302, 306, and 308 to one another. It is to be noted that for the solder lands for flash light emission circuit connection 302 and the solder lands for the lead terminals 306, 308, a copper foil exposed by the opening of the cover lay film of the FPC substrate 290 is subjected to various predetermined treatments such as a rust proofing treatment and solder plating.

Turning back to FIG. 36, the lead terminals 292, 294 formed in the condensers 286, 288 are passed through the through holes 298, 300 of the FPC substrate 290. Furthermore, when the lead terminals 292, 294 are soldered to the solder lands 306, 308 formed on the surface of the FPC substrate 290, the condenser 286 is electrically connected in parallel with the condenser 288.

Moreover, for the condensers 286, 288, the condenser 288 is formed to be longer with respect to the longitudinal direction as described above, and the condensers 286, 288 are juxtaposed adjacent to each other with respect to the longitudinal direction. Therefore, the FPC substrate 290 for connecting the condensers to each other is formed in a shape extending along the step between the condensers 286, 288. Moreover, the solder lands 302 of the FPC substrate 290 are connected to the lead wires 304, and connected to the flash light emission circuit (not shown) by the lead wires 304.

The camera in the ninth embodiment constituted in this manner is formed in a curved-surface shape including the inclined surface 282 in order to realize the miniaturization of the camera exterior housing 270. However, two condensers 286, 288 different in length are used in the large-capacitor condensers for flash light emission for use. Moreover, the one-end surfaces of the condensers 286, 288 are disposed with the step along the inner wall of the inclined surface 282, and both the condensers are disposed adjacent to each other in the vicinity of the outer wall inner surface of the camera exterior housing. Therefore, the large-capacity condensers 286, 288 can efficiently be disposed in the camera exterior housing 270.

Furthermore, the condensers 286, 288 are connected in parallel with each other by the FPC substrate 290. Therefore, since two condensers 286, 288 are first connected to the FPC substrate 290 and can then be assembled into the camera, the stress onto the lead terminals 292, 294 can be reduced. Additionally, operation efficiency can be enhanced, and operation process can be simplified.

It is to be noted that the condensers 286, 288 have been described as the condensers for flash light emission, but the present invention is not limited to this. For example, needless to say, the condensers may also be applied to condensers for power supply for use in light emitting elements such as an LED for AF focusing confirmation in a finder, an LED for strobe charge confirmation, and an LED for self timer. Moreover, needless to say, the shape of the condenser is not limited to the columnar shape, and may also be a polyangular pillar including a polygonal shape.

Furthermore, the lead terminals 292, 294 on the one-end surfaces (upper end surfaces) of the condensers 286, 288 are connected to one another by the FPC substrate 290, but the present invention is not limited to this.

For example, in a tenth embodiment of the present invention, as shown in FIG. 38, both condensers 314, 316 are vertically reversed, and the condensers 314, 316 are disposed so that the end surfaces are on the same plane. Moreover, even when lead terminals 320, 322 extended from the respective one-end surfaces are connected to each other by an FPC substrate 318, the similar effect can, needless to say, be obtained. Instead of the FPC substrate, the rigid substrate may also be used.

As described above, according to the ninth and tenth embodiments, when a plurality of condensers are disposed in the camera exterior housing, the condensers are connected to each other by the FPC substrate, and accordingly a degree of freedom can be imparted in the longitudinal direction. Therefore, the condensers can efficiently be disposed in a small-sized camera which has a curved surface shape in an outer wall, and the camera can be miniaturized and enhanced in sophisticated design. The steps at a camera assembling time comprise: connecting a plurality of condensers to the FPC substrate; and subsequently attaching the condensers into the camera body. Therefore, there can be provided the camera in which the stress into the lead terminals formed on the condensers can be reduced.

The following embodiments have been disclosed in Japanese patent application No. 2002-177432 filed on Jun. 18, 2002, in Japan, the entire contents of which are hereby incorporated by reference.

Next, an eleventh embodiment of the present invention will be described.

Figure 39:
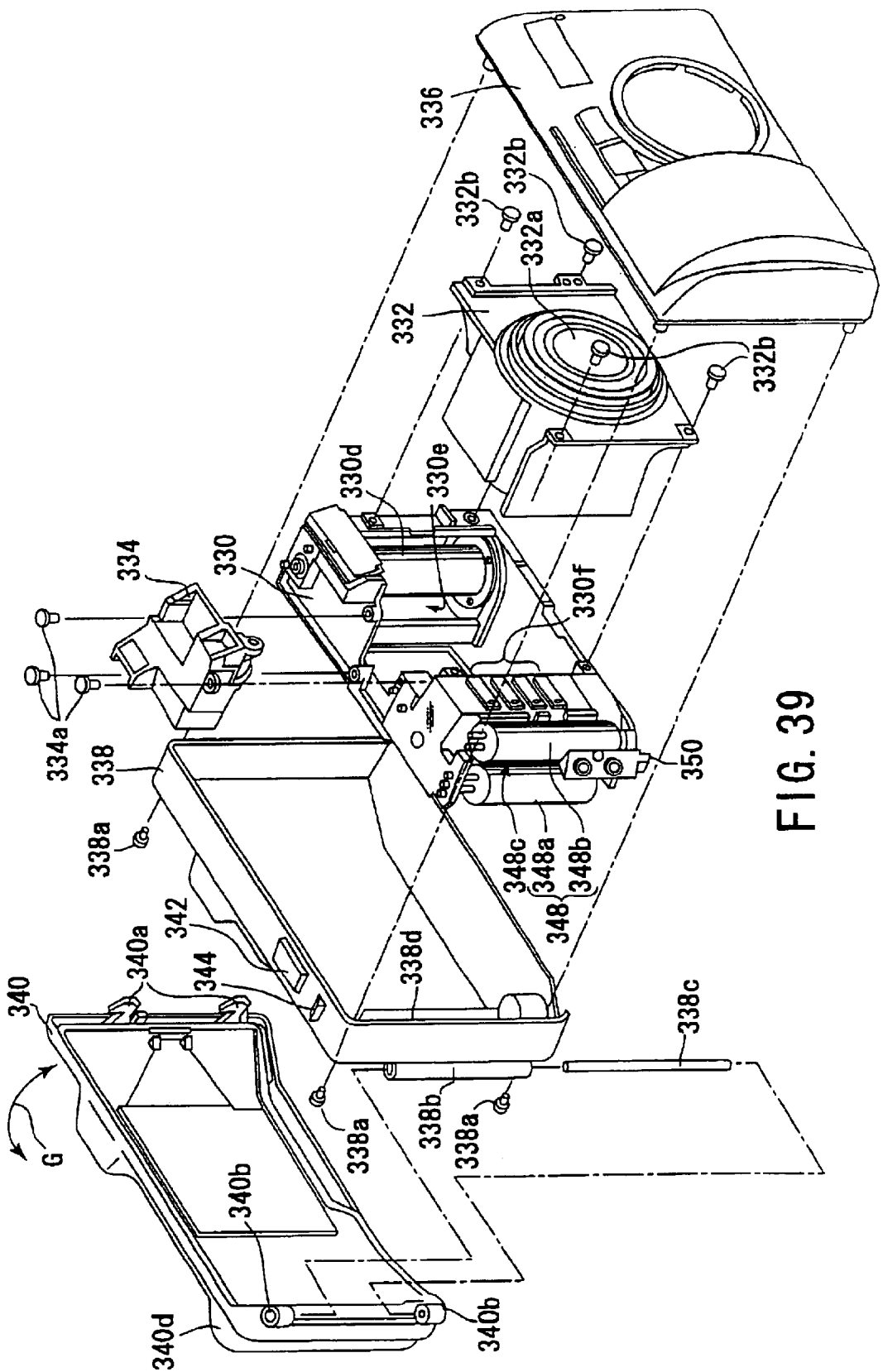
FIG. 39 is an exploded perspective view schematically showing a whole constitution of the camera according to an eleventh embodiment of the present invention.
Figure 40:
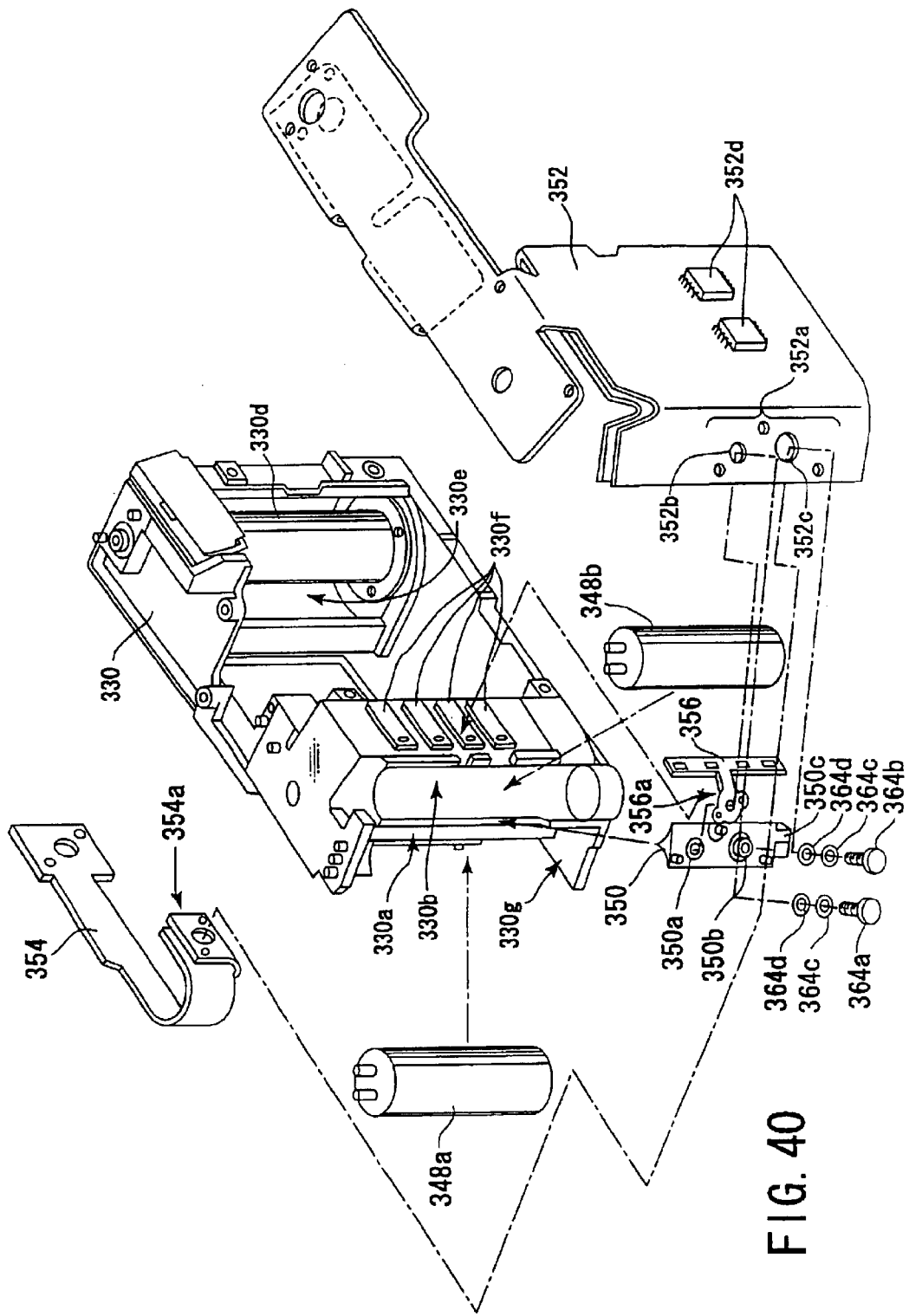
FIG. 40 is an exploded perspective view extracting and showing a part (main body portion) of the camera of FIG. 39 and members such as a circuit substrate to be attached to the part.
Figure 41:
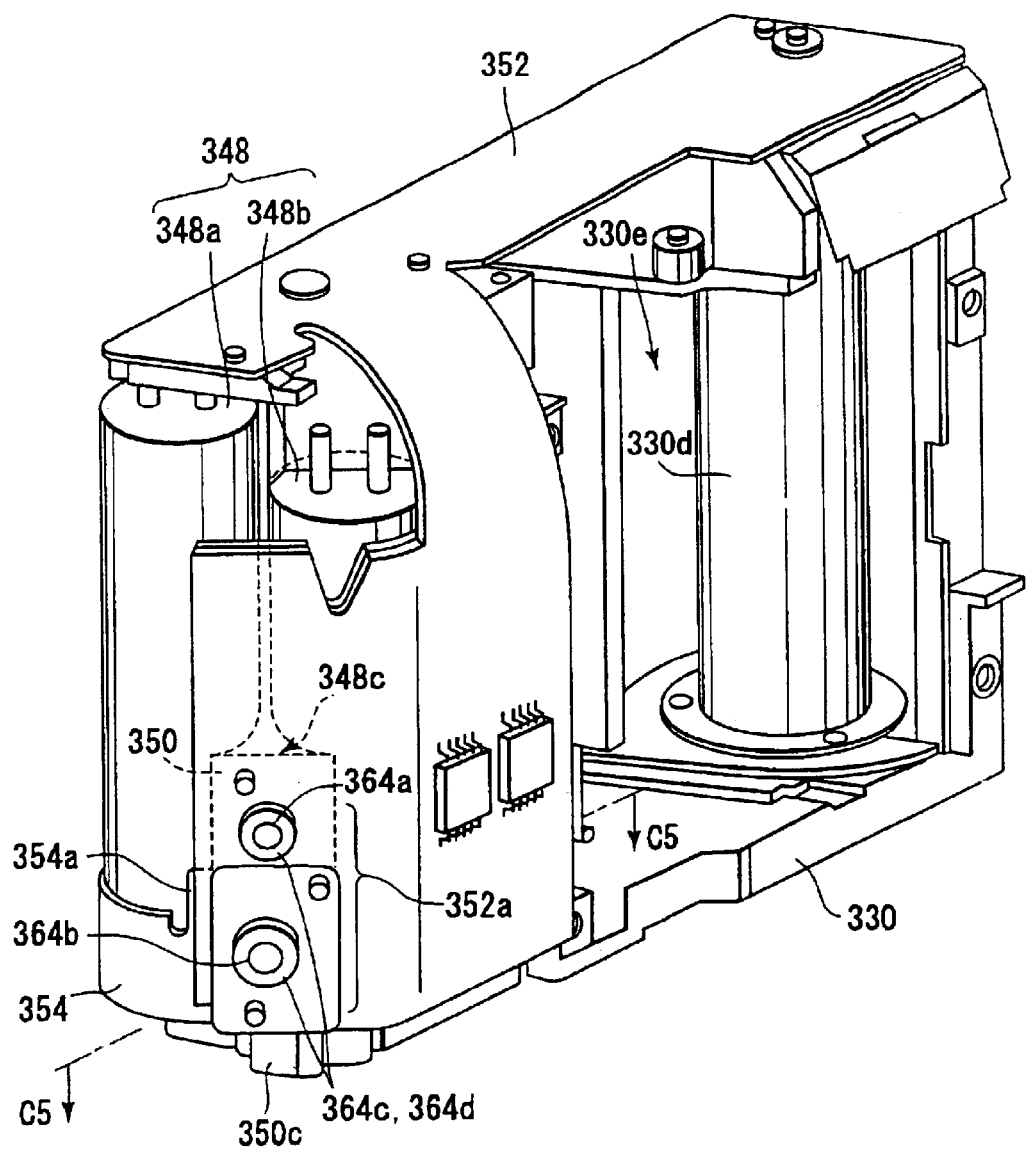
FIG. 41 is a perspective view of an assembled state of constituting members of FIG. 40.
Figure 42:
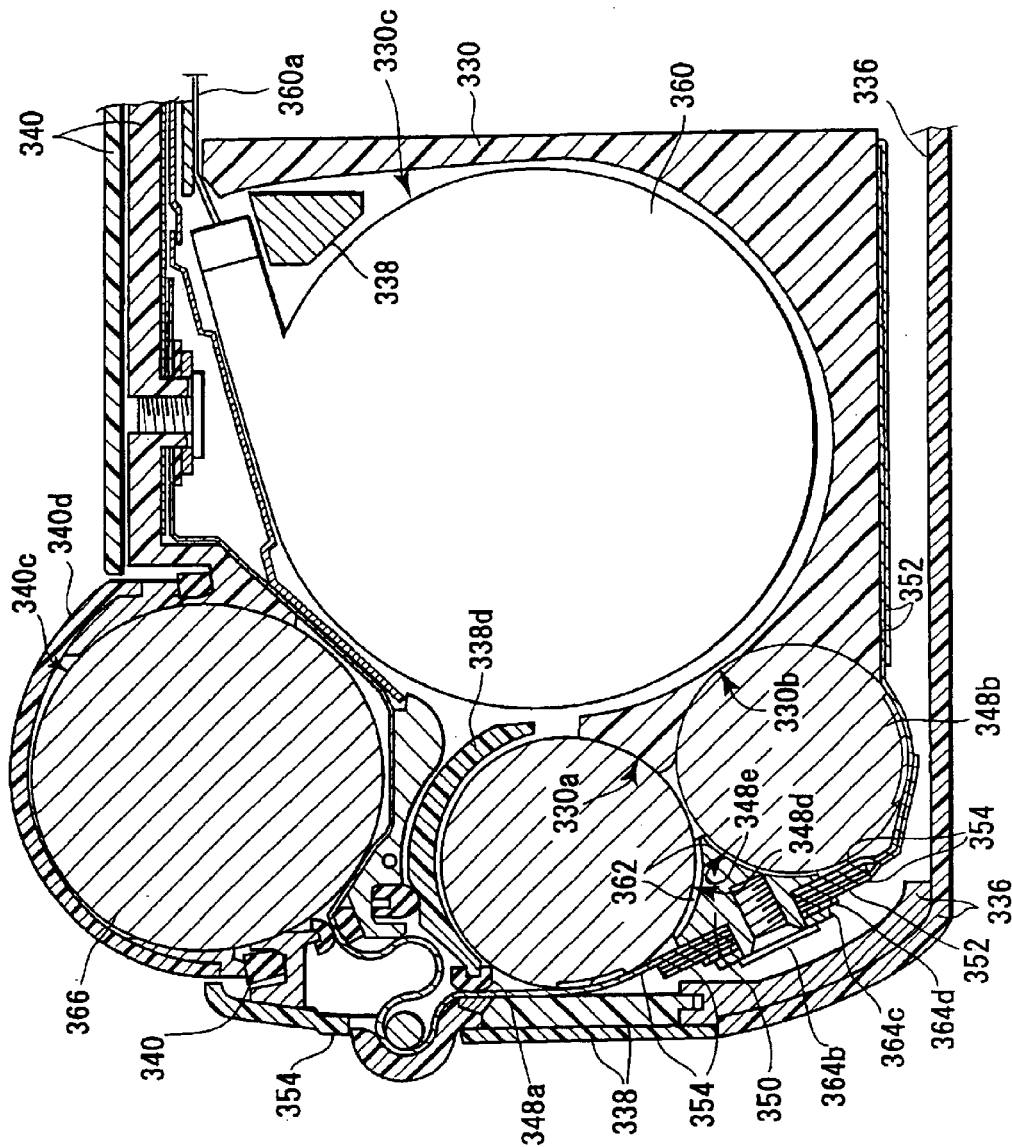
FIG. 42 is a main part enlarged transverse sectional view along line C5—C5 of FIG. 41.

FIG. 39 is an exploded perspective view schematically showing a whole constitution of the camera according to the eleventh embodiment of the present invention. FIG. 40 is an exploded perspective view extracting and showing a part (camera main body) of the camera and members such as a circuit substrate to be attached to the part. FIG. 41 is a perspective view of an assembled state of constituting members of FIG. 40. FIG. 42 is a main part enlarged transverse sectional view along line C5—C5 of FIG. 41.

As shown in FIG. 39, the camera of the eleventh embodiment comprises basic constituting members such as a camera main body 330, photography lens unit 332, finder unit 334, front cover member 336, and a back cover member 338.

The camera main body 330 is a basic part of the present camera. The photography lens unit 332 is attached to the camera main body 330, and is constituted of a photography lens 332a, a photography lens body tube holding the lens, and the like.

The finder unit 334 is attached to the camera main body 330, and includes a finder optical system, and the like. The front cover member 336 is an exterior member with which the camera main body 330 is covered on a front-surface side. The back cover member 338 is an exterior member with which the side surfaces, upper surface, and bottom surface of the camera main body 330 are covered.

Moreover, this camera includes a back lid member 340 disposed so as to be openable/closable between a position where the camera main body 330 is covered on a rear-surface side and a position where the main body is exposed.

Hinge portions 340b disposed in one side edge of the back lid member 340 are connected to a hinge portion 338b disposed in one side edge of the back cover member 338 by a shaft member 338c. Accordingly, the back lid member 340 is supported on the shaft so as to be rotatable in a shown arrow G direction of FIG. 39.

Moreover, when the back lid member 340 is brought into a closed state, the following results. That is, when engaging claws 340a formed on the other side edge of the back lid member 340 engage with engaged portions (not shown) formed in predetermined positions on a back cover member 338 side, the closed state of the back lid member 340 is held. Additionally, a disengagement mechanism (not shown) for canceling the closed state of the back lid member 340 is disposed in the back lid member 340 and back cover member 338, which is similar to a related-art conventional camera constitution.

In a one-end portion of the back lid member 340, as shown also in FIG. 42, a battery chamber 340c is formed in which a battery 366 as a main power source of the present camera is contained so as to be attachable/detachable. Accordingly, in the one-side edge of the back lid member 340, a battery chamber lid 340b by which the battery chamber 340c is openable/closable is disposed so as to be rotatable with respect to the back lid member 340 (refer to FIG. 42 for details).

In the back cover member 338 on the upper-surface side, various operation members are disposed such as a shutter release button 342 for generating an instruction signal of a photography operation, and a zoom lever 344 for generating the instruction signal of a variable magnification operation. It is to be noted that only operation members described herein are shown in the figures, and the other operation members are omitted from the figures.

Moreover, a main condenser 348a in condensers for flash light emission 348 described later can be attached on a one-end side in the back cover member 338. That is, a condenser receiving portion 338d is formed whose section is formed substantially in a circular arc shape in accordance with an outer shape of the main condenser 348a (see FIGS. 39, 42).

Furthermore, the photography lens unit 332 is disposed in the vicinity of substantially the middle part of the camera main body 330. A cartridge chamber 330c (not shown in FIG. 39. See FIG. 42) and a film containing chamber 330e are formed in opposite ends of the camera main body 330 to hold the photography lens unit 332.

The cartridge chamber 330c is an inner space formed so that a film cartridge 360 (see FIG. 42) can be loaded so as to be attachable/detachable. The film cartridge 360 in which a rolled film for taking photographs (hereinafter referred to simply as the film) 360a is wound around is contained in the cartridge chamber 330c.

In the camera main body 330, DX code contacts 330f are disposed in an outer wall portion of a position where the cartridge chamber 360c is formed on the front-surface side. In the cartridge chamber 360c, the DX code contacts 330f are connected to contacts (not shown) disposed in portions which are to contact DX codes of the loaded film cartridge 360.

Moreover, the film containing chamber 360e is an inner space in which the film 360a extracted from the film cartridge 360 loaded in the cartridge chamber 330c is contained with a predetermined photography operation of the camera. Inside the film containing chamber 360e, a spool 330b around which the film 360a is wound is rotatably disposed.

The photography lens unit 332 is fixed by screws 332b on the front-surface side with respect to the camera main body 330. The finder unit 334 is disposed on an upper-portion side of the photography lens unit 332.

In this case, the finder unit 334 is fixed to a fixing portion of the camera main body 330 by screws 334a.

Two condensers for flash light emission 348 including the main condenser 348a and a sub-condenser 348b are disposed in one side edge of the camera main body 330. The condensers for flash light emission 348 are disposed to accumulate a charge for flash light emission, and two divided condensers are disposed so as to miniaturize the size while securing a charge capacity necessary for the flash light emission.

The main condenser 348a and sub-condenser 348b are juxtaposed in the vicinity so that outer-diameter portions substantially abut on each other. Accordingly, wall surfaces 330a, 330b (not shown in FIG. 39. See FIGS. 40, 42.) are formed in predetermined positions on the side of the camera main body 330 and in portions in which the main and sub-condensers 348a, 348b are to be disposed. That is, the sections of the condensers are formed substantially in circular arc shapes in accordance with the shapes of the outer-diameter portions of the main and sub-condensers 348a, 348b.

Moreover, the main and sub-condensers 348a, 348b are attached to the wall surfaces 330a, 330b of the camera main body 330 and the condenser receiving portion 338d of the back cover member 338, for example, by a double-faced tape.

In the camera main body 330 formed in this manner, the front cover member 336 and back cover member 338 are disposed so as to cover the outer surface of the main body. In this case, the front cover member 336 and back cover member 338 are integrally fixed by screws 338a on the rear-surface side.

On the other hand, on the outer-surface side of the camera main body 330, as shown in FIG. 40, an electric substrate on which a plurality of electric components 352d are mounted is disposed. The electric substrates such as a plurality of electric circuit substrates including the FPC substrate, that is, a main substrate 352 (first electric circuit substrate), a sub-substrate 354 (second electric circuit substrate), and a DX substrate 356 are disposed in predetermined positions, respectively.

On the main substrate 352, various electric circuits such as a control circuit of the present camera are mounted. The sub-substrate 354 has an accompanying function with respect to the electric component disposed on the rear-surface side of the present camera. The DX substrate 356 is connected to the DX code contacts 330f which contact the DX codes of the film cartridge 360.

Moreover, for these plurality of electric circuit substrates, the predetermined electric circuit substrates are connected to each other by predetermined connection means. For this connection means, for example, connection portions 352a, 354a, 356a of the main substrate 352 (first electric circuit substrate), sub-substrate 354 (second electric circuit substrate), and DX substrate 356 are stacked, disposed, and screwed/fixed. In this manner, the means is constituted to include a base for connection 350 for disposing and positioning the respective electric circuit substrates 352, 354, 356 in the respective predetermined positions.

In this case, the base for connection 350 is attached to the outer peripheral surfaces of the main and sub-condensers 348a, 348b, that is, outer wall surfaces 348d, 348e (see FIG. 42) of the main and sub-condensers 348a, 348b. This is bonded, for example, by a double-faced tape 362, and the like.

Moreover, a section of a lower end 350c of the base for connection 350 is formed substantially in an L-shape. Furthermore, the arm portion abuts on the bottom surface of the sub-condenser 348b to perform a function of positioning the sub-condenser 348b in the vertical direction (details are not shown). It is to be noted that the bottom surface of the main condenser 348a abuts on a predetermined fixing portion 330g (see FIG. 40) of the camera main body 330 to define the position of the main condenser 348a in the vertical direction.

Furthermore, at least one of the electric circuit substrates (352, 354, 356) fixed/disposed onto the base for connection 350 is fixed as shown in FIG. 42. At least one of the electric circuit substrates (352, 354, 356) is fixed to the outer-diameter portions, that is, the outer wall surfaces 348d, 348e of two main and sub-condensers 348a, 348b, for example, by the double-faced tape 362.

As described above, the main and sub-condensers 348a, 348b are juxtaposed in the vicinity so that the outer-diameter portions substantially abut on each other. Therefore, a space (hereinafter referred to as the triangular space) 348c including a substantially triangular section is formed in the peripheral edges of the main and sub-condensers 348a, 348b. This space includes a substantially triangular section including a contact on which the main and sub-condensers 348a, 348b abut as one vertex, and a tangent line connecting the outer-diameter portions of the main and sub-condensers 348a, 348b to each other as a bottom side.

Then, in the eleventh embodiment, the base for connection 350 is disposed in the triangular space 348c, and accordingly the inner space of the camera is effectively used.

With respect to the base for connection 350, as shown in FIGS. 40 and 41, the connection portion 352a of the main substrate 352, the connection portion 354a of the sub-substrate 354, and the connection portion 356a of the DX substrate 356 are superposed on one another and connected to one another. These are fixed by screws 364a, 364b.

In this case, two screw holes 350a, 350b are formed in the base for connection 350. In one screw hole 350a, as shown in FIG. 40, the connection portion 356a of the DX substrate 356, and a portion 352b above the connection portion 352a of the main substrate 352 are fixed by the screw 364a.

Moreover, in the other screw hole 350b of the base for connection 350, as shown in FIGS. 40 and 42, the connection portion 354a of the sub-substrate 354, and a portion 352c under the connection portion 352a of the main substrate 352 are fixed by the screw 364b.

Furthermore, connection washers 364c and connection rubbers 364d are held between the screws 364a, 364b and the respective substrates (352, 354, 356).

As shown in FIGS. 41, 42, the main substrate 352 positioned by the base for connection 350 in this manner is disposed so as to cover the outer wall portion of the cartridge chamber 330c of the camera main body 330 on the front-surface side and the camera main body 330 on the upper-surface side.

Moreover, the sub-substrate 354 is disposed on the rear-surface side from the side-surface portion of the camera main body 330, and is connected to a predetermined electric member (not shown) disposed in the back lid member 340. Accordingly, electric connection of the predetermined electric member to the main substrate 352 is secured via the sub-substrate 354 and base for connection 350.

Furthermore, the DX substrate 356 is connected to the DX code contacts 330f extracted from the inner contacts of the cartridge chamber 330c. Accordingly, a control circuit (not shown) disposed in the main substrate 352 can read the DX codes of the film cartridge 360 via the base for connection 350, DX substrate 356, and DX code contacts 330f.

As described above, according to the eleventh embodiment, the following effect is obtained. The base for connection 350 for fixing/disposing the plurality of electric circuit substrates (352, 354, 356) is disposed in the triangular space 348c by two main and sub-condensers 348a, 348b juxtaposed in the predetermined positions in the camera main body 330. Accordingly, the inner space of the camera can effectively be used. Therefore, this can contribute to the miniaturization of the camera.

In this manner, in the eleventh embodiment, the base for connection 350 is disposed in the triangular space 348c and used to secure the connection of the plurality of electric circuit substrates (352, 354, 356) in the present camera and to position the substrates in the constitution. The triangular space 348c includes a substantially triangular section including the contact on which two main and sub-condensers 348a, 348b abut as one vertex, and the tangent line connecting the outer-diameter portions of two main and sub-condensers 348a, 348b to each other as the bottom side.

However, it is easy to constitute the triangular space 348c such that not only the base for connection 350 in the eleventh embodiment but also the other members are disposed in the space.

Next, a twelfth embodiment of the present invention will be described.

In the twelfth embodiment of the present invention, some of the plurality of electric components mounted on the predetermined electric circuit substrate are disposed in the triangular space 348c formed by two main and sub-condensers 348a, 348b.

Means by the twelfth embodiment is also one example for effectively using the inner space of the camera to realize the miniaturization of the camera per se.

It is to be noted that the constitution of the twelfth embodiment is basically substantially similar to that of the eleventh embodiment. That is, the present embodiment is different only in the member disposed in the triangular space (348c) formed by the main and sub-condensers (348a, 348b) juxtaposed in the predetermined positions in the camera main body (330). Therefore, the same constituting members as those of the eleventh embodiment are denoted with the same reference numerals, detailed description thereof is omitted, and only the different respect will be described hereinafter.

Figure 43:
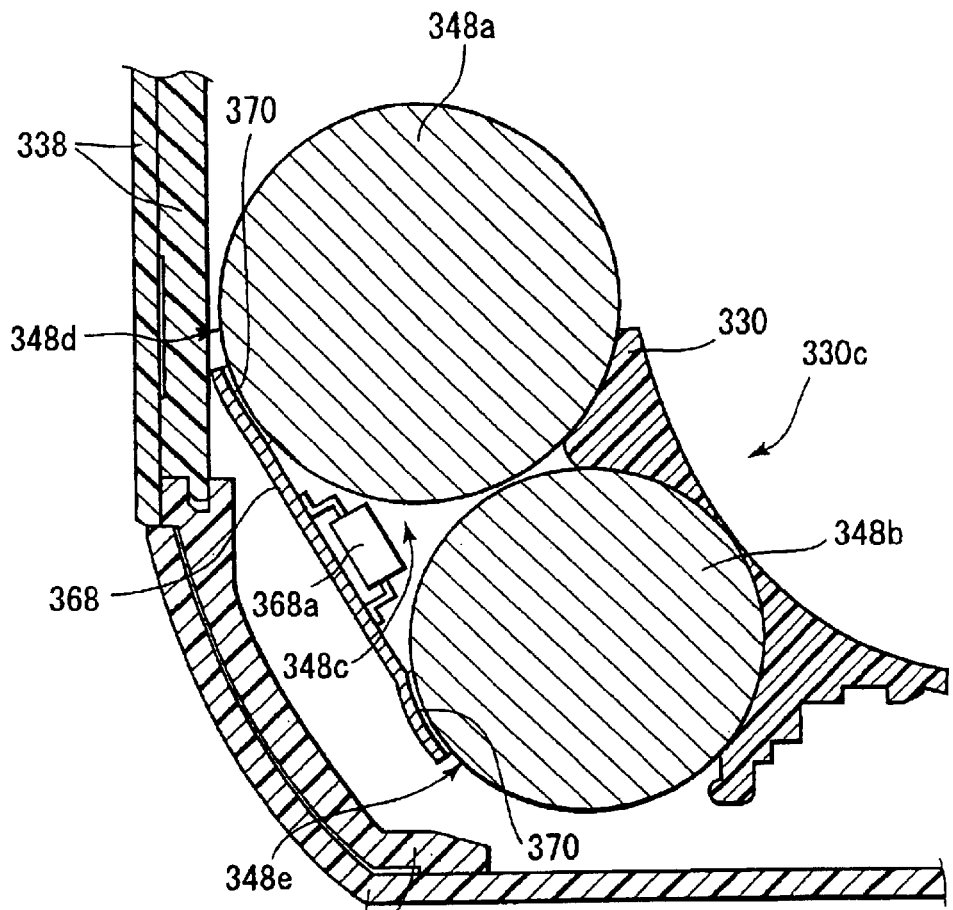
FIG. 43 is a main part enlarged sectional view in the camera according to a twelfth embodiment of the present invention.

FIG. 43 is a main part enlarged sectional view showing a part of the camera according to the twelfth embodiment of the present invention. This FIG. 43 shows the vicinity of the portion in the camera of the present embodiment, corresponding to the section along line C5—C5 of FIG. 41 in the camera of the above-described eleventh embodiment.

As shown in FIG. 43, in the present embodiment, the base for connection (350) in the above-described eleventh embodiment is removed in a mode. Moreover, a part of a predetermined electric circuit substrate 368 is bonded to the outer wall surfaces 348d, 348e on the outer peripheral surface of the main and sub-condensers 348a, 348b, for example, using a double-faced tape 370, and the like.

Moreover, in this case, at least one electric component 368a of the plurality of electric components mounted on the predetermined electric circuit substrate 368 is constituted to be disposed in the triangular space 348c.

The other constitution is substantially similar to that of the eleventh embodiment.

According to the twelfth embodiment constituted in this manner, the inner space of the camera can effectively be used. This is because electric components 426a mounted on a predetermined electric circuit substrate 426 are disposed in the triangular space 348c formed by the main and sub-condensers 348a, 348b juxtaposed in the predetermined position in the camera main body 330.

This can contribute to the miniaturization of the camera in the same manner as in the eleventh embodiment.

According to the above-described eleventh and twelfth embodiments, the invention constituted as follows can be obtained.

(1) A camera comprising:
two column-shaped condensers for flash light emission which are juxtaposed to each other in the same direction and which are disposed in the vicinity so as to allow outer-diameter portions to abut on each other and in which a charge for flash light emission is stored;
a first electric circuit substrate;
a second electric circuit substrate; and
a member for connection, which is disposed in a space including a substantially triangular section formed between the two condensers for flash light emission and which connects the first electric circuit substrate to the second electric circuit substrate.

(2) The camera according to the above (1), wherein the member for connection is a base for connection on which connection portions of the first and second electric circuit substrates are superposed and positioned.

(3) The camera according to the above (2), wherein the base for connection is formed to have a triangular shape which substantially matches with the space including the substantially triangular section.

(4) The camera according to the above (3), wherein the base for connection is allowed to abut on outer peripheries of the two condensers for flash light emission and fixed to the condenser.

The following embodiments have been disclosed in Japanese patent application No. 2002-177048 filed on Jun. 18, 2002, in Japan, the entire contents of which are hereby incorporated by reference.

Next, a thirteenth embodiment of the present invention will be described.

Figure 44:
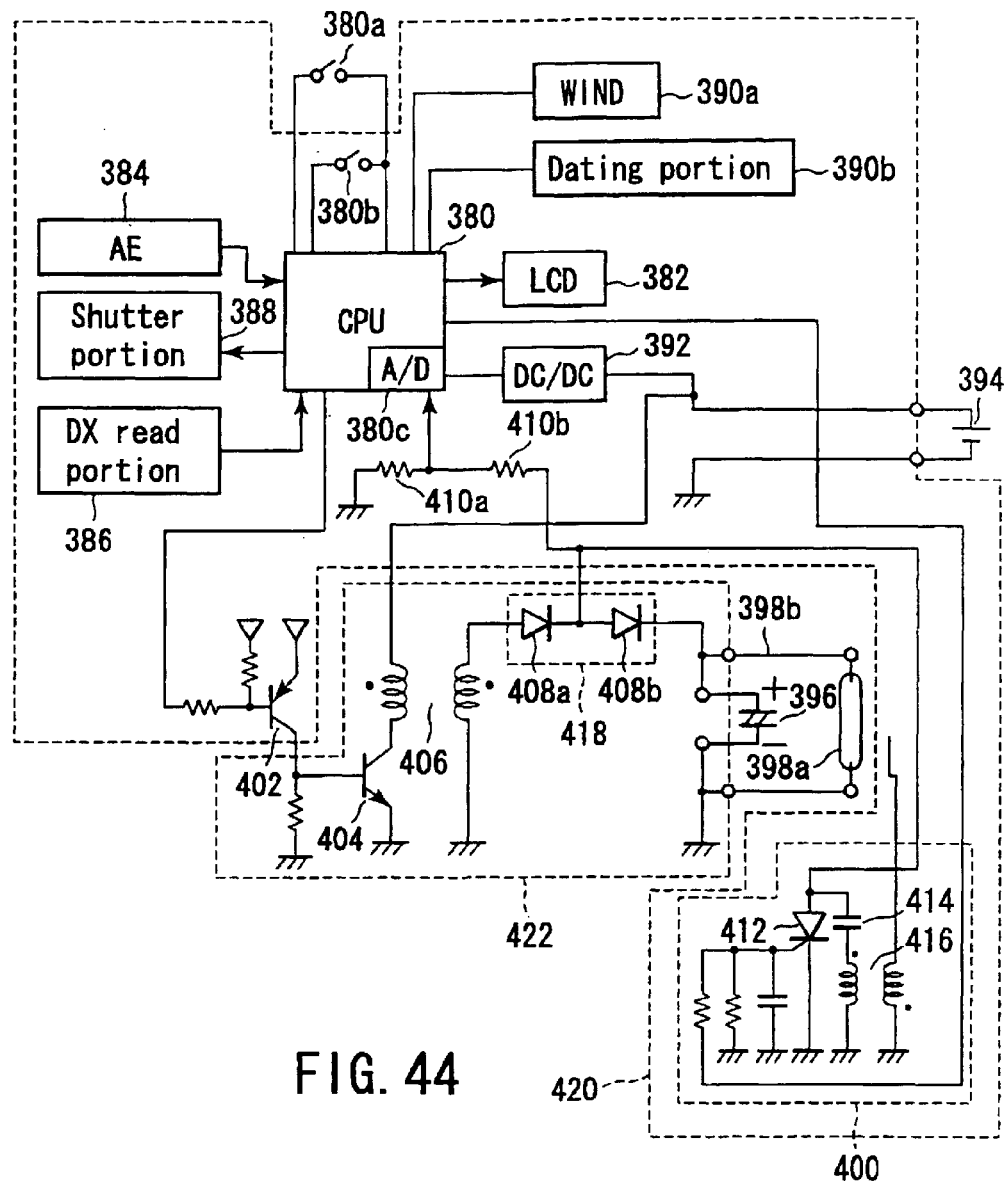
FIG. 44 is a block diagram showing an electronic circuit constitution of the camera according to a thirteenth embodiment of the present invention.

FIG. 44 is a block diagram showing an electronic circuit constitution of the camera according to the thirteenth embodiment of the present invention.

A microcontroller (hereinafter referred to as CPU) 380 is a control unit for controlling an operation sequence of the entire camera. The CPU 380 is connected to a main switch 380a and release switch 380b. The CPU 380 judges input states of the main switch 380a and release switch 380b to perform a corresponding operation control. When a photographer judges that the main switch 380a has been operated, the camera is brought into a state in which the photography is possible, and photography information is displayed in an LCD 382 as a display device.

Figure 45A:
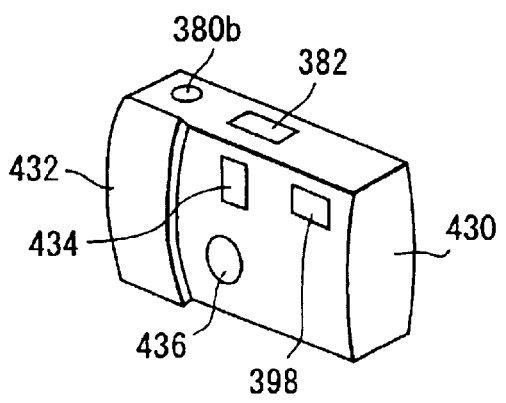
FIG. 45A is an appearance perspective view of a case in which a barrier is opened.
Figure 45B:
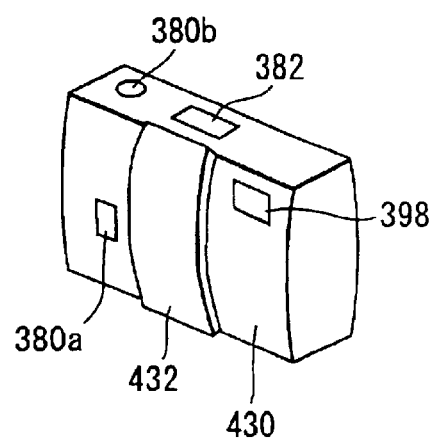
FIG. 45B is an appearance perspective view of a case in which the barrier is closed.

FIGS. 45A and 45B are appearance diagrams of a compact camera showing one example of the camera according to the present embodiment. The compact camera includes a protective member for protecting optical systems such as a photography lens 436 and finder objective lens 434 disposed in a camera front surface, so-called "barrier" 432 in many cases.

In a camera 430 including the barrier 432, a power supply of the camera main body is turned ON/OFF in accordance with an opened/closed state of the barrier 432 detected by a barrier switch 380a shown in FIG. 45B in many cases. (Hereinafter, the barrier switch 380a is treated in the same manner as the main switch 380a, and referred to as the main switch 380a.) That is, as shown in FIG. 45A, when the barrier 432 is opened, the main switch 380a turns ON and the photography is possible. On the other hand, as shown in FIG. 45B, when the barrier 432 is closed, the main switch 380a turns OFF to prohibit the photography.

Moreover, when the release switch 380b shown in FIGS. 45A and 45B is operated, an exposure control is started.

Furthermore, an analog/digital (A/D) conversion portion 380c is built in the CPU 380. A voltage is inputted into the A/D conversion portion 380c from a strobe device described later in detail. The A/D conversion portion 380c A/D converts the inputted voltage. The CPU 380 judges whether or not charging of the main condenser for flash light emission described later has been completed by the A/D converted voltage.

Figure 46:
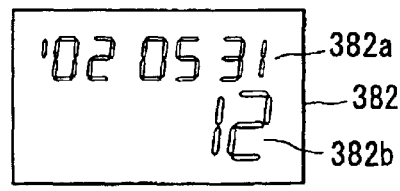
FIG. 46 is an explanatory view relating to a display example of LCD.

The display portion (hereinafter referred to as LCD) 382 is disposed in the upper surface of the camera main body 430, and displays the photography information, and the like. As shown in FIG. 46, the LCD for many cameras includes a date display portion 382a which is a region for display a photography date, a frame number display portion 382b which is a region for displaying the number of photography frames of the film, and the like.

It is to be noted that the CPU 380 is usually connected to the LCD 382 by 20 signal lines in order to display a segment constituting the above-described date display portion 382a or frame number display portion 382b. Therefore, it is preferable to mount the CPU 380, LCD 382, and signal lines for connecting these to each other on the same printed substrate. That is, when the CPU 380 and LCD 382 are mounted on separate printed boards, the condenser requiring very many electrodes is necessary, this results in cost rise, or the space at the mounting time is also disadvantage.

A photometry (AE) portion 384 measures brightness of a subject, and is constituted of so-called photoelectric conversion elements whose output signals change in response to intensity of incident light, such as CdS and photodiode. The subject brightness measured by the AE portion 384 is used for the CPU 380 in performing exposure calculation.

A DX read portion 386 reads electrode pattern information formed in a film cartridge (not shown), that is, the DX codes. Film sensitivity information is recorded in the DX codes, and the film sensitivity information read by the DX read portion 386 is outputted to the CPU 380. The CPU 380 performs the exposure calculation based on the subject brightness measured by the AE portion 384 and the film sensitivity information to determine a shutter speed or diaphragm at an exposure time. At the exposure time, a strobe light emitting portion 398 shown in FIG. 45A is allowed to emit the light to judge whether or not the subject is irradiated with light.

A shutter portion 388 is controlled by the CPU 380, and a film (not shown) is exposed by a predetermined amount based on the shutter speed and diaphragm determined by the above-described exposure calculation.

A film wind portion (hereinafter referred to as the WIND portion) 390a is constituted of a motor for film supply, and winds the film after photography end. That is, when the photography ends, the CPU 380 controls the motor of the WIND portion 390a to wind the film by one frame. At this time, a dating portion 390b is controlled to superimpose a photography date on a photographed image. The dating portion 390b irradiates the film with a light having a predetermined pattern from a light source including LED to superimpose date information on a photograph print.

A DC/DC converter 392 is a circuit for varying a direct-current voltage. In a battery 394 for use as a power supply of the camera, at a charging control time of the strobe device described later in detail, much current flows, and the voltage becomes unstable. Moreover, when the power supply voltage becomes unstable, the CPU 380 or another circuit has a possibility of performing an erroneous operation. Then, when the DC/DC converter 392 controls the power supply voltage to stabilize the power supply voltage, the erroneous operation of the CPU 380 is prevented.

It is to be noted that in FIG. 44 constituting elements other than the above-described elements relate to a flash light emitting device. Details of the flash light emitting device will be described later.

Figure 47:
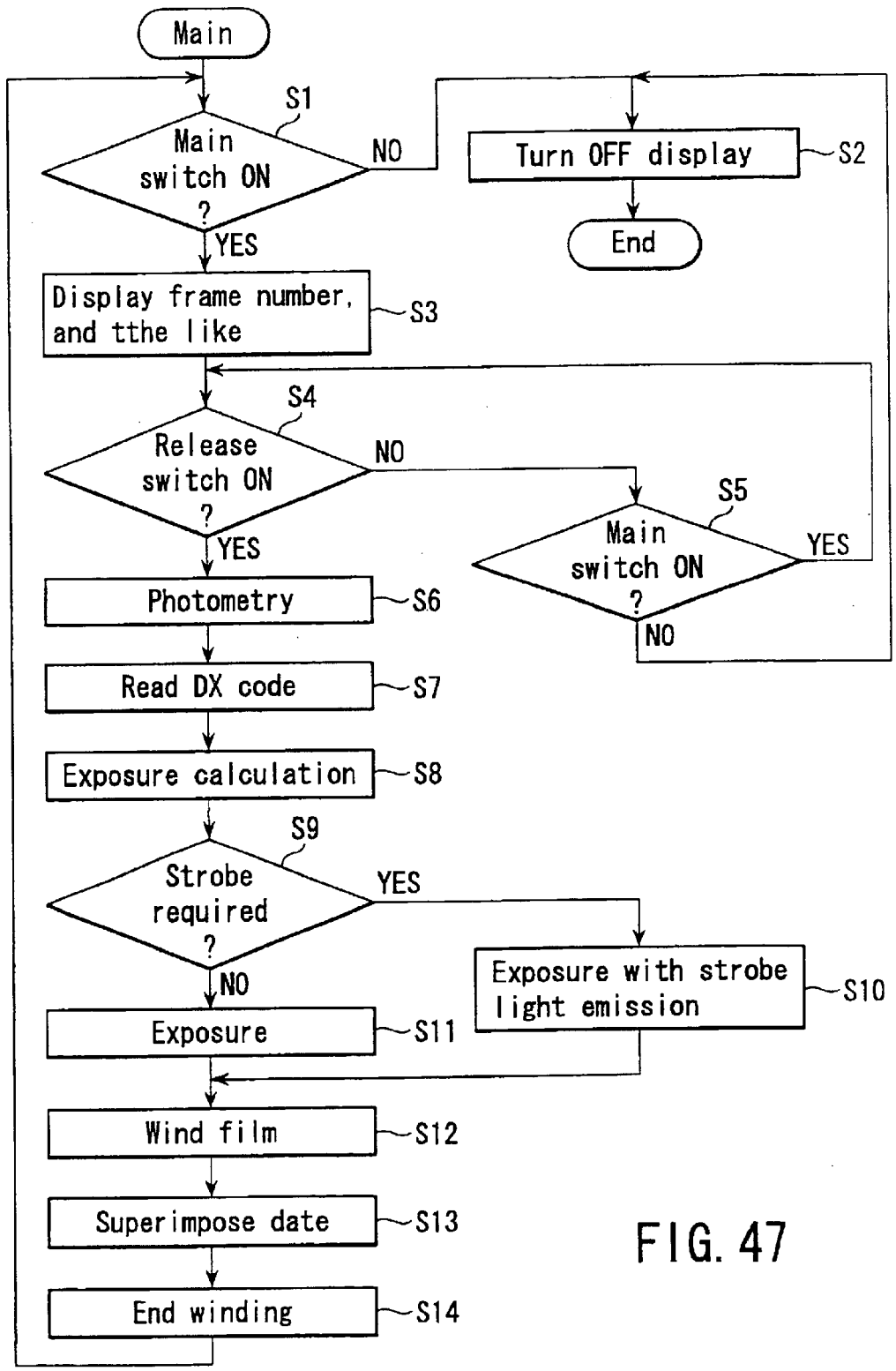
FIG. 47 is a flowchart concerning control of a main operation of the camera according to the thirteenth embodiment of the present invention.

FIG. 47 is a flowchart of a main operation control in the camera controlled by the CPU 380 according to the present embodiment.

First, it is judged in step S1 whether or not the photographer has opened the barrier 432, that is, whether or not the main switch 380a has been turned ON. When the main switch 380a is judged to be OFF, the step shifts to step S2. After turning OFF the display of the LCD 382, the control of the present flowchart ends.

On the other hand, when the main switch 382a is judged to be turned ON in the judgment of the step S1, the step shifts to step S3 to allow the LCD 382 to display the photography information such as the photographed frame number. Accordingly, the photographer can recognize that the camera can perform the photography.

After displaying the photographed frame number in the LCD 382, it is judged in step S4 whether or not the photographer has turned ON the release switch 380b. When the release switch 380b is judged not to be turned ON, the step shifts to step S5 to judge whether or not the main switch 380a remains to be ON. When the main switch 380a is judged to remain to be ON, the step returns to the step S4. On the other hand, it is judged in the judgment of the step S5 that the main switch 380a has been turned OFF, the step returns to the step S2, the LCD 382 display is turned OFF, and subsequently the control of the present flowchart ends.

When it is judged in the judgment of the step S4 that the release switch 380b has been turned ON, the step shifts to step S6, and the AE portion 384 performs a photometry operation for measuring the brightness of the subject. Next, in step S7, the DX read portion 386 reads the DX code of the film cartridge (not shown), and identifies the information such as the film sensitivity. Moreover, in step S8, the exposure amount is determined from the subject brightness measured in the step S6 and the film sensitivity information read in the step S7. In step S9, it is judged whether or not to emit the light from the strobe light emitting portion 398 at the exposure time.

When it is judged in the judgment of the step S9 that the light is emitted from the strobe light emitting portion 398 to perform the exposure, the step shifts to step S10, the light is emitted from the strobe light emitting portion 398, and the subject is irradiated with the light. Additionally, the shutter portion 388 is controlled to perform the exposure. On the other hand, when it is judged that the strobe light emitting portion 398 is not allowed to emit the light and the exposure is not performed, the step shifts to step S11, and the shutter portion 388 is controlled as such to perform the exposure.

After the exposure ends, the step shifts to step S12, and the WIND portion 390a is controlled to wind the film. In step S13, the dating portion 390b is controlled to superimpose the date onto the film. After the winding of the film ends, the WIND portion 390a is stopped/controlled in step S14, and subsequently the step returns to the step S1.

Next, the flash light emitting device for use in the step S10 will be described.

That is, in FIG. 44, the flash light emitting device comprises a main condenser 396, xenon (flash light emitting) tube 398a, trigger circuit 400, and transistors 402, 404. The flash light emitting device also comprises a transformer for charging 406 as one of a plurality of electric elements for charging the main condenser 396, diodes 408a, 408b, and resistances 410a, 410b.

In the flash light emitting device, the energy of the main condenser 396 raised/charged to the high voltage is supplied to the xenon tube 398a, and the xenon tube 398a is allowed to emit the light. Accordingly, the strobe light emitting portion 398 emits the light. At this time, two important controls are performed by the CPU 380.

One is a "charging control" for charging the main condenser 396. At this time, the CPU 380 turns ON/OFF the transistors 402, 404 which are semiconductor switches at the high speed, and the high voltage is accordingly generated in a secondary winding of the transformer for charging 406. The high voltage is charged to the main condenser 396 at the high voltage via the diodes 408a, 408b for rectification. The high voltage generated in the secondary winding of the transformer for charging 406 is divided via the resistances 410a, 410b, and subsequently A/D converted by the A/D conversion portion 380c in the CPU 380. The CPU 380 judges by the voltage whether or not the charging of the main condenser 396 has been completed.

Another important control in the light emission control of the flash light emitting device is a "trigger control". When the charging of the main condenser 396 is judged to have been completed, the CPU 380 performs ON control of a thyristor 412 in the trigger circuit 400. Accordingly, the high voltage is generated in a trigger transformer 416 by the energy stored in a trigger condenser 414. By this high voltage, a xenon gas in the xenon tube 398a is ionized. In this state, when the energy stored in the main condenser 396 is supplied to the xenon tube 398a, the xenon tube 398a discharges electricity/emits light.

In the light emission control of the above-described flash light emitting device, components for exclusive use in the flash light emitting device are required. This component needs to be a large-sized component which can bear even the above-described high voltage, and it is difficult to miniaturize the component. That is, when the arrangement at the camera assembling time is studied, the arrangement of the large-sized component is devised to determine the size of the entire camera.

Figure 48:
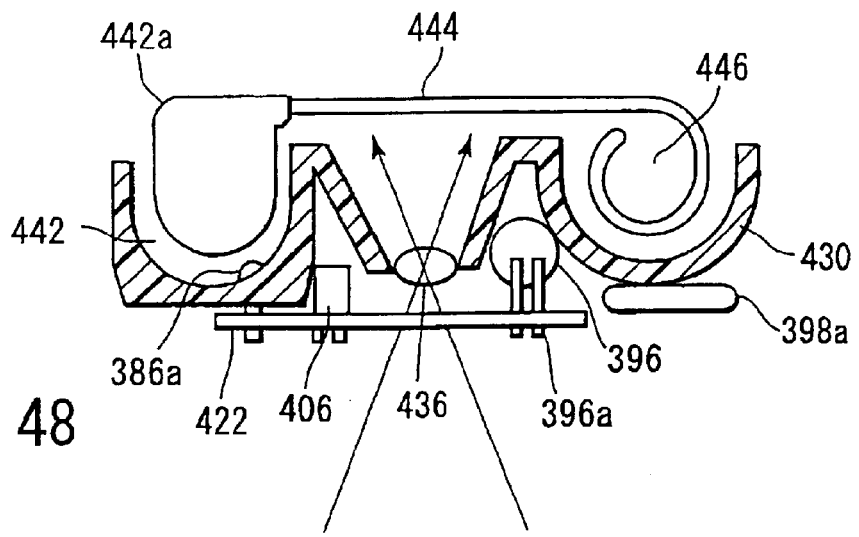
FIG. 48 is an upper-surface sectional view of the camera according to the thirteenth embodiment of the present invention.

FIG. 48 is an upper-surface sectional view of the camera according to the thirteenth embodiment. That is, in the present embodiment, inside the camera main body 430, the photography lens 436 is disposed in a cartridge chamber 442 in which a film cartridge 442a is loaded and a spool chamber 446 for winding a film 444.

With the arrangement shown in FIG. 48, space portions are formed between the cartridge chamber 442 and photography lens 436 and between the spool chamber 446 and photography lens 436 including a light axis. Therefore, large-sized components such as the main condenser 396 for charging the flash light emitting device and the transformer for charging 406 are disposed in the space portion. Moreover, the main condenser 396 disposed on one side of the photography lens 436 and the transformer for charging 406 disposed on the other side of the photography lens 436 are mounted on a printed substrate (hereinafter referred to as the substrate for charging) 422.

It is to be noted that in the present embodiment, the main condenser 396 is disposed in a position close to the xenon tube 398a, and the transformer for charging 406 is disposed on the side of the cartridge chamber 442. Moreover, the main condenser 396 and transformer for charging 406 are electrically connected to each other on the substrate for charging 422.

Moreover, a contact 386a for reading the DX code disposed in the film cartridge 442a is disposed in the substrate for charging 422.

Figure 49:
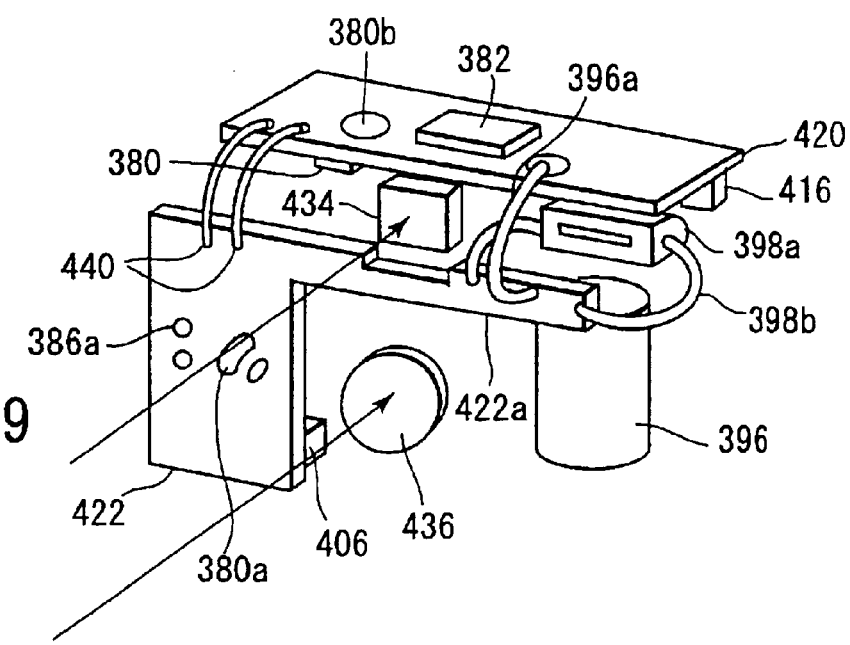
FIG. 49 is a perspective view of the inside of the camera according to the thirteenth embodiment of the present invention.

FIG. 49 is a perspective view inside the camera 430.

A circuit concerning the charging of the main condenser 396 of the flash light emitting device is mainly mounted on the substrate for charging 422 disposed on the front-surface side of the camera main body 430. The substrate for charging 422 includes an arm portion (connection portion) 422a integrally disposed in the substrate, and has a substantially L-shape. This arm portion 422a connects the main condenser 396 to the transformer for charging 406. It is to be noted that the arm portion 422a is disposed on the upper side of (above) the photography lens 436 not to obstruct the light incident upon the photography lens 436 and finder objective lens 434.

Further on the substrate for charging 422, the main switch 380a is disposed which detects the opened/closed state of the barrier 432 and which turns ON/OFF the operation of the camera. In this manner, the main switch 380a or the contact 386a is formed as a second switch on the substrate for charging 422. It is to be noted that the switch can also take various other modes.

It is to be noted that the substrate for charging 422 can be attached to the camera main body 430 by the screw or the double-faced tape.

Moreover, in FIG. 49, the CPU 380, LCD 382, and release switch 380b which is a first switch are mounted on a printed substrate (hereinafter referred to as the main substrate) 420 which is disposed above the camera. The motor for film supply (not shown) is mounted on the main substrate 420.

The LCD 382 or the release switch 380b is disposed on the upper surface of the camera as described above in many cases. Therefore, the main substrate 420 is disposed on the upper-surface side inside the camera. The CPU 380 mounted on the main substrate 420 transmits a signal for the strobe charging control described above to the circuit mounted on the substrate for charging 422. Then, the main substrate 420 is connected to the substrate for charging 422 by lead wires 440.

Figure 50:
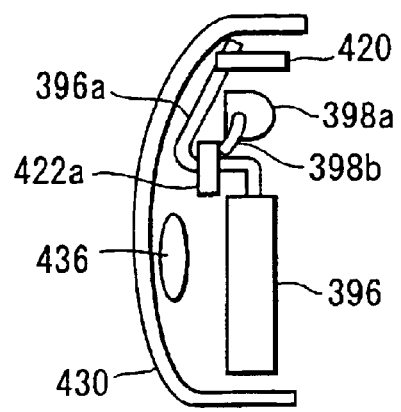
FIG. 50 is a side sectional view of the camera according to the thirteenth embodiment of the present invention.

FIG. 50 is a side sectional view of the camera 430. As shown in FIG. 44, the xenon tube 398a is connected to ground (GND) on a minus side. Then, as shown in FIG. 50, a lead portion 396a of the main condenser 396 is bent and first connected to GND of the substrate for charging 422. Furthermore, the lead portion 396a of the main condenser 396 is bent and connected to GND of the main substrate 420. By this connection, the main condenser 396, the xenon tube 398a (substrate for charging 422), and GND of the main substrate 420 are electrically connected to one another.

Furthermore, when a lead wire (lead portion) 398b from the xenon tube 398a is connected to the main condenser 396, a land for soldering is disposed beforehand in the arm portion 422a of the substrate for charging 422, and a stable operation can be performed. When the xenon tube 398a is disposed in a short distance from the main condenser 396, the lead wire 398b can be shortened.

Here, the effect of the substrate for charging 422 is as follows.

(a) It is possible to contain and mount the transformer for charging 406 in an optimum position.

(b) It is possible to contain and mount the main condenser 396 in the optimum position. The condenser can be mounted directly on the substrate for charging 422 by the lead portion 396a.

(c) The contact 386a for reading the DX code, and the main switch 380a for detecting the opening/closing of the barrier can be disposed.

(d) The lead wire 398b for the xenon tube 398a can be shortened.

(e) The main substrate 420 can be connected to the GND via the lead portion 396a of the main condenser 396.

It is to be noted that the arm portion 422a may include a wiring extending toward the main condenser 396 from the secondary winding of the transformer for charging 406. Therefore, when only the diodes 408a, 408b are mounted on the arm portion 422a, the arm portion 422a can be thinned. Accordingly, without obstructing a light paths of the photography lens 436 or the finder objective lens 434, the substrate can be miniaturized.

Figure 51A:
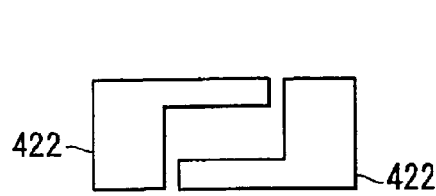
FIG. 51A is an explanatory view in manufacturing a substrate for charging.
Figure 51B:
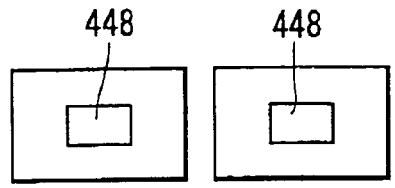
FIG. 51B is an explanatory view in manufacturing the substrates one by one.

Moreover, at a substrate manufacturing time, as shown in FIG. 51a, one substrate is divided to manufacture two substrates for charging 422. In this case, a substrate manufacturing cost can be inexpensive as compared with the manufacturing of the substrates one by one as shown in FIG. 51B. For example, when the substrates built in the camera having the same size are manufactured, and when the substrates are manufactured as shown in FIG. 51A, it is assumed that the substrates can be manufactured with a width $W_1$ for two substrates. When the substrates are manufactured as shown in FIG. 51B, it is assumed that the substrates can be manufactured with a width $W_2$ for two substrates. At this time, $W_1$ is a substantially half width of $W_2$. It is to be noted that reference numeral 448 denotes windows for the photography lenses.

Moreover, the effects of the main substrate 420 are as follows.

(f) The substrate can be used as a base in mounting the LCD 382.

(g) The CPU 380, the LCD 382, and the signal line for connecting these to each other can be mounted on the same substrate.

(h) The electrode of the release switch 380b can be disposed.

(i) The substrate can be used as a substrate for attaching the electrode of the battery 394.

Here, the effect (i) of the main substrate 420 will supplementarily be described.

Figure 52:
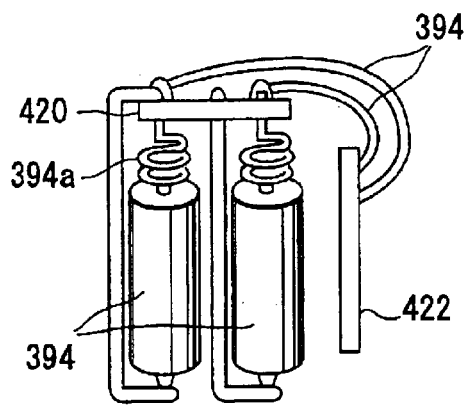
FIG. 52 is a side sectional view showing an example in which a battery is mounted on a main substrate.

When the main substrate 420 is used as the substrate for attaching the electrodes of the batteries 394, as shown in FIG. 52, electrodes 394a may be attached. It is to be noted that FIG. 52 is a side sectional view seen from the side surface reverse to that of FIG. 50. Here, wirings for the batteries 394 are lead wires 394b soldered to the pattern on the main substrate 420. The lead wires 394b can supply power also to the substrate for charging 422 from the power supply.

Figure 55:
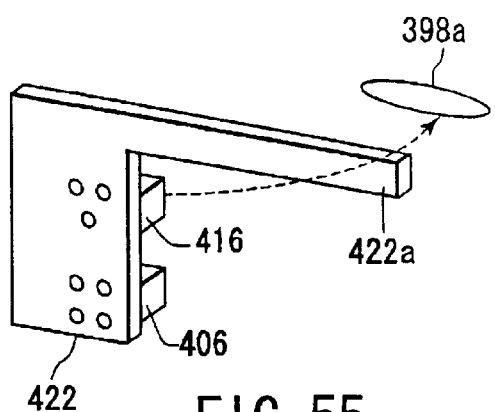
FIG. 55 is an explanatory view showing an example in which the trigger condenser is disposed apart from the Xe tube.
Figure 53:
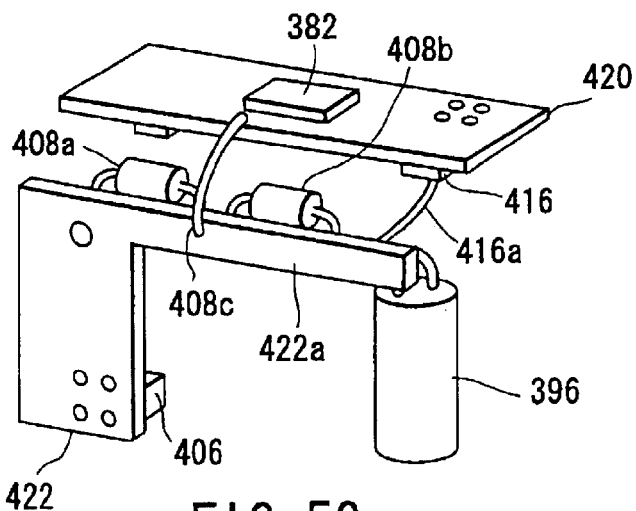
FIG. 53 is an explanatory view showing an example in which a diode is used to connect the substrate.
Figure 54:
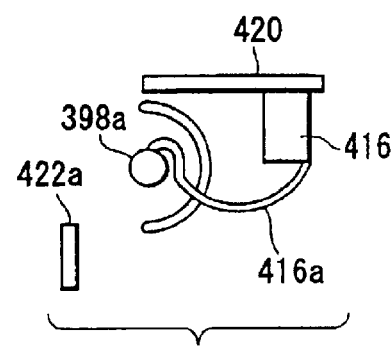
FIG. 54 is an explanatory view showing an example in which a trigger condenser is disposed on the back of an Xe tube.

Moreover, as shown in FIGS. 53 and 54, the trigger transformer 416 disposed on the main substrate 420 is disposed in the space portion behind the xenon tube 398a. In this case, as shown in FIG. 55, a signal line 416a can be shortened as compared with the trigger transformer 416 disposed in the substrate for charging 422. If the signal line 416a connecting the trigger transformer 416 to the xenon tube 398a is lengthened, noises induced accordingly sometimes cause the erroneous operation of the CPU 380 or another electronic circuit. Then, the arrangement of the trigger transformer 416 is devised and the length of the signal line 416a is minimized to reduce the erroneous operation.

That is, when the wiring is shortened, and the noise by the trigger transformer 416 or the noise by a large current flowing through the xenon tube 398a from the main condenser 396 is reduced, there can be provided the camera which does not cause the erroneous operation of the circuit.

Moreover, in FIG. 49, the lead portion of the main condenser 396 is bent to connect the main substrate 420 to the GND of the substrate for charging 422, but as shown in FIG. 53, a lead portion 408c of either one of the diodes 408a, 408b may be bent to connect the substrate. Accordingly, the number of lead wires for connecting two substrates to each other, that is, for connecting the main substrate 420 to the substrate for charging 422 can be reduced. Since the lead wires require a step of aligning the lengths or removing coated portions, the reduction of the number of lead wires results in cost reduction.

As described above, according to the thirteenth embodiment, since the large-sized component is disposed in the appropriate position in the camera, and is effectively mounted on the printed substrate also in consideration of influences of noises, there can be provided the camera small in size, low in cost, and superior in capability.

Moreover, in the present embodiment, the arrangements of the release switch, the switch for detecting the barrier, and further the electrode for the battery are also considered in the constitution. It is to be noted that, needless to say, a mode switch for setting various photography modes of the camera may also be disposed in the vicinity of the release switch.

Next, a fourteenth embodiment of the present invention will be described with reference to FIG. 56.

The fourteenth embodiment is different from the thirteenth embodiment in that the arm portion 422a of the substrate for charging 422 is disposed on the lower side of (below) the photography lens 436.

Since the arm portion 422a is disposed below the photography lens 436 in this manner, it is not necessary to pass the arm portion 422a between the photography lens 436 and the finder objective lens 434 as in the thirteenth embodiment, and an assembling property is enhanced.

It is to be noted that since the arm portion 422a is disposed below the photography lens 436, the lead wire 398b connecting the substrate for charging 422 to the xenon tube 398a lengthens. However, there is a merit that simply with the upward wiring of the lead wire 398b, the substrate for charging 422 can be connected to the xenon tube 398a.

According to the thirteenth and fourteenth embodiments, the following can be obtained.

(5) A camera in which a transformer is disposed in a space portion between a photography lens to photograph a subject and a cartridge chamber to load a film cartridge, and a condenser disposed in the space portion between the photography lens and a spool chamber to wind a film is charged by the transformer, wherein a printed substrate on which the transformer is mounted includes an arm portion extended to an electrode portion of the condenser from the transformer, and the electrode portion of the condenser is mounted on the arm portion.

(6) The camera according to the above (5), wherein the arm portion is disposed under the photography lens.

(7) A camera to which a flash light emitting device is attached, comprising: a photography lens; and an electric substrate in which an electric component mounting portion including some of a plurality of electric elements to charge a condenser to allow the flash light emitting device disposed on one side via a light axis of the photography lens to emit light is disposed on the other side via the light axis of the photography lens, and a connection portion (arm portion)

extended integrally from the electric mounting portion to electrically connect a lead portion of the condenser or a lead portion of a flash light emitting tube disposed in the flash light emitting device is disposed above or below the photography lens.

The following embodiments have been disclosed in Japanese patent application No. 2002-171621 filed on Jun. 12, 2002, in Japan, the entire contents of which are hereby incorporated by reference.

Next, a fifteenth embodiment of the present invention will be described.

FIG. 57 is a diagram showing the appearance in mounting a motor as the electric component on the electric substrate according to the fifteenth embodiment of the present invention. It is to be noted that the FPC substrate which is an electric substrate having flexibility will continuously be described as an example of the electric substrate according to the present embodiment, but a technique of the present embodiment can also be applied to a rigid printed substrate.

In FIG. 57, a motor 452 includes a columnar protrusion 454 in a middle portion. The motor 452 includes lead-type connection terminals (hereinafter referred to as the leads) 456. An FPC substrate 458 includes an opening for escaping from the protrusion 454.

FIG. 58 is a constitution diagram of the electric substrate according to the present embodiment.

That is, the present FPC substrate 458 comprises conductor patterns 460, solder land portions 462, an outer shape hole portion (hole portion) 464, and insertion through portions 466.

The main body of the FPC substrate 458 is constituted by disposing the conductor patterns in a thin film. Accordingly, the FPC substrate 458 has flexibility, and it is possible to bend and use the substrate.

The conductor patterns 460 are formed by copper foils on the FPC substrate 458. The conductor patterns 460 form current paths in setting the leads 456 of the motor to be electrically conductive. Moreover, the solder land portions 462 are formed on the conductor patterns 460.

For the solder land portions 462, after removing a part of the copper foil on the conductor patterns 460, the portion from which the copper foil is removed is subjected to the solder plating or the rust proofing treatment so that the soldering is possible. That is, when the motor 452 is soldered to the FPC substrate 458, the leads 456 of the motor 452 are soldered to the solder land portions 462.

Moreover, the hole portion 464 having a circularly closed shape is formed in the middle portion of the FPC substrate 458. The hole portion 464 is an opening for escaping from the protrusion 454 of the motor as shown by a broken line in FIG. 58.

Furthermore, the insertion through portions 466 forming a substantial U-shape and extended on the outer-diameter side of the hole portion 454 are formed in the edge of the hole portion 454. The insertion through portions 466 are formed and connected to the hole portion 464, and the leads 456 are passed through the insertion through portions 466. Moreover, the solder land portions 462 are disposed around the insertion through portions 466. The insertion through portions 466 are constituted to such a size that the portions are disposed in the vicinity of the leads 456 or contact the leads so as to facilitate the soldering of the leads 456. Needless to say, the insertion through portions 466 may also have a size such that the leads 456 can be fit.

At a manufacturing time of the FPC substrate 458 constituted as described above, the hole portion 464 is formed integrally with the insertion through portions 466. Therefore, an interval between the leads 456 and the protrusion 454 does not have to be considered much, and the substrate can be manufactured with a mold accuracy for multipurpose. Furthermore, since the solder land portions 462 are disposed around the insertion through portions 466, the interval between the solder land portions 462 and the protrusion 454 can be broadened. A possibility that the solder flows out into the protrusion 454 and melts the protrusion 454 can be reduced.

Moreover, since the circularly closed hole portion 464 is disposed in the FPC substrate 458 in accordance with the shape of the protrusion 454 of the motor, the following phenomenon can be decreased. That is, the phenomena such as deviation of a solder land portions 462 portion for connecting the leads 456 or positional dispersion in attaching the motor into the FPC substrate 458 are decreased. Accordingly, the constitution is also advantageous in mounting the components.

The following embodiments have been disclosed in Japanese patent application No. 2002-171624 filed on Jun. 12, 2002, in Japan, the entire contents of which are hereby incorporated by reference.

Next, a sixteenth embodiment of the present invention will be described.

Figure 59:
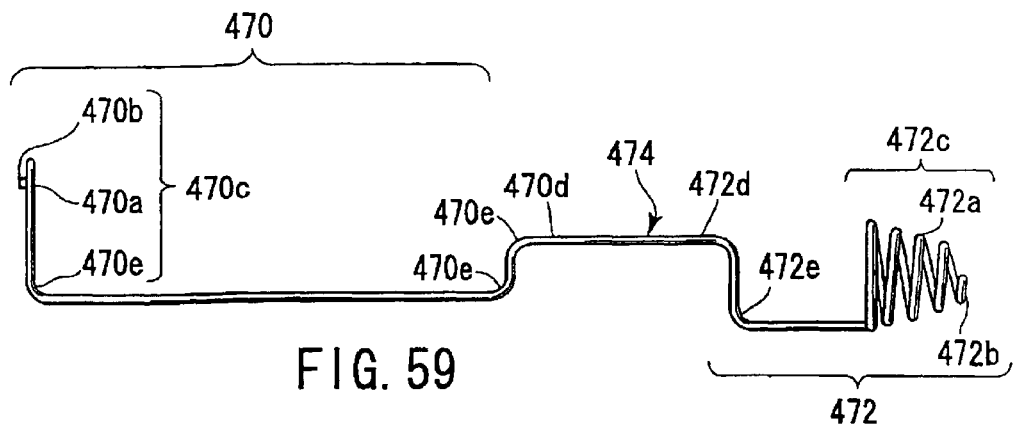
FIG. 59 is a diagram showing a battery contact piece according to a sixteenth embodiment of the present invention.

FIG. 59 shows a battery contact piece according to the sixteenth embodiment. For example, the piece is formed of a line material referred to as a CP line in which SWC (rigid steel line) or core material is formed of carbon steel for a spring and a surface layer is plated with copper. In one end of the line material, a contact piece for a cathode (first contact piece) 470 is disposed to contact a cathode of the battery. In the other end of the line material, a contact piece for an anode (second contact piece) 472 is disposed to contact an anode of the battery. The contact piece for the cathode 470 is formed and integrally connected to the contact piece for the anode 472 via a portion to be cut 474.

That is, in one end of the contact piece for the cathode 470, a battery connection end 470c is disposed including a cathode contact 470a and a protrusion for positioning 470b in one end. An external connection lead 470b is disposed in the other end. Between the battery connection end 470c and the external connection lead 470d, bent portions 470e are appropriately formed in consideration of a wiring space in a battery containing chamber 480 (see FIGS. 60 and 61) described later.

The other contact piece for the anode 472 includes a battery connection end 472c including a spiral spring portion 472a and an anode contact 472b in one end. An external connection lead 472d is formed in the other end. Between the battery connection end 472c and the external connection lead 472d, a bent portion 472e is appropriately formed in consideration of an escape of the constituting component on the outer side of the battery containing chamber 480 (see FIGS. 60 and 61). Moreover, the external connection lead 470b of the contact piece for the cathode 470 is integrally connected to the external connection lead 472d of the contact piece for the anode 472 and these leads are formed so that the leads can be separated via the portion to be cut 474.

The contact piece for the cathode 470 and contact piece for the anode 472 are stored at a storage/management time in an integrated state in which the external connection leads 470d, 472d are connected to each other via the portion to be cut 474. Accordingly, the number of components at the storage time can be reduced, and component loss is prevented. Moreover, at an attaching time of the electronic apparatuses such as the camera into the battery containing chamber 480 as described later, the contact piece for the cathode 470 is cut from the contact piece for the anode 472 by the portion to be cut 474 connecting the external connection leads 470*d*, 472*d* to each other, separated, and attached.

Figure 62:
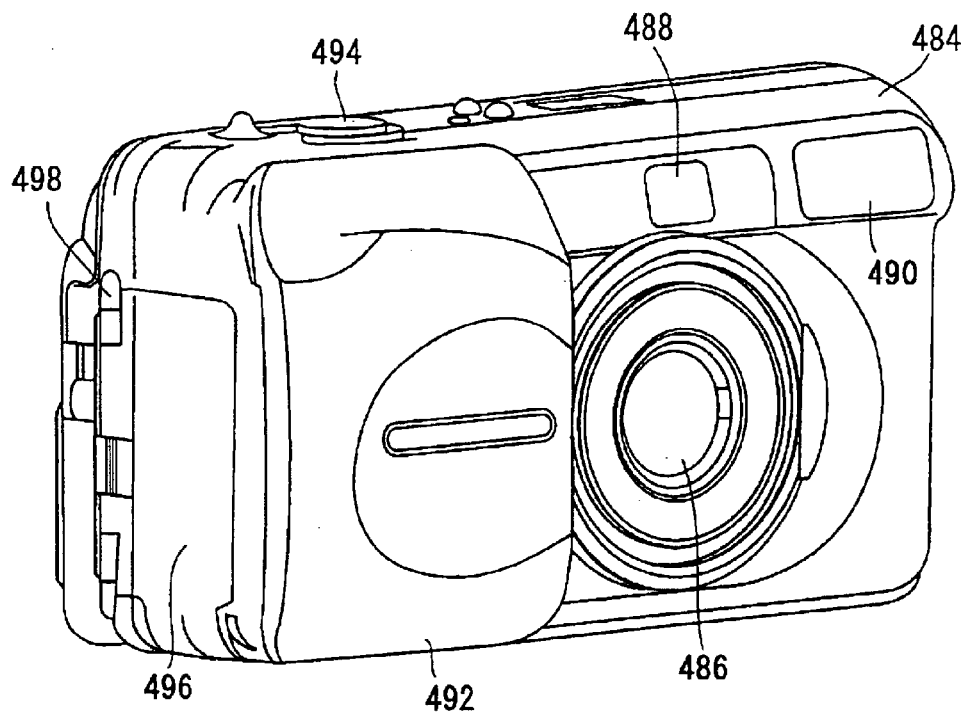
FIG. 62 is a perspective view showing the appearance of the camera to which the present invention is applied.
Figure 63:
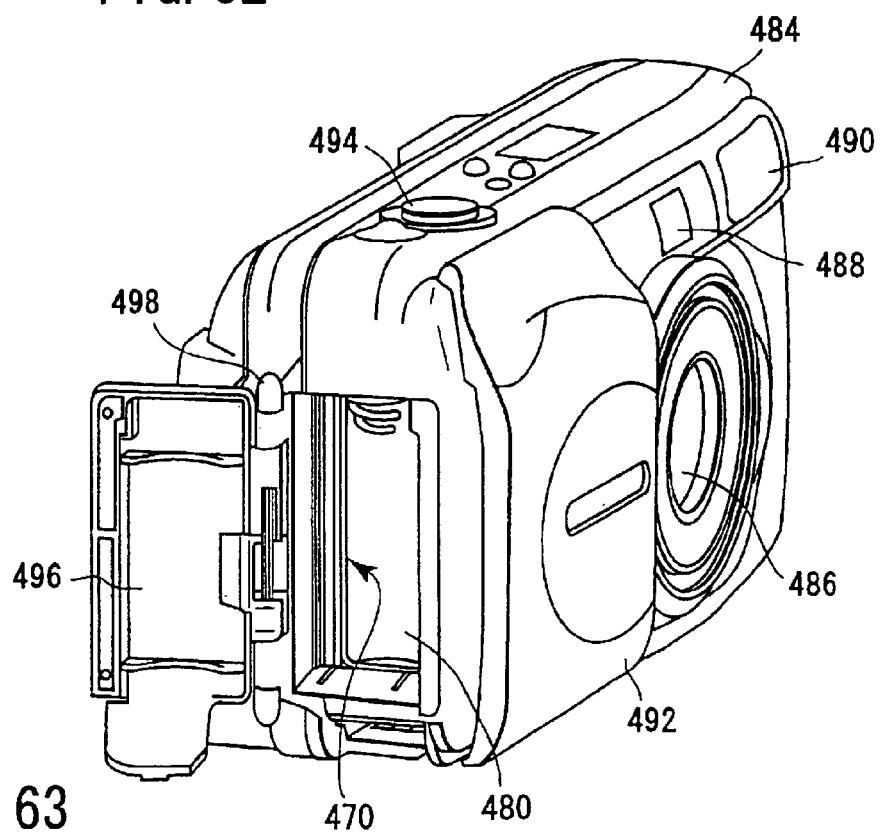
FIG. 63 is a perspective view showing an open state of a battery lid of FIG. 62.

Here, the application of the integrally formed battery contact piece including the contact piece for the cathode 470 and contact piece for the anode 472 which are characteristic of the present embodiment via the portion to be cut 474 to the camera shown in FIGS. 62 and 63 will be described.

That is, in the front surface of a camera exterior 484 in which a camera main body 482 is contained, a photography lens 486, a finder 488, and a flash light emitting portion 490 are disposed. Moreover, in the front surface of the camera exterior 484, a barrier 492 is disposed to be movable between a closed position where the photography lens 486 and finder 488 are covered with the barrier 492 and an opened position where the photography lens and finder can be released to perform the photography.

Moreover, a release button 494 is disposed in an upper-surface portion of the camera exterior 484. In a side-wall portion of the exterior, a battery lid 496 is disposed to be openable/closable with respect to the battery containing chamber 480 disposed in the camera main body 482 via a hinge 498. In this manner, the contact piece for the cathode 470 and contact piece for the anode 472 integrally formed via the portion to be cut 474 are attached with respect to the battery containing chamber 480 disposed in the camera main body 482.

The contact piece for the cathode 470 and contact piece for the anode 472 are stored/maintained in the integrally connected state via the portion to be cut 474 at the storage time before the attaching operation. When the pieces are attached to the battery containing chamber 480, the pieces are cut and separated from the portion to be cut 474.

Figure 61:
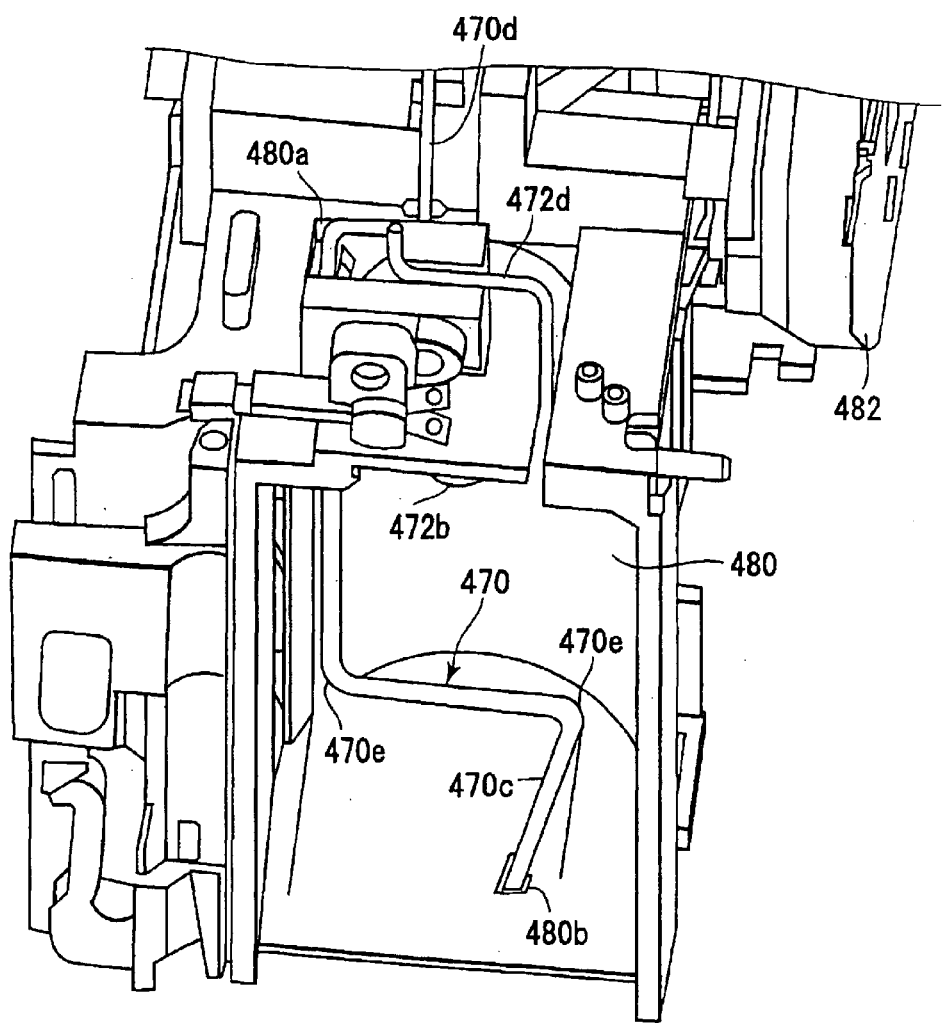
FIG. 61 is an appearance perspective view showing an assembled state of the contact piece for the cathode into the battery containing chamber in FIG. 60.
Figure 60:
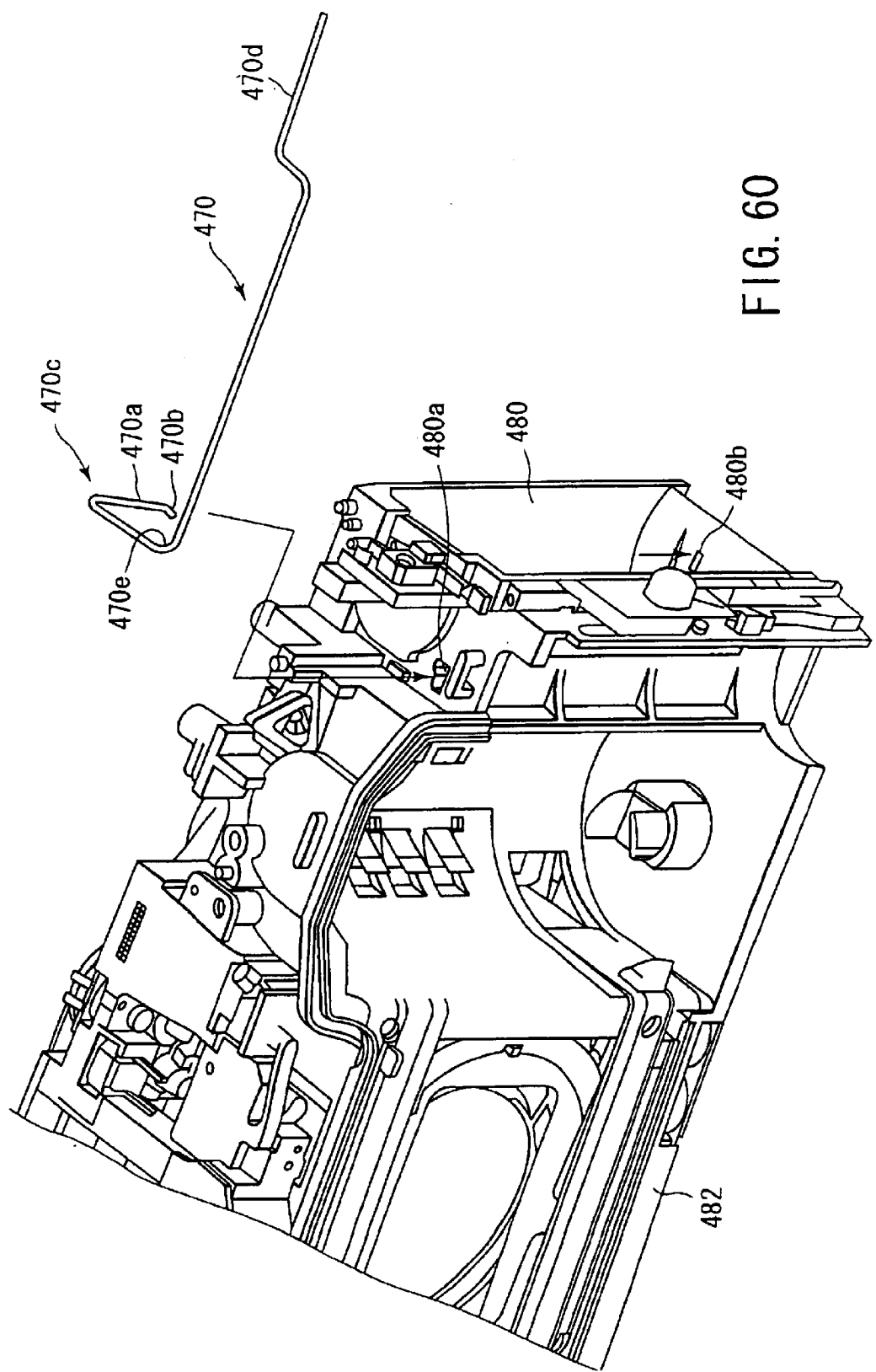
FIG. 60 is an exploded perspective view of an exploded part showing an assembling operation of a contact piece for a cathode of FIG. 59 into a battery containing chamber.

In this case, for the contact piece for the cathode 470, as shown in FIGS. 60 and 61, the bent portions 470*e* are used to insert the battery connection end 470*c* into an insertion hole 480*a* from the outside of the battery containing chamber 480 of the camera main body 472. The insertion hole 480*a* is disposed in the upper-surface portion of the battery containing chamber 480. Moreover, the contact piece for the cathode 470 is contained in the battery containing chamber.

Furthermore, the protrusion for positioning 470*b* is inserted into an engaging hole 480*b* disposed in the lower end of the battery containing chamber 480. Accordingly, for the contact piece for the cathode 470, the cathode contact 470*a* is positioned in a predetermined position of the lower end of the battery containing chamber 480 and attached. Here, the external connection lead 470*b* of the contact piece for the cathode 470 is disposed outside the battery containing chamber 480, and electrically connected to the cathode side of a power supply portion (not shown).

Figure 64:
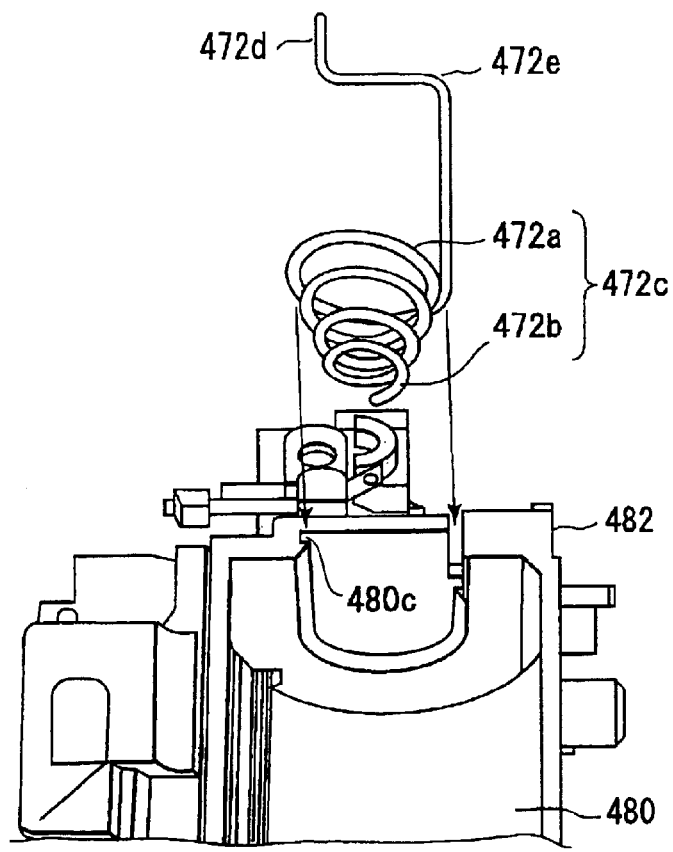
FIG. 64 is an exploded perspective view of an exploded part showing the attaching operation of the contact piece for the anode into the battery containing chamber.
Figure 65:
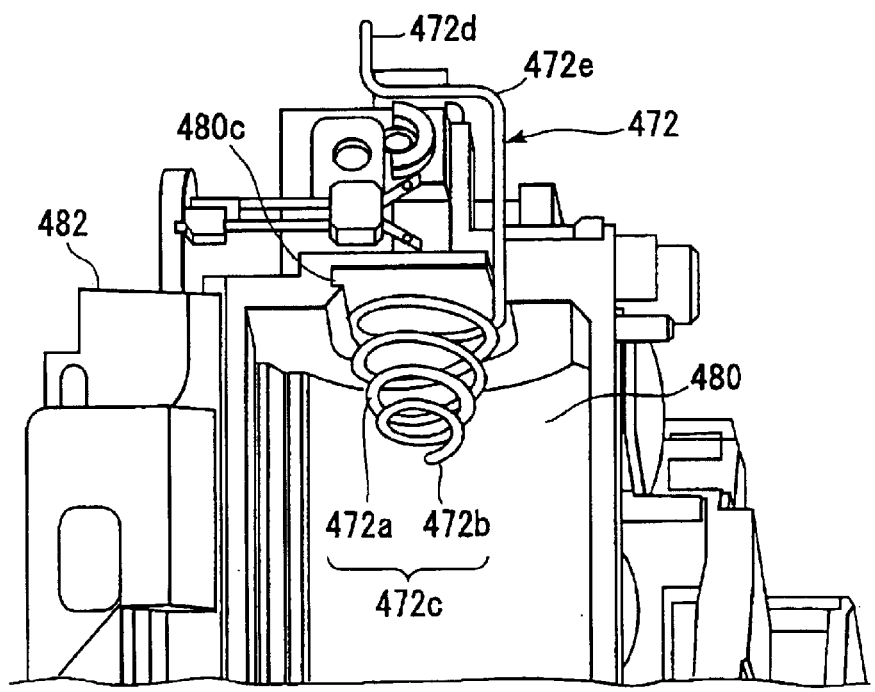
FIG. 65 is a perspective view showing an attached state of the contact piece for the anode of FIG. 64 into the battery containing chamber from the appearance.

For the other contact piece for the anode 472, as shown in FIGS. 64 and 65, a base end of the spring portion 472*a* of the battery connection end 472*c* is inserted into a hold groove 480*c* disposed on an upper-end side of the battery containing chamber 480. Then, for the contact piece for the anode 472, the position of the base end of the spring portion 472*a* is regulated by the hold groove 480*c* of the battery containing chamber 480, and the anode contact 472*b* is positioned opposite to the cathode contact 470*a* of the contact piece for the cathode 470 in the upper end of the battery containing chamber 480. Here, the external connection lead 472*d* of the contact piece for the anode 472 is disposed on the outer side of the battery containing chamber 480, and electrically connected on an anode side of the power supply portion (not shown).

Figure 66:
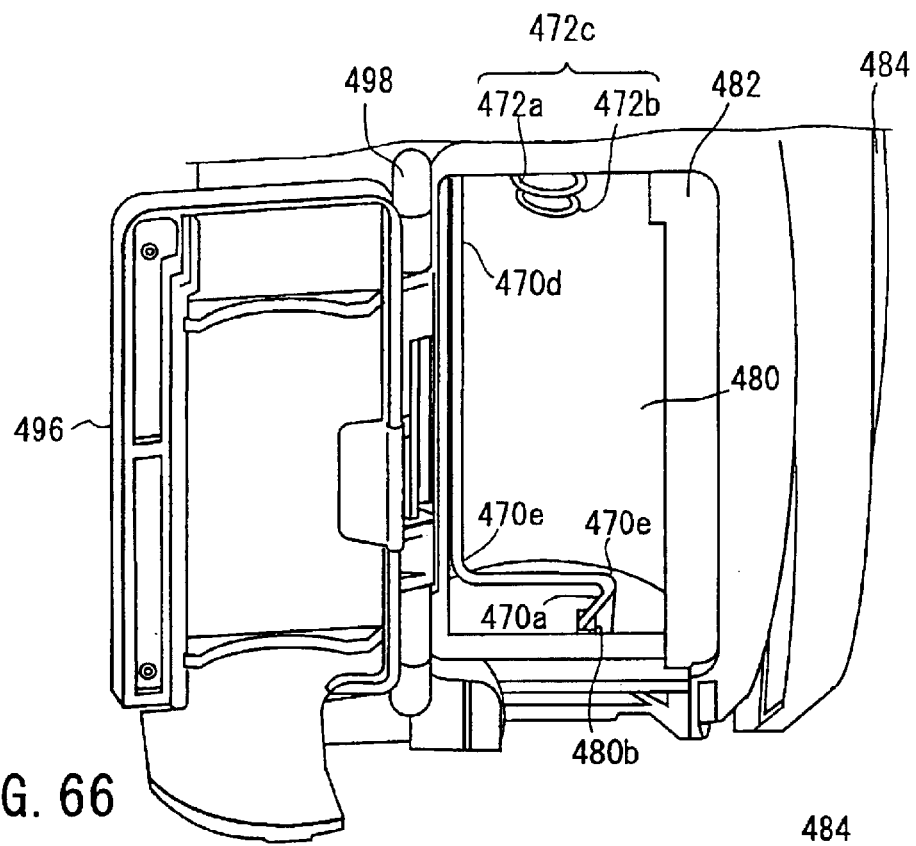
FIG. 66 is a perspective view showing the attached state of the contact pieces for the cathode and anode of FIG. 59 into the battery containing chamber as seen on an anode contact side.
Figure 67:
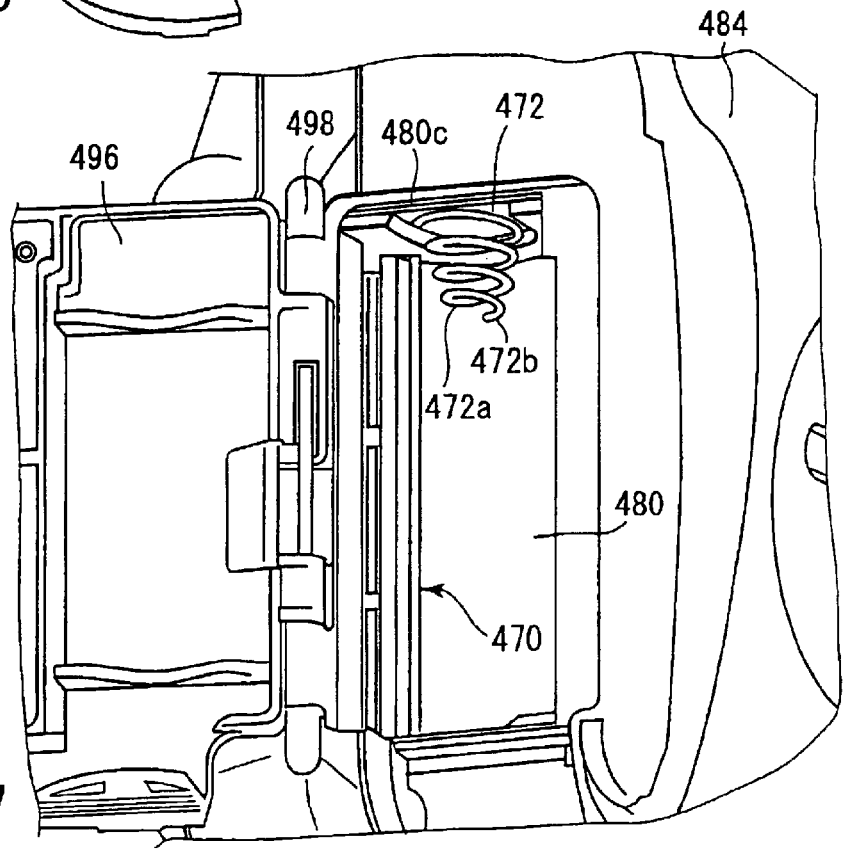
FIG. 67 is a perspective view showing the attached state of the contact pieces for the cathode and anode of FIG. 59 into the battery containing chamber as seen on a cathode contact side.

Here, as shown in FIGS. 66 and 67, the cathode contact 470*a* is disposed opposite to the anode contact 472*b* in the battery containing chamber 480. Moreover, when the cathode and anode of the battery (not shown) are inserted opposite to the cathode contact 470*a*, anode contact 472*b*, the spring portion 472*a* of the anode contact 472*b* is elastically deformed. In this state, the cathode contact 470*a*, anode contact 472*b* are brought in contact with and electrically connected to the cathode and anode of the battery, respectively. In this case, the anode contact 472*b* presses the anode of the battery (not shown) in a cathode direction by the spring portion 472*a* to realize secure mutual contact.

In this manner, for the battery contact piece, the contact piece for the cathode 470 for contacting the cathode of the battery and the contact piece for the anode 472 for contacting the anode of the battery are integrally formed so that the pieces can be separated via the portion to be cut 474. Moreover, these contact piece for the cathode 470 and contact piece for the anode 472 are separated from the portion to be cut 474 and attached/disposed into the battery containing chamber 480 in the constitution.

Accordingly, at the attaching time into the battery containing chamber 480, the contact piece for the cathode 470 is separated from the contact piece for the anode 472, and the respective pieces can be attached/disposed into the desired position of the battery containing chamber 480. This can reduce the number of components at the storage time. Additionally, component loss is prevented, and simple storage/management is possible.

Moreover, since the contact piece for the cathode 470 and contact piece for the anode 472 are formed by the line materials, simple and easy manufacturing is possible.

Figure 68:
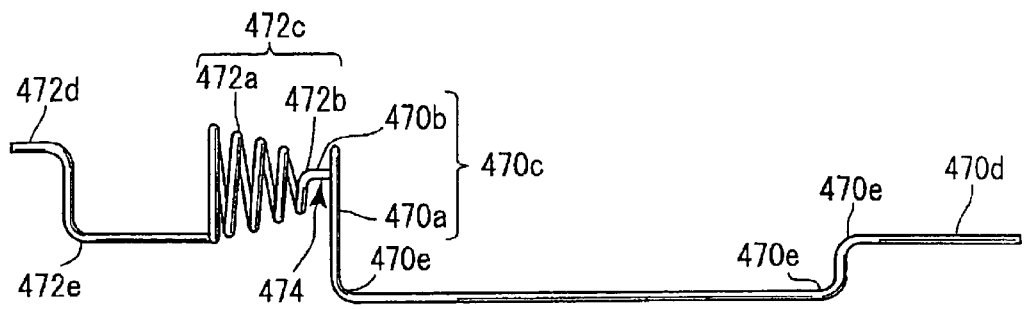
FIG. 68 is a diagram showing a battery contact piece according to a seventeenth embodiment of the present invention.
Figure 69:
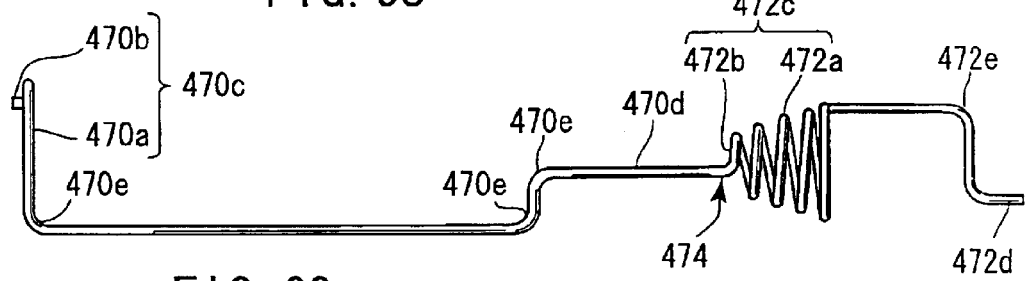
FIG. 69 is a diagram showing the battery contact piece according to an eighteenth embodiment of the present invention.

It is to be noted that in the sixteenth embodiment, the constitution has been described in which the external connection lead 470*b* of the contact piece for the cathode 470 is connected to the external connection lead 472*d* of the contact piece for the anode 472 via the portion to be cut 474 and integrally formed. However, the present invention is not limited to this arrangement structure. Additionally, a constitution shown in FIGS. 68 and 69 is also possible, and the similar effect is anticipated. Moreover, in FIGS. 68 and 69, the same part as that of FIG. 59 is denoted with the same reference numerals, and the detailed description is omitted.

FIG. 68 is a diagram showing the battery contact piece according to a seventeenth embodiment of the present invention.

In FIG. 68, the protrusion for positioning 470*b* of the contact piece for the cathode 470 is integrally formed with the anode contact 472*b* of the contact piece for the anode 472 so as to be separable via the portion to be cut 474. Accordingly, the contact piece for the cathode 470 and contact piece for the anode 472 are similarly connected to each other via the portion to be cut 474, and stored/maintained. At the attaching time into the battery containing chamber 480, the pieces are cut and separated from the portion to be cut 474, and similarly attached.

FIG. 69 is a diagram showing the battery contact piece according to an eighteenth embodiment of the present invention.

In the eighteenth embodiment, the external connection lead 470*b* of the contact piece for the cathode 470 is integrally formed with the anode contact 472*b* of the contact piece for the anode 472 to be separable via the portion to be cut 474. Accordingly, the contact piece for the cathode 470 and contact piece for the anode 472 are similarly connected to each other via the portion to be cut 474, and stored/maintained. At the attaching time into the battery containing chamber 480, the pieces are cut and separated from the portion to be cut 474, and similarly attached.

It is to be noted that a portion for disconnectably connecting the contact piece for the cathode 470 to contact piece for the anode 472 is not limited to that of each embodiment, and another combination/arrangement can also be constituted.

Figure 70:
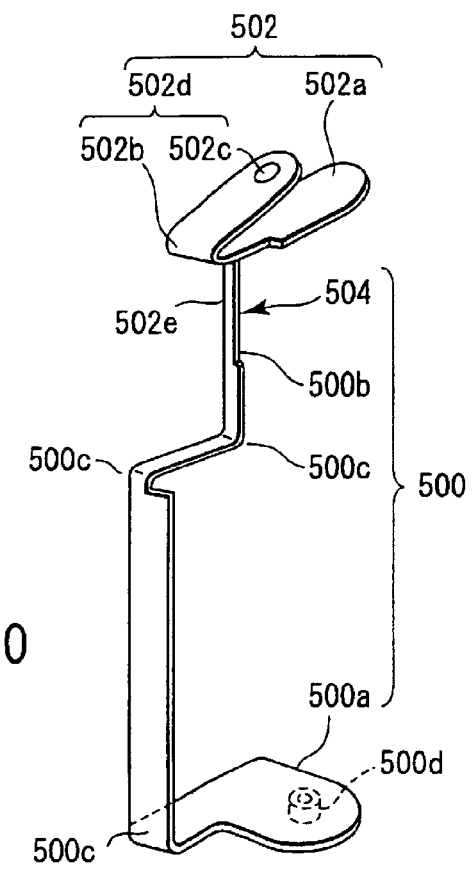
FIG. 70 is a perspective view showing the battery contact piece according to a nineteenth embodiment of the present invention.
Figure 71A:
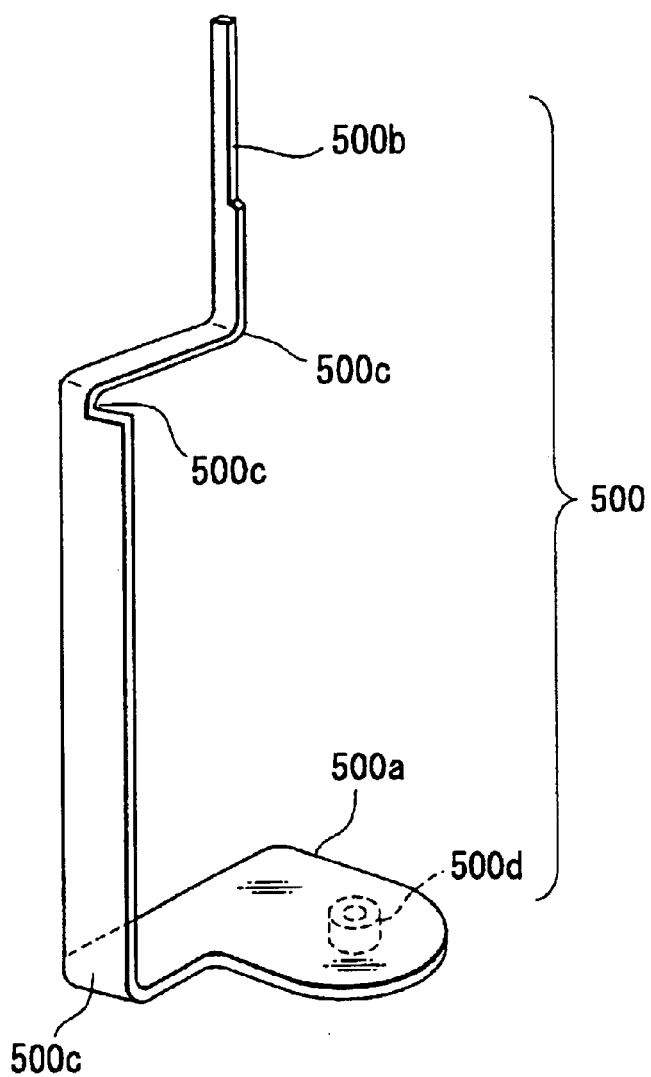
FIGS. 71A and 71B are perspective views showing cut states of the contact piece for the cathode and the contact piece for the anode from a portion to be cut.
Figure 71B:
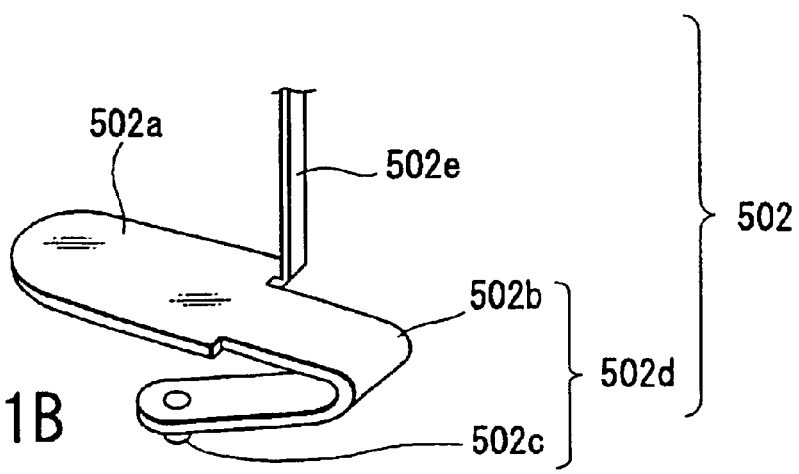

Moreover, in the above-described sixteenth to eighteenth embodiments, the constitution using the line materials has been described, but the present invention is not limited to this. Additionally, as shown in FIGS. 70, 71A, and 71B, a plate material can also be used to achieve the constitution. In the description of FIGS. 70, 71A, and 71B, for the sake of convenience of description, the attaching/disposing into the battery containing chamber 480 shown in FIGS. 60 to 67 will be described.

A nineteenth embodiment of the present invention will be described with reference to FIGS. 70, 71A, and 71B.

In FIG. 70, a contact piece for a cathode 500 is formed in one end of the plate material. A contact piece for an anode 502 is formed in the other end. The contact piece for the cathode 500 and the contact piece for the anode 502 are integrally formed to be separable via a portion to be cut 504. For the contact piece for the cathode 500, a battery connection end 500a constituting a cathode contact and an outer connection lead 500b are disposed via bent portions 500c. A protrusion for positioning 500b is disposed in the battery connection end 500a.

In the other contact piece for the anode 502, a fit portion 502a is disposed to be fitted into the hold groove 480c of the battery containing chamber 480. With respect to the fit portion 502a, a battery connection end 502d including a projecting anode contact 502c is disposed so as to be elastically deformable via an elastic portion 502b which is a spring portion. Furthermore, an outer connection lead 502e is integrally formed from the fit portion 502a. Moreover, these contact piece for the cathode 500 and the contact piece for the anode 502 are integrally formed so that the outer connection leads 500b, 502e are connected to each other so as to be cuttable via the portion to be cut 504.

By the constitution, the contact piece for the cathode 500 and the contact piece for the anode 502 are managed in the integrally connected state via the portion to be cut 504 at the storage time (see FIG. 70). Moreover, in the attaching into the battery containing chamber 480, the contact piece for the cathode 500 and the contact piece for the anode 502 are cut from the portion to be cut 504 and separated (see FIGS. 71A, 71B).

For the contact piece for the cathode 500, the outer connection lead 500b is inserted into the insertion hole 480a disposed in the battery containing chamber 480 from the inner side of the battery containing chamber 480 of the camera main body 482. Moreover, the outer connection lead 500b is extended to the outside of the battery containing chamber 480. On the other hand, the battery connection end 500a is disposed in the lower end of the battery containing chamber 480. At this time, the protrusion for positioning 500b of the battery connection end 500a is inserted into the engaging hole 480b of the battery containing chamber 480. Accordingly, for the contact piece for the cathode 500, the battery connection end 500a is positioned in the predetermined position in the battery containing chamber 480 and attached. Here, the outer connection lead 500b of the contact piece for the cathode 500 is disposed on the outer side of the battery containing chamber 480, and electrically connected to the power supply portion (not shown) on the cathode side.

For the other contact piece for the anode 502, the fit portion 502a is inserted into the hold groove 480c disposed in the upper end of the battery containing chamber 480. Then, for the contact piece for the anode 502, the position of the fit portion 502a is regulated by the hold groove 480c of the battery containing chamber 480. Moreover, the anode contact 502c is positioned opposite to the battery connection end 500a of the contact piece for the cathode 500 in the battery containing chamber 480 in an elastically deformable state via the elastic portion 502b. Here, the outer connection lead 502e of the contact piece for the anode 502 is disposed on the outer side of the battery containing chamber 480, and is electrically connected to the power supply portion (not shown) on the anode side.

Here, for the battery connection end 500a and the anode contact 502a, when the cathode and anode of the battery (not shown) are inserted into the battery containing chamber 480 opposite to the battery connection end 500a and anode contact 502a, the elastic portion 502b of the anode contact 502 is elastically deformed. In this state, the cathode and anode of the battery are brought into contact and electrically connected. At this time, for the anode contact 502, the elastic portion 502b presses the anode of the battery (not shown) in the cathode direction to perform the secure mutual contact.

It is to be noted that also in the embodiment shown in FIGS. 70, 71A, and 71B, the arrangement structure of the respective components constituting the contact piece for the cathode 500 and contact piece for the anode 502 is not limited to the arrangement structure described in the above-described embodiment, and other various arrangement structures can be constituted.

Moreover, in the above-described sixteenth to nineteenth embodiments, the application of the electronic apparatus to the camera has been described, but the present invention is not limited to this, and can also be applied to the other electronic apparatuses, and the similar effect is anticipated.

Furthermore, based on the sixteenth to nineteenth embodiments, the following results.

(8) There can be provided the battery contact piece in which the first contact piece including the connection end for the cathode and the outer connection lead is integrally formed with the second contact piece including the connection end for the anode and the outer connection lead so that the pieces can separably be disposed.

(9) There can be provided the battery contact piece, wherein the connection end for the anode of the second contact piece described in the above (8) includes the spring portion.

The following embodiments have been disclosed in Japanese patent application No. 2002-226397 filed on Aug. 2, 2002, in Japan, the entire contents of which are hereby incorporated by reference.

Next, a 20th embodiment of the present invention will be described.

Figure 72:
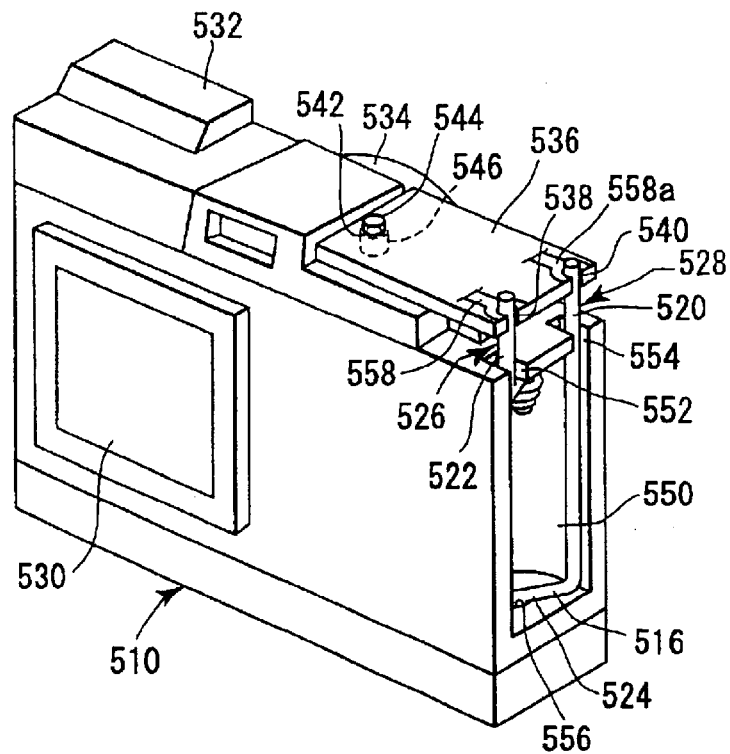
FIG. 72 is a perspective view from behind, showing the assembled state of the battery contact pieces into the camera housing not including the exterior member by an assembling method according to a 20th embodiment of the present invention.
Figure 73:
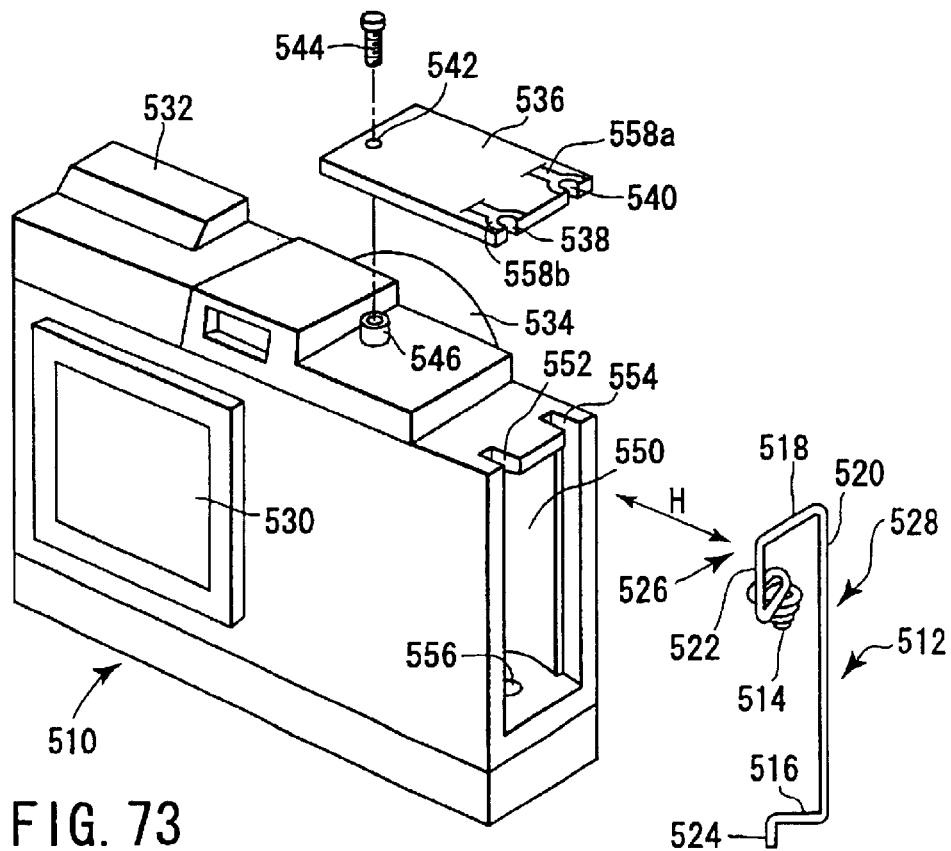
FIG. 73 is an exploded perspective view showing an attaching step of the battery contact piece into the camera housing.
Figure 74:
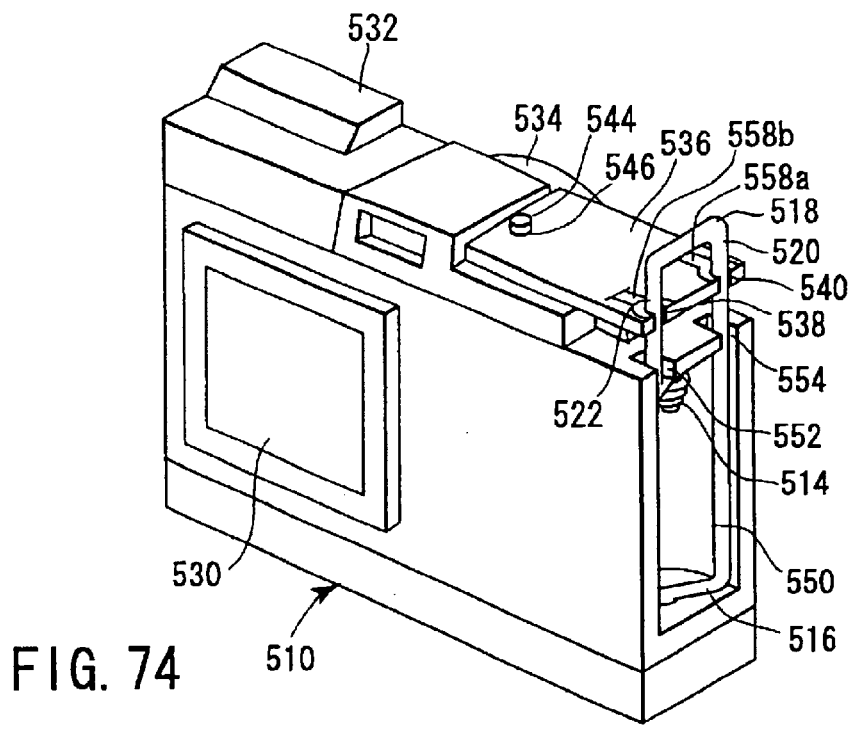
FIG. 74 is a perspective view showing the attached state of the battery contact piece of FIG. 73 into the camera housing.
Figure 75:
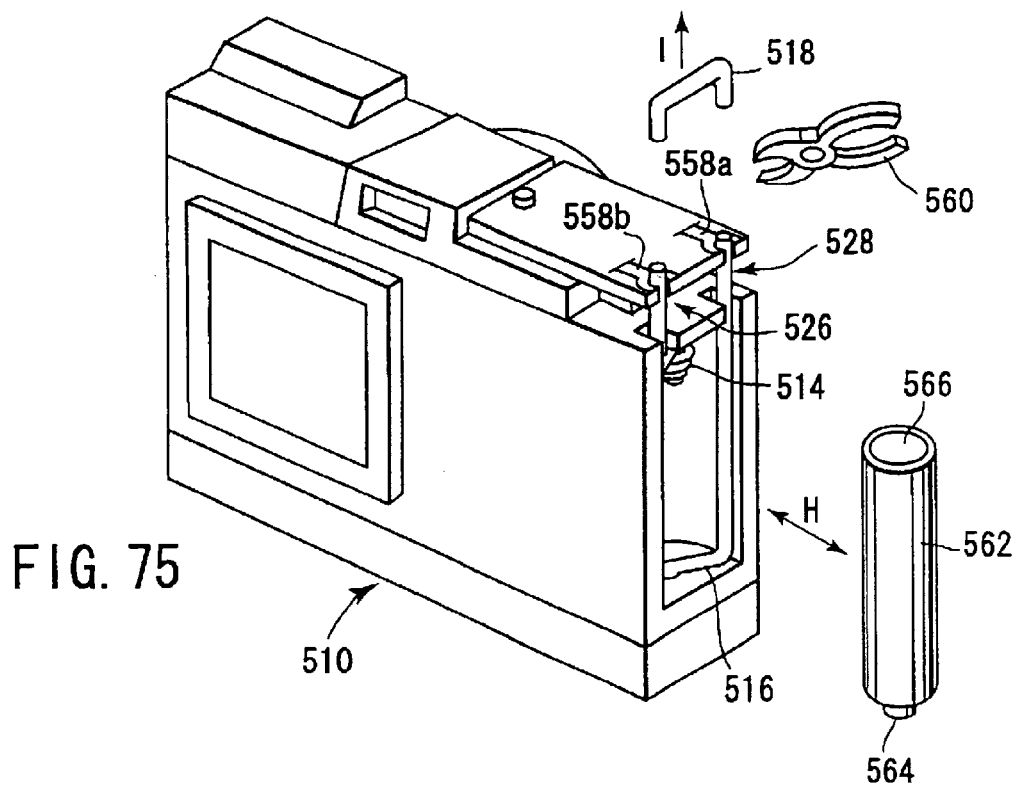
FIG. 75 is an exploded perspective view showing a step of cutting the battery contact piece attached into the camera housing.

FIG. 72 is a perspective view observed from behind, showing the attached and assembled state of the battery contact pieces into the camera housing excluding the exterior member as the electronic apparatus in the 20th embodiment. FIG. 73 is an exploded perspective view showing an attaching step of the battery contact piece of FIG. 72 into the camera housing, FIG. 74 is a perspective view showing the attached state of the battery contact piece of FIG. 73 into the camera housing, and FIG. 75 is an exploded perspective view showing a step of cutting the battery contact piece attached into the camera housing.

It is to be noted that the camera will be described as the example of the electronic apparatus to which the battery contact piece is attached by the assembling method of the present embodiment, but needless to say, the assembling method of the present invention is applied to any electronic apparatus, as long as the electronic apparatus includes the battery containing chamber.

First, the constitution of the battery contact piece for use in the assembling method of the 20th embodiment will be described with reference to FIG. 73.

A battery contact piece 512 is formed by bending one elastic line material as follows. That is, after bending the lower end in a crank shape and forming an engaging end in one end 524, a horizontally bent contact piece for the cathode 516 is formed. Thereafter, a contact piece for the cathode 528 slightly longer than the length of the battery in the axial direction is raised upwards and formed. Following the contact piece for the cathode 528, a contact piece connection portion 518 turned back in the U-shape is formed, and subsequently the upper end is formed in a convoluted spiral portion to constitute a contact piece for the anode 514. It is to be noted that a lead portion 522 and the contact piece for the anode 514 form a contact piece for the anode 526. Opposite end vertical portions of the contact piece connection portion 518 are used as lead portions 520, 522 to be connected to the electric substrate. That is, the contact piece for the cathode 528 is integrally formed with the contact piece for the anode 526.

Next, the camera will be described as the electronic apparatus into which-the battery contact piece 512 is attached.

FIG. 72 is a diagram of a camera housing 510 forming the camera main body seen from behind and obliquely from above. In the front surface of the housing 510, a lens body tube 534 including the photography optical system for picking up the image of the subject is disposed. On the left side in the upper surface, a flash light emitting portion 532 for irradiating the subject with the flash light is disposed. A boss shaft 546 (see FIG. 73) is disposed in an upper surface middle. It is to be noted that a screw hole is disposed in the boss shaft 546.

Moreover, an electric substrate 536 is attached to the upper surface on the right side. The electric substrate 536 is positioned, when the boss shaft 546 is inserted through a hole for positioning 542 formed in the electric substrate 536. Moreover, a screw 544 is inserted through the screw hole to mesh with the hole of the boss shaft 546 and is fixed.

The electric components such as the DC/DC converter are mounted on the electric substrate 536. In the edge of the electric substrate 536 on the right side, the following portions are disposed forwards/backwards along a thickness direction of the camera housing 510. That is, there are disposed: a cutout 538 and solder land 558b which form an electric bond portion of the contact piece for the anode 526 of the battery contact piece 512; and a cutout 540 and solder land 558a which form the electric bond portion of the contact piece for the cathode 528. Further on the rear surface of the camera housing 510 on the left side, an LCD display portion 530 is disposed to display the photography mode or the picked-up subject image.

Moreover, as shown in FIGS. 72 and 73, in the end of the camera housing 510 on the right side, a battery containing chamber 550 is disposed in which the power supply battery for supplying a driving power to the camera is contained to be attachable/detachable. In a ceiling wall of an opening of the battery containing chamber 550, cutouts 552 and 554 are formed forwards/backwards along the thickness direction of the camera housing 510. The cutout 552 passes the lead portion 522 of the contact piece for the anode 526 of the battery contact piece 512, and the cutout 554 passes the lead portion 520 of the contact piece for the cathode 528.

The cutouts 552 and 554 are disposed opposite to the cutouts 538, 540 of the substrate 536, when the electric substrate 536 is attached to the upper surface of the camera housing 510. Further in the undersurface of the battery containing chamber 550, a positioning hole 556 is disposed to fix the contact piece for the cathode 528 of the battery contact piece.

The battery contact piece 512 is attached to the camera housing 510 constituted in this manner as follows. That is, the positioning hole 556 in the lower surface of the battery containing chamber 550 is engaged with one end 524 of the contact piece for the cathode 528 of the battery contact piece 512. Moreover, the contact piece for the cathode 516 is disposed on the lower surface of the battery containing chamber 550, and the contact piece for the cathode 528 extended upwards is disposed along the inner wall in the vicinity of the camera front in the battery containing chamber 550. The lead portion 520 of the contact piece for the cathode 528 is inserted through the cutout 554, and further engaged with the cutout 540 of the electric substrate 536. Moreover, the lead portion 520 is soldered and electrically bonded via the solder land 558a of the electric substrate 536.

Moreover, as shown in FIG. 74, the contact piece connection portion 518 extended above the electric substrate 536 is engaged with the cutout 538 of the electric substrate 536 and subsequently inserted through the cutout 552. Furthermore, the spiral contact piece for the anode 514 is disposed in the ceiling wall surface of the battery containing chamber 550. Additionally, the lead portion 522 engaged with the cutout 538 of the electric substrate 536 is electrically bonded to the solder land 558b by the soldering.

Next, the assembling method of the contact piece for the anode 514 and contact piece for the cathode 516 in the contact piece for the cathode 528 and contact piece for the anode 526 attached to the camera housing 510 in this manner will be described.

Here, the contact piece for the cathode 528 and the contact piece for the anode 526 are supplied in the state of the battery contact piece 512 (see FIG. 73) including the lead portions 520, 522 connected to each other by the connection portion 518.

It is to be noted that examples of the line material constituting the battery contact piece 512 include SWC (rigid steel line) and core material. Moreover, the piece is constituted of the line material whose surface layer is plated with copper and which is referred to as the CP line, and the line materials are bent/formed/processed as described above to constitute the above-described portions.

An example of the assembling method of the contact pieces for the anode and cathode 514, 516 in the contact piece for the cathode 528 and contact piece for the anode 526 will be described hereinafter.

The method first comprises: passing the boss shaft 546 disposed in the upper-surface middle of the electric substrate 536 through the hole for positioning 542 disposed in the electric substrate 536; and allowing the screw 544 to mesh with the screw hole of the boss shaft 546 to attach/fix the substrate.

Next, the battery contact piece 512 is integrally incorporated in the battery containing chamber 550 as described above. Thereafter, the lead portions 520, 522 are, for example, soldered and electrically connected to the solder lands 558a, 558b, respectively (see FIG. 74). Moreover, as shown in FIG. 75, the connection portion 518 of the battery contact piece 512, that is, between the contact piece for the cathode 520 and the contact piece for the anode 526 is cut, for example, with pincers 560 or nipper.

Accordingly, the battery contact piece 512 is separated into the contact piece for the cathode 528 and the contact piece for the anode 526. When a battery 562 is loaded in the battery containing chamber 550, the contact piece for the cathode 516 which contacts a cathode 564 of the battery 562, and the contact piece for the anode 514 which contacts an anode 566 are formed. Moreover, a connection step of the contact pieces 514, 516 to predetermined places of the electric substrate 536 is also completed.

In this manner, according to the assembling method of the 20th embodiment of the present invention, since the battery contact piece 512 can be assembled with respect to the battery containing chamber 550 by a small number of steps, the assembling property into the battery containing chamber 550 can be enhanced.

Moreover, a modification example of the assembling method of the 20th embodiment is as follows.

(10) The method comprises: attaching the battery contact piece 512 to the camera housing 550; subsequently attaching and fixing the electric substrate 536 to the camera housing 550 to electrically connect the substrate to the lead portions 520, 522 of the battery contact piece 512; and thereafter cutting the connection portion 518 of the battery contact piece 512.

According to the above-described assembling method, the electric substrate 536 attached to the cameral housing 550 (electronic apparatus) before cutting the battery contact piece 512 or to be attached can electrically be connected to the battery contact piece 512 by the solder. Moreover, the battery contact piece 512 in the above-described assembling embodiment is cut after soldered with respect to the electric substrate 536.

However, conversely, the electric substrate 536 attached to the camera housing 550 (electronic apparatus) after cutting the battery contact piece 512 attached to the camera housing 550 (electronic apparatus), or to be attached may also electrically be connected to the battery contact piece 512 by the solder. According to the method, as compared with the former method, without giving an unnecessary stress to the soldered portion, reliability of electric conductivity of the electrically connected portion can be improved. Furthermore, another modification example of the assembling method of the 20th embodiment is as follows.

(11) The method comprises: cutting the connection portion 518 of the battery contact piece 512; forming the contact piece for the cathode 528 and contact piece for the anode 526, respectively; and subsequently attaching the pieces to the camera housing 550. Thereafter, the electric substrate 536 is attached/fixed to the camera housing 550 and electrically connected to the contact piece for the cathode 528 and contact piece for the anode 526.

(12) The method comprises: cutting the connection portion 518 of the battery contact piece 512; forming the contact piece for the cathode 528 and the contact piece for the anode 526, respectively; and subsequently attaching/fixing the electric substrate 536 to the camera housing 550. Furthermore, the contact piece for the cathode 528 and the contact piece for the anode 526 are attached to the camera housing 550, and thereafter electrically connected to the electric substrate 536.

Even by any of the above-described methods (10) to (12), the effect similar to that of the 20th embodiment can be obtained.

Figure 78:
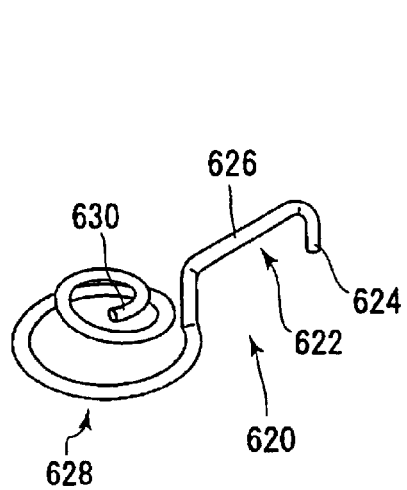
FIG. 78 is an enlarged perspective view showing the battery contact piece disposed on an undersurface side of the battery containing chamber.
Figure 76:
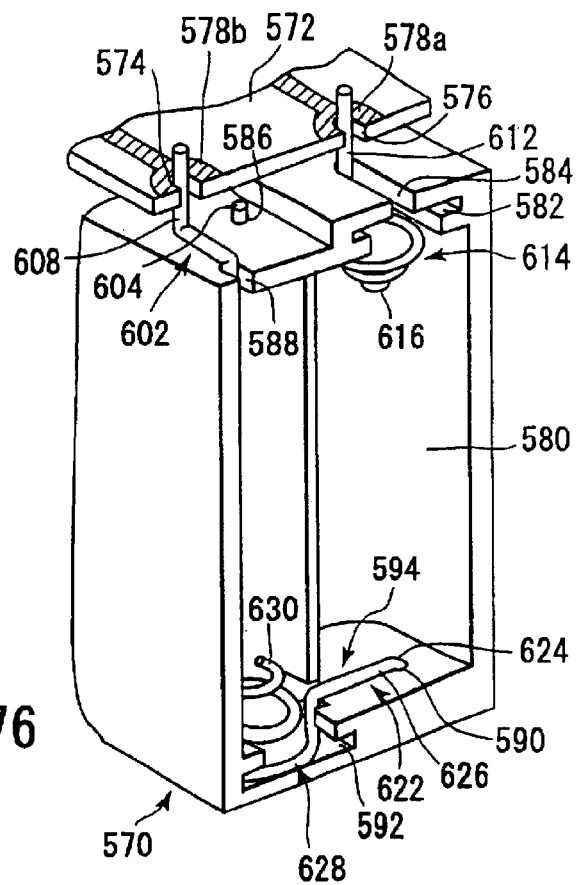
FIG. 76 is a partial enlarged perspective view from behind, showing the assembled state of the battery contact piece into the camera housing not including the exterior member by the assembling method according to a 21st embodiment of the present invention.
Figure 77:
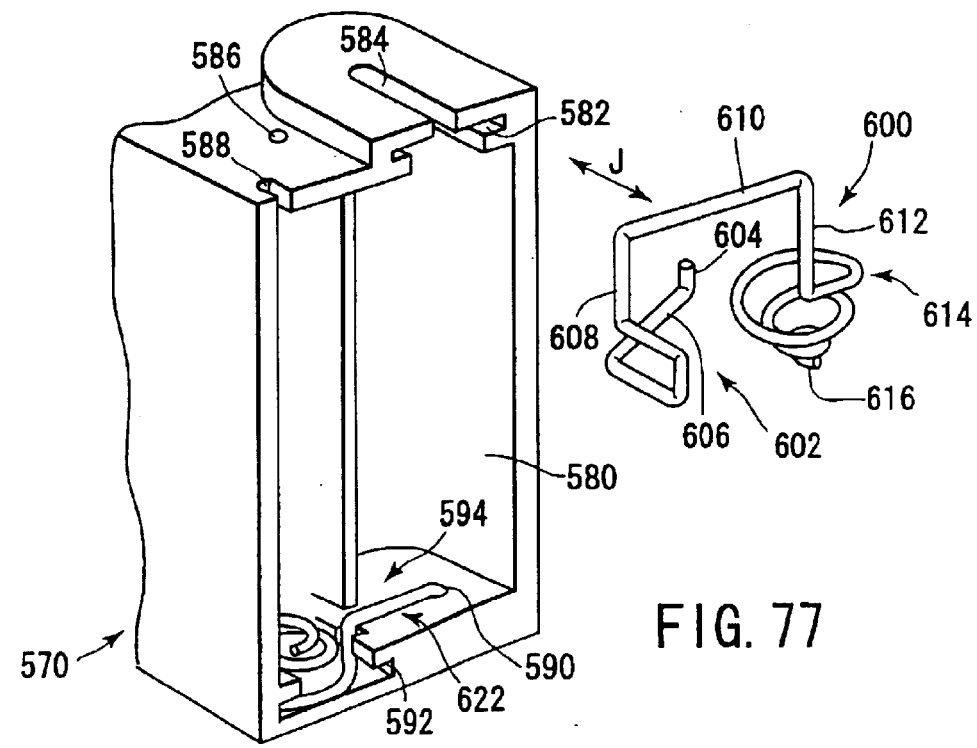
FIG. 77 is an enlarged exploded perspective view showing a step of attaching the battery contact piece into the camera housing.
Figure 79:
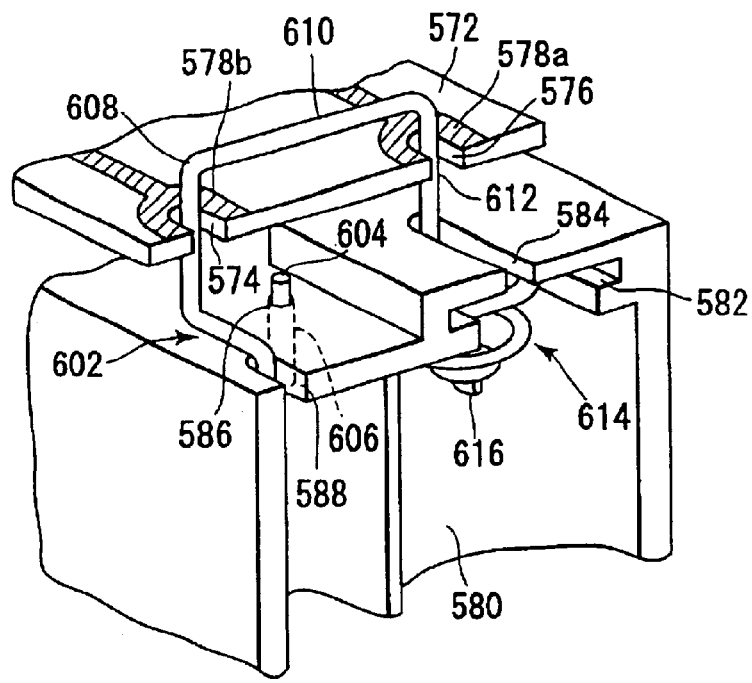
FIG. 79 is a partial enlarged perspective view showing the attached state of the battery contact piece into a ceiling wall of the battery containing chamber.
Figure 80:
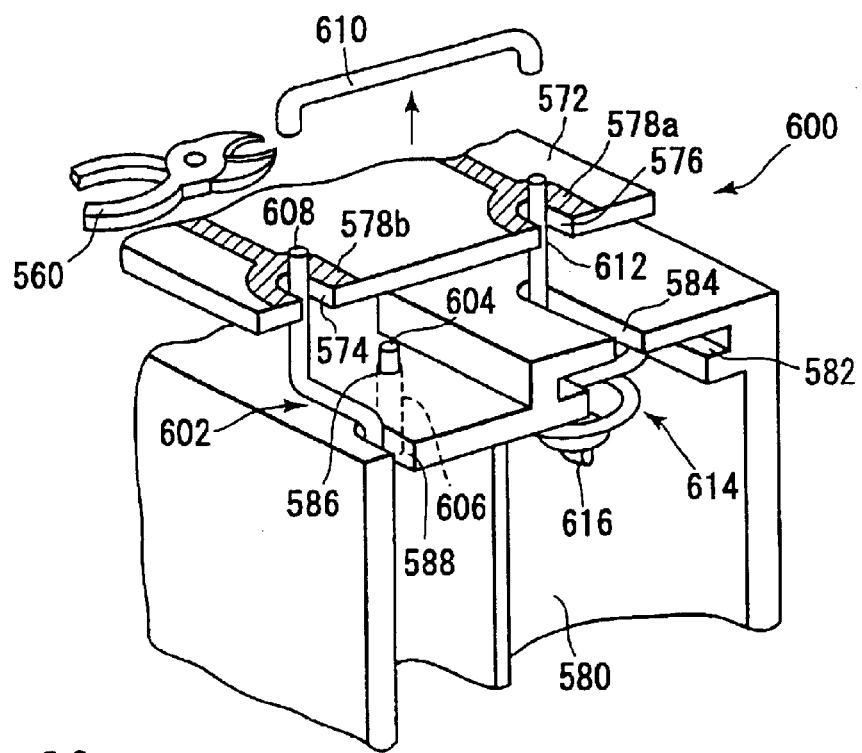
FIG. 80 is a partial enlarged perspective view showing the step of cutting the battery contact piece of FIG. 79.
Figure 81:
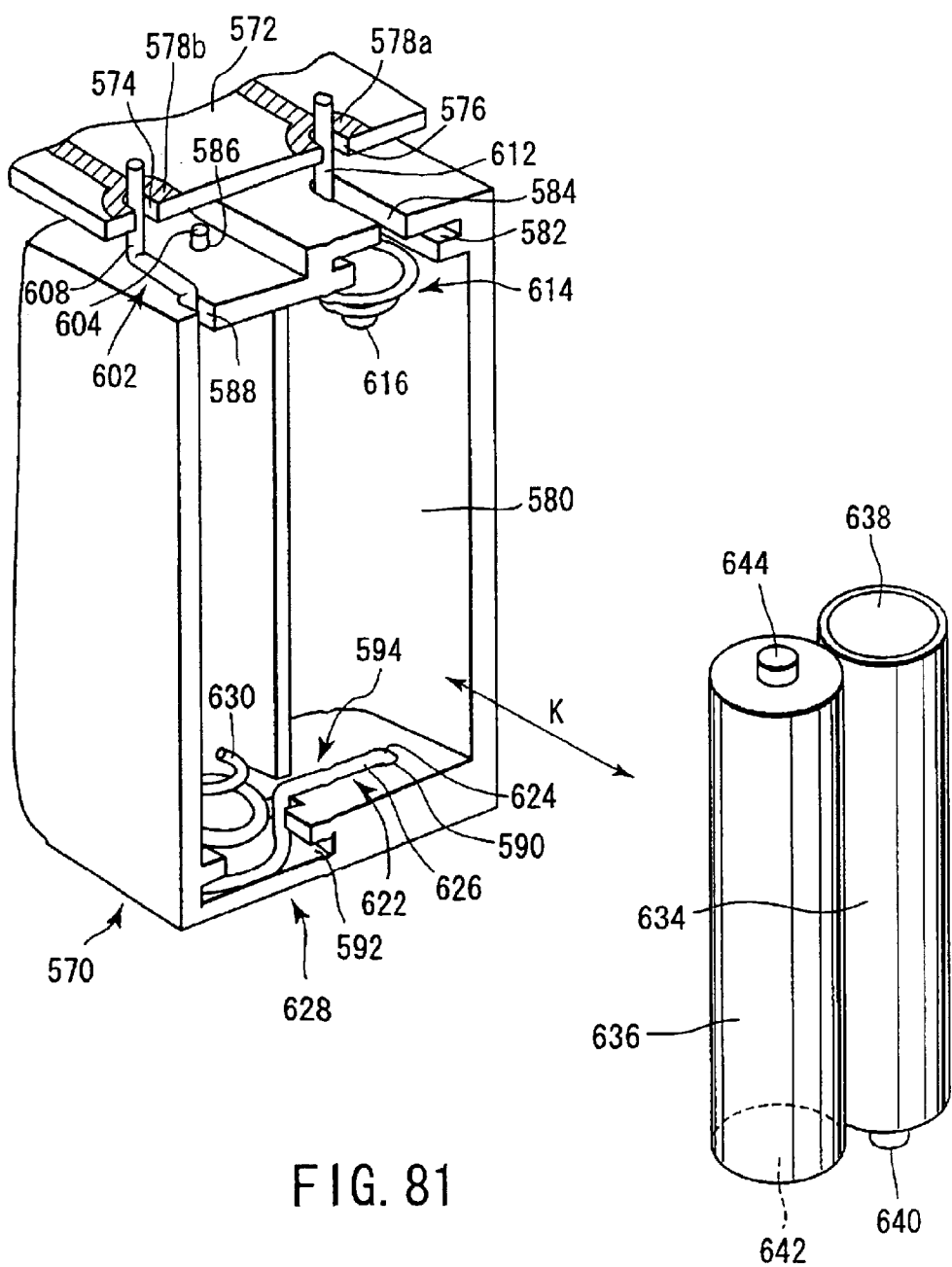
FIG. 81 is a partial enlarged perspective view showing an inserting state of two batteries into the battery containing chamber into which the battery contact piece is assembled.

FIG. 76 is a partial enlarged perspective view showing the attached and assembled state of the battery contact piece into the camera housing which is the electronic apparatus in a 21st embodiment of the present invention; FIG. 77 is a partial enlarged exploded perspective view showing a step of attaching the battery contact piece into the camera housing; FIG. 78 is a partial enlarged perspective view showing the battery contact piece disposed on an undersurface side of the battery containing chamber; FIG. 79 is a partial enlarged perspective view showing the attached state of the battery contact piece of FIG. 77 into the camera housing; FIG. 80 is a partial enlarged perspective view showing the step of cutting the battery contact piece attached into the camera housing of FIG. 77; and FIG. 81 is a partial enlarged exploded perspective view showing an inserting step of two batteries into the battery containing chamber of the camera housing in which the battery contact piece of FIG. 80 is assembled.

The assembling method of the battery contact piece of the 21st embodiment is substantially the same as that of the 20th embodiment shown in FIGS. 72 to 75, and is different only in that two battery contact pieces including the integrally formed cathode/anode are used to insert two batteries in series. Therefore, only the different respect will be described, the constituting members similar to those of the 20th embodiment are denoted with the same reference numerals, and the description thereof is omitted.

As shown in FIG. 76, an electric substrate 572 is fixed to the upper surface of a camera housing 570 on the right side by attaching means similar to that of the 20th embodiment. In the edge of the electric substrate 572 on the right side, a cutout 576 and a solder land 578a are disposed to form the electric bond portion of a contact piece for the anode 614 of the battery contact piece described later. Similarly, in parallel with the cutout 576, a cutout 574 and a solder land 578b are disposed to form the electric bond portion of a contact piece for the cathode 602. The solder lands 578a, 578b are formed to extend over the peripheries of the cutouts 576, 574.

Moreover, in the end of the camera housing 570 on the right side, a battery containing chamber 580 is disposed in which the power supply battery for supplying the driving power to the camera is contained to be attachable/detachable. In the ceiling wall of the opening of the battery containing chamber 580, as shown in FIG. 77, there are disposed: a fit groove 582 of the base portion of the convoluted spiral portion of the contact piece for the anode 614 of a battery contact piece 600; and a cutout. 584 for passing through a lead portion 612. Similarly, in the ceiling wall of the opening of the battery containing chamber 580, a cutout 588 is formed to fix a lead portion 608 of the contact piece for the cathode 602. Furthermore, in the ceiling wall of the battery containing chamber 580 on the back-portion side, a positioning hole 586 is disposed for fixing the contact piece for the cathode 602 of the battery contact piece 600.

The positioning hole 586 is engaged with an engaging portion 604 of the contact piece for the cathode 602 formed in one end of the battery contact piece 600. For the contact piece for the cathode 602, one end of the line material is first bent in an L-shape to form a contact piece for the cathode 606 including the engaging portion 604 and a horizontal portion. A portion bent upwards in a U-shape following the contact piece for the cathode 606 is fit into the positioning hole 586. Moreover, the lead portion 608 extended upwards engages with the cutout 574 (see FIG. 76) of the electric substrate 572, and is electrically bonded to the cutout via the solder land 578b by the solder.

On the other hand, the base portion of the contact piece for the anode 614 formed in the other end of the battery contact piece 600 is fitted into the fit groove 582. The other linear end of the contact piece for the anode 614 includes a spiral contact piece for the anode 616 which contacts the anode of the battery, and the lead portion 612 extended upwards from the contact piece 616. The lead portion 612 of the contact piece for the anode 614 engages with the cutout 584 of the camera housing 270. Furthermore, the portion engages with the cutout 576 of the electric substrate 572, and is electrically bonded to the substrate via the solder land 578a by the solder. Moreover, the lead portion 608 is connected to the lead portion 612 by a U-shaped connection portion 610.

It is to be noted that the contact piece for the cathode 602 and the contact piece for the anode 614 are supplied in the state of the integrally formed battery contact piece 600 (see FIG. 77).

In the bottom surface of the battery containing chamber 580, a fit groove 592 for fixing a contact piece for the anode 628 of a battery contact piece 622 described later is disposed on the back-portion side in the thickness direction of the camera housing 570. In the bottom surface of the battery containing chamber 580 on the front-portion side, a positioning hole 590 is disposed for fixing the contact piece for the cathode 622 of a battery contact piece 620.

The positioning hole 590 is engaged with an engaging portion 624 of the contact piece for the cathode 622 formed in one end of the battery contact piece 620 shown in FIG. 78. In the contact piece for the cathode 622, the engaging portion 624 formed by bending one end of the line material in the L-shape, and a contact piece for the cathode 626 including the horizontal portion are formed. Moreover, the contact piece for the cathode 626 is positioned along the undersurface of the battery containing chamber 580 to contact the cathode of the battery.

On the other hand, the base portion of the contact piece for the anode 628 formed in the other end of the battery contact piece 620 is fitted into the fit groove 592. The contact piece for the anode 628 is formed of a contact piece for the anode 630 in which the other end of the line material is formed in the spiral shape so as to contact the anode of the battery.

It is to be noted that the contact piece for the cathode 622 and the contact piece for the anode 628 are supplied in the state of the integrally formed battery contact piece 620 (see FIG. 78).

Moreover, the battery contact pieces 600 and 620 are formed, for example, of SWC (rigid steel line), and the core material is formed of the high-carbon steel for the spring. Moreover, the line material referred to as the CP line whose surface layer is plated with copper is constituted, and the line material is bent/processed to form the above-described portions.

One example of the assembling method will be described hereinafter with respect to the contact pieces for the anode and cathode 616, 606 in the contact piece for the cathode 602 and the contact piece for the anode 614 of the battery contact piece 600, and the contact pieces for the cathode and anode 624, 630 in the contact piece for the cathode 622 and the contact piece for the anode 628 of the battery contact piece 620.

First, the battery contact piece 620 is attached to the camera housing 570 as described above. By the attaching, a cut piece is formed in the undersurface of the battery containing chamber 580 as shown in FIG. 81. That is, there are formed: the contact piece for the cathode 622 including the contact piece for the cathode 626 which contacts a cathode 640 of one battery 634; and the contact piece for the anode 628 including the contact piece for the anode 630 which contacts an anode 642 of the other battery 636.

Next, the electric substrate 572 is attached/fixed to the camera housing 570 by means similar to that of the 20th embodiment.

Subsequently, the battery contact piece 600 is attached to the battery containing chamber 580 as described above. Thereafter, the lead portions 608, 612 are electrically connected to the solder lands 578 of the electric substrate 572, for example, by solder connection (see FIG. 79). Moreover, a-s shown in FIG. 80, the connection portion 610 of the battery contact piece 600 is cut, for example, with the pincers 560 or nipper.

Accordingly, in the ceiling surface of the battery containing chamber 580, as shown in FIG. 81, the contact piece for the anode 616 which contacts an anode 638 of one battery 634, and the contact piece for the cathode 606 which contacts a cathode 644 of the other battery 636 are formed, respectively. By this assembling, the connection of the contact pieces 616, 606 into the electric substrate 572 is also completed.

In this manner, according to the assembling method of the 21st embodiment, since the battery contact pieces 600 and 620 can be assembled with respect to the battery containing chamber 580 by a small number of steps, the assembling property into the battery containing chamber 580 can be enhanced.

Moreover, a modification example of the assembling method of the above-described 21st embodiment is as follows.

(13) The method comprises: attaching the battery contact piece 600 into the camera housing 570; subsequently attaching/fixing the electric substrate 572 into the camera housing 570 to electrically connect the substrate to the lead portions 608, 612 of the battery contact piece 600; and thereafter cutting the connection portion 610 of the battery contact piece 600.

According to the above-described assembling method, the electric substrate 572 attached to the cameral housing 570 (electronic apparatus) before cutting the battery contact piece 500 or to be attached can electrically be connected to the battery contact piece 600 by the solder. Moreover, the battery contact piece 600 in the above-described assembling embodiment is cut after soldered with respect to the electric substrate 572. However, the present invention is not limited to this. Conversely, the electric substrate 572 attached to the camera housing 570 (electronic apparatus) after cutting the battery contact piece 600 attached to the camera housing 570 (electronic apparatus), or to be attached may also electrically be connected to the battery contact piece 600 by the solder. According to the method, as compared with the former method, without giving the unnecessary stress to the soldered portion, the reliability of the electric conductivity of the electrically connected portion can be improved.

Furthermore, another modification example of the assembling method of the 21st embodiment is as follows.

(14) The method comprises: cutting the connection portion 610 of the battery contact piece 600; forming the contact piece for the cathode 602 and the contact piece for the-anode 614, respectively; and subsequently attaching the pieces to the camera housing 570. Thereafter, the electric substrate 572 is attached/fixed to the camera housing 570 and electrically connected to the contact piece for the cathode 602 and the contact piece for the anode 614.

(15) The method comprises: cutting the connection portion 610 of the battery contact piece 600; forming the contact piece for the cathode 602 and the contact piece for the anode 614, respectively; and subsequently attaching/fixing the electric substrate 572 to the camera housing 570. Furthermore, the contact piece for the cathode 602 and the contact piece for the anode 614 are attached to the camera housing 570, and thereafter electrically connected to the electric substrate 572.

Even by any method of these modification examples (13) to (15), the effect similar to that of the 20th embodiment can be obtained.

Moreover, in the 21st embodiment, since two batteries are inserted into the battery containing chamber, two battery contact pieces in which both the cathode and anode are integrated are used, but the present invention is not limited to this. Even with the increase of the number of batteries to three, four, five, the number of battery contact pieces is increased by the number of batteries to three, four, five, . . . . Then, needless to say, the similar effect is obtained.

The following embodiments have been disclosed in Japanese patent application No. 2002-231983 filed on Aug. 8, 2002, in Japan, the entire contents of which are hereby incorporated by reference.

Next, a 22nd embodiment of the present invention will be described.

Figure 82:
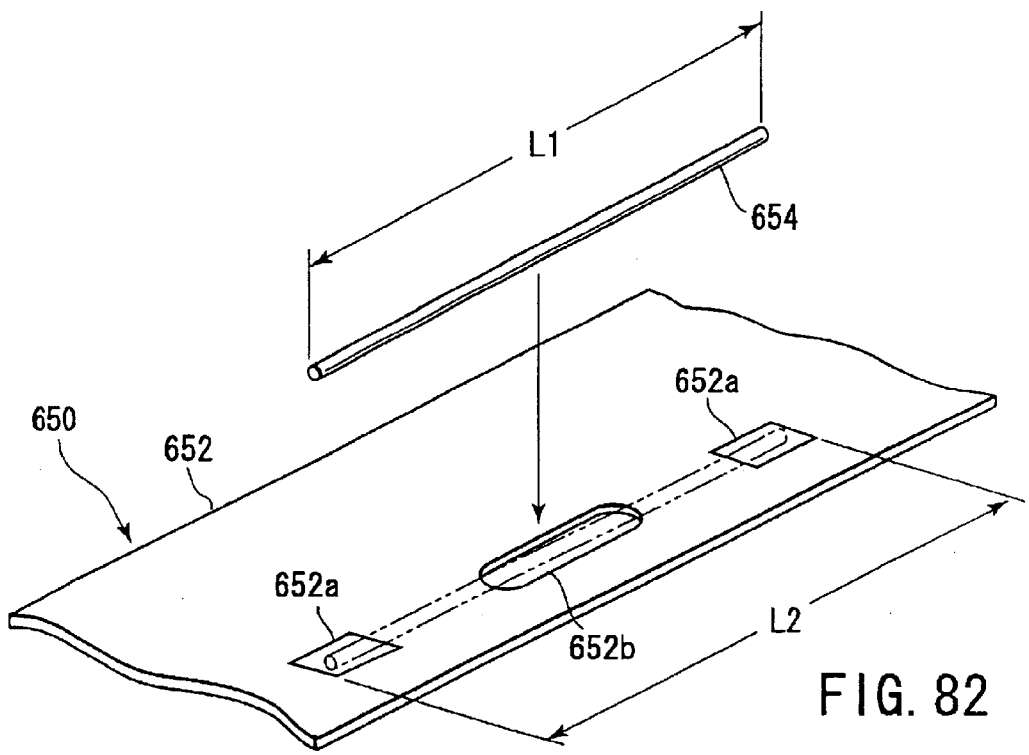
FIG. 82 is an exploded perspective view of an FPC substrate unit which can be built into an apparatus according to a 22nd embodiment of the present invention.
Figure 83:
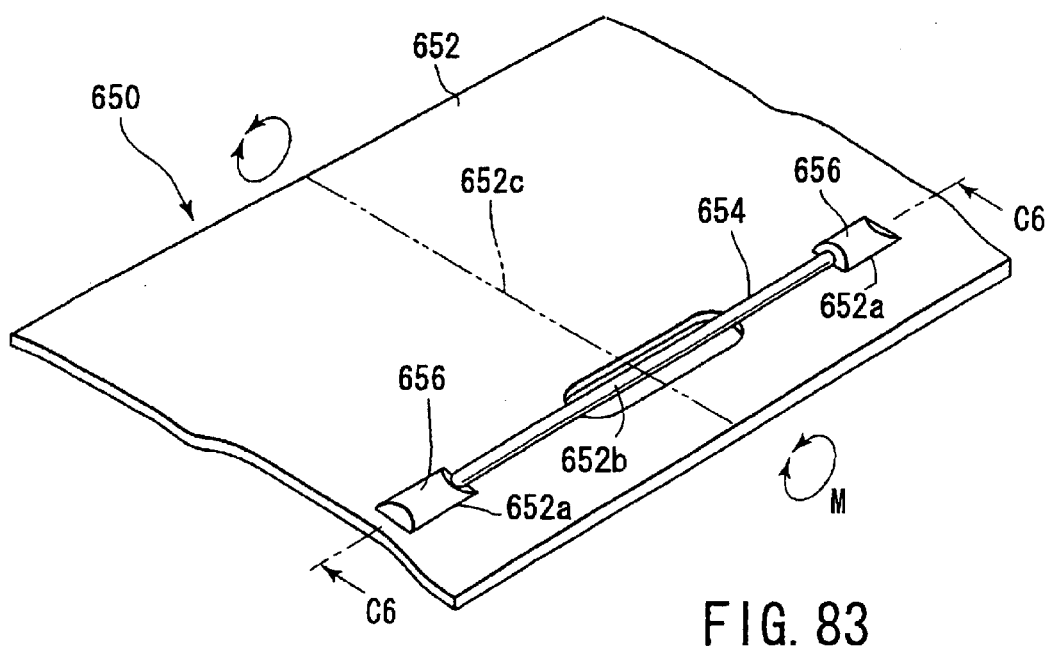
FIG. 83 is a perspective view of the FPC substrate unit before bent according to the 22nd embodiment shown in FIG. 82.
Figure 84:
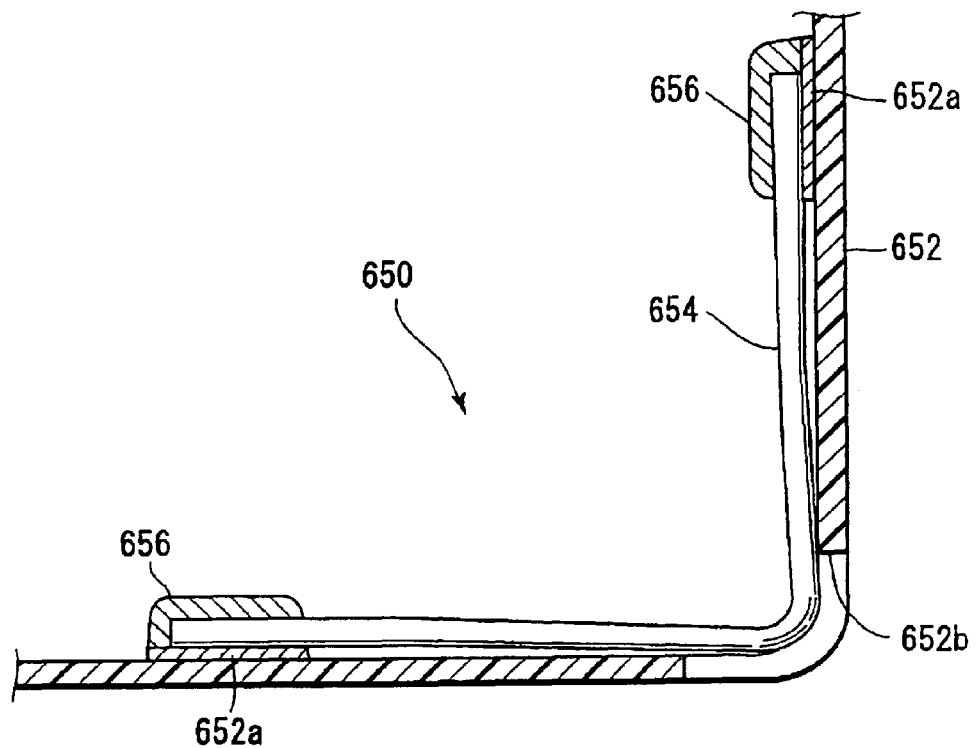
FIG. 84 is a sectional view along line C6—C6 of FIG. 83, showing the bent state of the FPC substrate unit according to the 22nd embodiment shown in FIG. 82.

FIG. 82 is an exploded perspective view of the FPC substrate which can be built into the apparatus according to the 22nd embodiment, FIG. 83 is a perspective view of the FPC substrate before bent, and FIG. 84 is a diagram showing the bent state of the FPC substrate in a section along line C6—C6 of FIG. 83.

As shown in the perspective view of FIG. 82, an FPC unit 650 of the present embodiment is constituted of: an FPC substrate 652; a tinned copper wire (hereinafter referred to as the tinned wire) 654; and an electric element member (not shown). The tinned wire 654 is an electric conductor which can plastically be deformed as the member mounted on the FPC substrate 652.

It is to be noted that the tinned wire 654 is a electric wire which has plasticity and which has slight rigidity but which can plastically be deformed by a certain degree of dynamic. The deformed shape is held after the plastic deformation. The tinned wire applied to another embodiment described later is a similar line material.

The FPC unit 650 is attached into a constituting unit contained in the apparatus in a bent state at right angles along a bend line 652c described later (see FIG. 83).

In the FPC unit 650, two land patterns (hereinafter referred to as the lands) 652a are disposed over a direction crossing at right angles to the bend line 652c. A distance $L_2$ between opposite outer sides of the lands 652a is set to be slightly longer than a length $L_1$ of the tinned wire 654. In the FPC substrate 652, a relief hole 652b is disposed as an elongated hole in the direction crossing at right angles to the bend line 652c in a portion where lines connecting the bend line 652c to the lands. 652a intersect with each other.

The opposite ends of the straight tinned wire 654 are soldered onto the lands 652a by solders 656. Moreover, the wire is mounted and fixed onto the FPC substrate 652 in a posture crossing at right angles to the bend line 652c on the relief hole 652b.

To attach the FPC unit 650 to which the tinned wire 654 is fixed into another constituting unit, after attached, the unit is bent at right angles along the bend line 652c shown in FIG. 83 in a shown arrow M direction. The sectional view shown in FIG. 84 shows the bent state. Since the tinned wire 654 is plastically deformed, the FPC substrate 652 is held in the shape bent at right angles.

Moreover, in the bent state of the FPC unit 650, a bent outer corner of the tinned wire 654 enters the relief hole 652b, and a stiff state of the FPC substrate 652 is avoided. It is to be noted that the tinned wire 654 does not have to necessarily have an electric connection function, but can also perform the electric connection function.

Here, the bent portion with or without the relief hole 652b in the FPC substrate 652 will be described.

Figure 85:
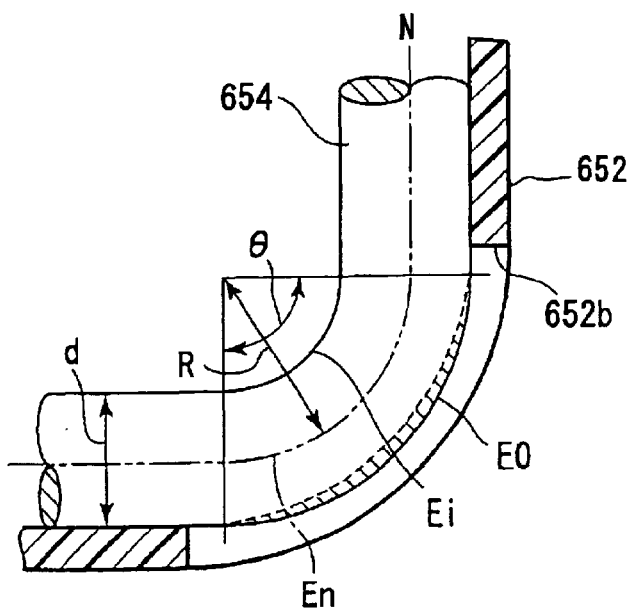
FIG. 85 is an enlarged sectional view of a bent portion of the FPC substrate in the FPC substrate unit according to the 22nd embodiment shown in FIG. 82.

FIG. 85 is an enlarged sectional view of the bent portion of the FPC substrate 652 including the relief hole. In the bent state, as shown in FIG. 85, the tinned wire 654 expands outside and contracts inside centering on a neutral line N. That is, assuming that a length on the neutral line N in a bend range of an angle θ in the bent range is En, an outer length is Eo, an inner length is Ei, and a bend radius on the neutral line N is R, the respective lengths are as follows:

$En=R\times\theta$ $Eo=(R+d/2)\times\theta$ $Ei=(R-d/2)\times\theta$

On the other hand, when the length of the FPC substrate 652 in the bent state in the bend range of the angle θ is substantially equal to the length Eo on the neutral line N, as a result an outside elongation d/2×θ of the tinned wire 654 indicates an entered state into the relief hole 652b of the FPC substrate 652. Therefore, the stiff state of the FPC substrate 652 is avoided. When the FPC substrate 652 is not stiff, an inner stress is not generated in the FPC substrate 652, and the bent state of the FPC unit 650 is steadily held.

Figure 86:
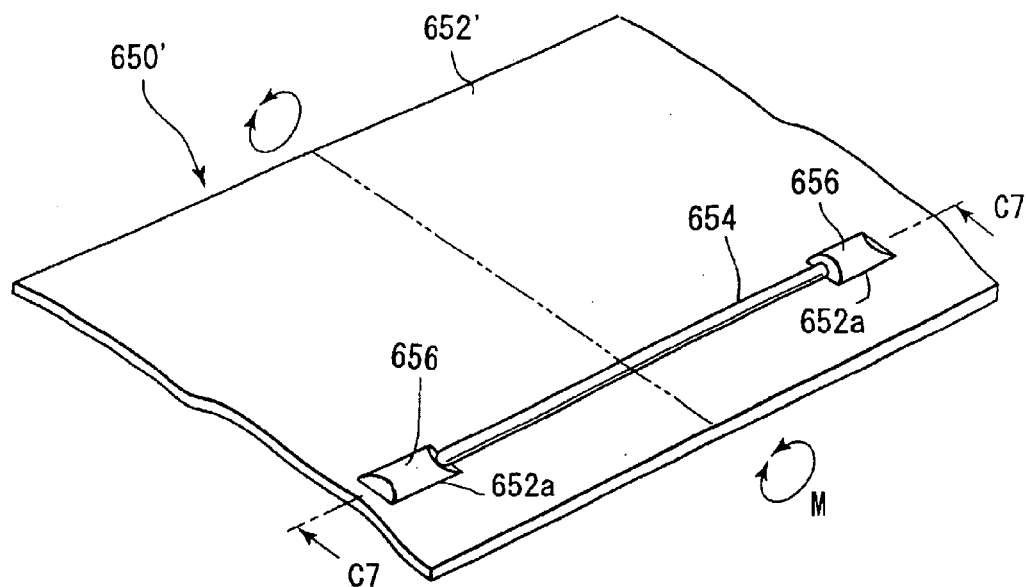
FIG. 86 is a perspective view of the FPC substrate unit which does not have a relief hole associated with the FPC substrate unit according to the 22nd embodiment shown in FIG. 82.

On the other hand, as shown in the perspective view of FIG. 86, an FPC unit 650' to which an FPC substrate 650' having no relief hole is applied is assumed. In this case, since the relief hole is not disposed, an FPC substrate 652' is compressed outside the bent portion of the tinned wire 654 as in the FPC unit 650' in the bent state of FIG. 87 shown in the section along line C7—C7 of FIG. 86.

Therefore, the FPC substrate 652' becomes still, a bent angle is returned, and the bent shape is not stable. In the stiff state of the FPC substrate 652', there is a possibility that the soldered portion peels because of a shear stress generated by a shear force. When the bend radius of the FPC substrate 652' is large at the bend time, the above-described stiff phenomenon is not caused. Therefore, it is not necessary to especially dispose the relief hole.

Figure 87:
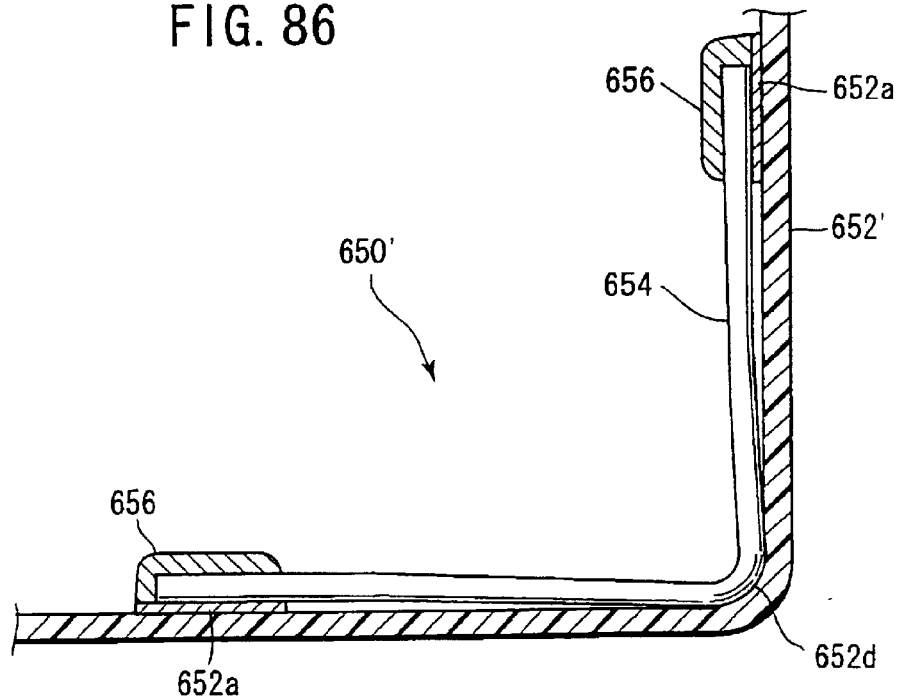
FIG. 87 is a sectional view along line C7—C7 of FIG. 86, showing the bent state of the FPC substrate unit shown in FIG. 86.

The bent state of FIGS. 84 and 87 described above indicates the bent FPC substrate 652 while the tinned wire 654 is held inside. However, it is also possible to employ the structure of the bent FPC substrate holding the tinned wire outside as an modification example of the bend direction. With the FPC substrate of the modification example, the compressed portion inside the bend of the tinned wire enters the relief hole of the FPC substrate, any slack is not generated on the FPC side, and the peel of the soldered portion is not easily generated in the sane manner.

Next, an FPC unit 670 will be described as a flexible electric wiring substrate device which can be built in the apparatus according to a 23rd embodiment of the present invention with reference to FIGS. 88 and 89.

Figure 88:
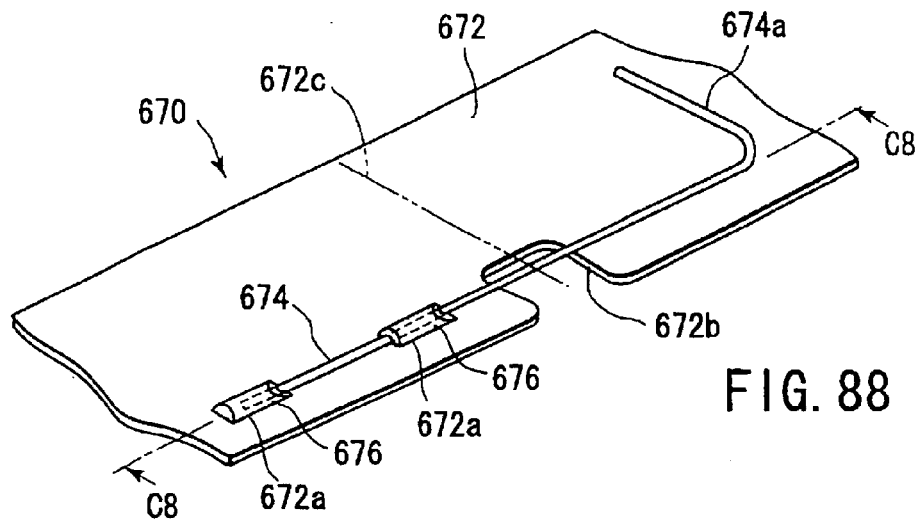
FIG. 88 is a perspective view of the FPC substrate unit before bent, which can be built in the apparatus according to a 23rd embodiment of the present invention.
Figures 89, 91:
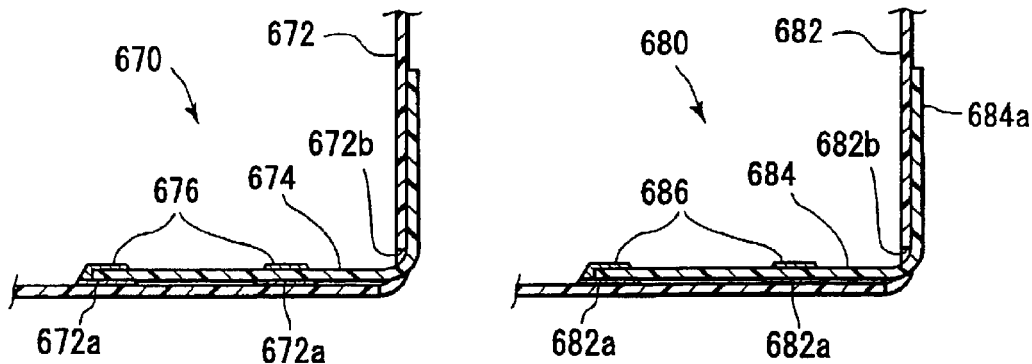
FIG. 89 is a sectional view of the FPC substrate unit in the bent state according to the 23rd embodiment shown in FIG. 88.
FIG. 91 is a sectional view of the FPC substrate unit in the bent state according to the 24th embodiment shown in FIG. 90.

FIG. 88 is a perspective view of the FPC substrate before bent, and FIG. 89 is a diagram showing the bent state of the FPC substrate in a section along line C8—C8 of FIG. 88.

As shown in the perspective view of FIG. 88, the FPC unit 670 is constituted of an FPC substrate 672, a tinned wire 674, and the electric element member (not shown). The tinned wire 674 is a plastically deformable electric conductor which has a tip-end bent portion 674a as a member mounted on the FPC substrate 672. The FPC unit 670 is also bent at right angles along a bend line 672c described later after attached to another constituting unit in the same manner as in the FPC unit 650.

In the FPC substrate 672, two lands 672a are disposed along a direction crossing at right angles to the bend line 672c in one surface divided by the bend line 672c. The FPC substrate 672 also includes a cutout 672b disposed in a portion with which the tinned wire 674 intersects on the bend line 672c.

The tinned wire 674 is soldered, mounted, and fixed on two lands 672a on a side opposite to the tip-end bent portion 674a by solders 676. Thereafter, the tip-end bent portion 674a of the tinned wire 674 is moved toward the back-surface side of the FPC substrate 672 from the cutout 672b.

The FPC unit 670 to which the tinned wire 674 is fixed is attached to another constituting unit, subsequently plastically deformed while the tip-end bent portion 674a of the tinned wire 674 is disposed outside, and the FPC substrate 672 is bent at right angles along the bend line 672c. FIG. 89 is a sectional view along line C8—C8 of FIG. 88, and shows the bent state. Since the back surface of the FPC substrate 672 is pressed by the tip-end bent portion 674a of the tinned wire 674, the FPC substrate 672 is held in the bent shape.

Since the tinned wire 674 has a free state on the tip-end bent portion 674a side in the FPC unit 670, the FPC substrate 672 does not stiffen or loosen and the stable bent shape is held.

Next, an FPC unit 680 will be described as a flexible wiring substrate which can be built in the apparatus according to a 24th embodiment of the present invention with reference to FIGS. 90 and 91.

Figure 90:
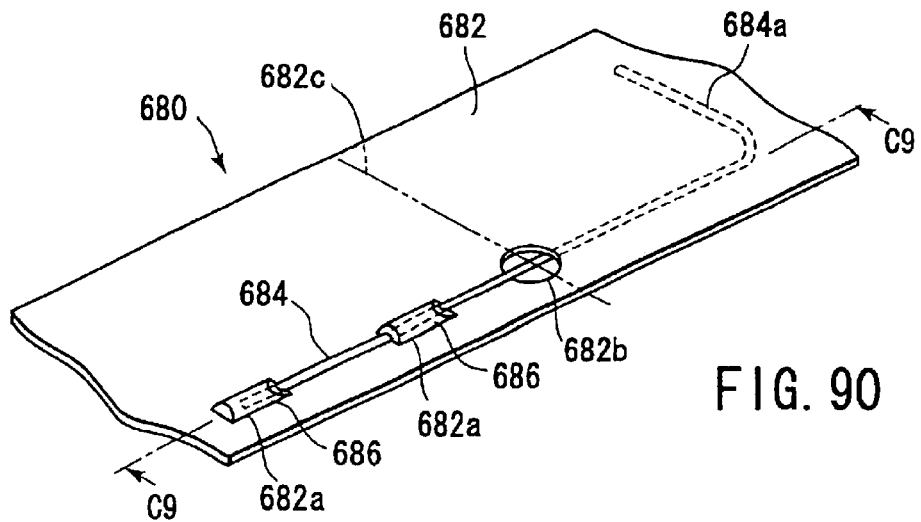
FIG. 90 is a perspective view of the FPC substrate unit before bent, which can be built in the apparatus according to a 24th embodiment of the present invention.

FIG. 90 is a perspective view of the FPC unit before bent, and FIG. 91 is diagram showing the bent state of the FPC unit in a section along line C9—C9 of FIG. 90.

As shown in the perspective view of FIG. 90, the FPC unit 680 comprises an FPC substrate 682, and a tinned wire 684 which is a plastically deformable electric conductor including a tip-end bent portion 684a. In the same manner as the FPC unit 650, the FPC unit 680 is also attached to another constituting unit, and thereafter bent at right angles along a bend line. 682c described later.

In the FPC substrate 682, two lands 682a are disposed along the direction crossing at right angles to the bend line 682c in one surface divided by the bend line 682c. The FPC substrate 682 also includes an insertion through hole portion 682b disposed in the portion with which the tinned wire 684 intersects on the bend line 682c.

When the tinned wire 684 is fixed onto the FPC substrate 682, the wire is held in the inserted state on the tip-end bent portion 682a side through the insertion through hole portion 682b on the back-surface side. Subsequently, in the held state, the wire is soldered on two lands 682a on the side opposite to the tip-end bent portion 684a of the tinned wire 684 by solders 686, and mounted and fixed in the posture crossing at right angles to the bend line 682c.

To attach the FPC unit 680 to which the tinned wire 684 is fixed to another constituting unit, while the tip-end bent portion 684a of the tinned wire 684 is disposed outside, the unit is plastically deformed, and the FPC substrate 682 is bent at right angles along the bend line 682c.

FIG. 91 is a sectional view along line C9—C9 of FIG. 90, and shows the bent state. A state is shown in which the tip-end bent portion 684a of the tinned wire 684 presses the back surface of the FPC substrate 682. Moreover, the FPC substrate 682 is held in the shape bent at right angles. Since the tinned wire 684 has the free state on the tip-end bent portion 684a side in bent state, the FPC substrate 682 is not brought into the stiff state or loosened state.

Next, a camera 690 will be described which is an apparatus including the built-in FPC according to a 25th embodiment of the present invention with reference to FIGS. 92 to 95.

Figure 92:
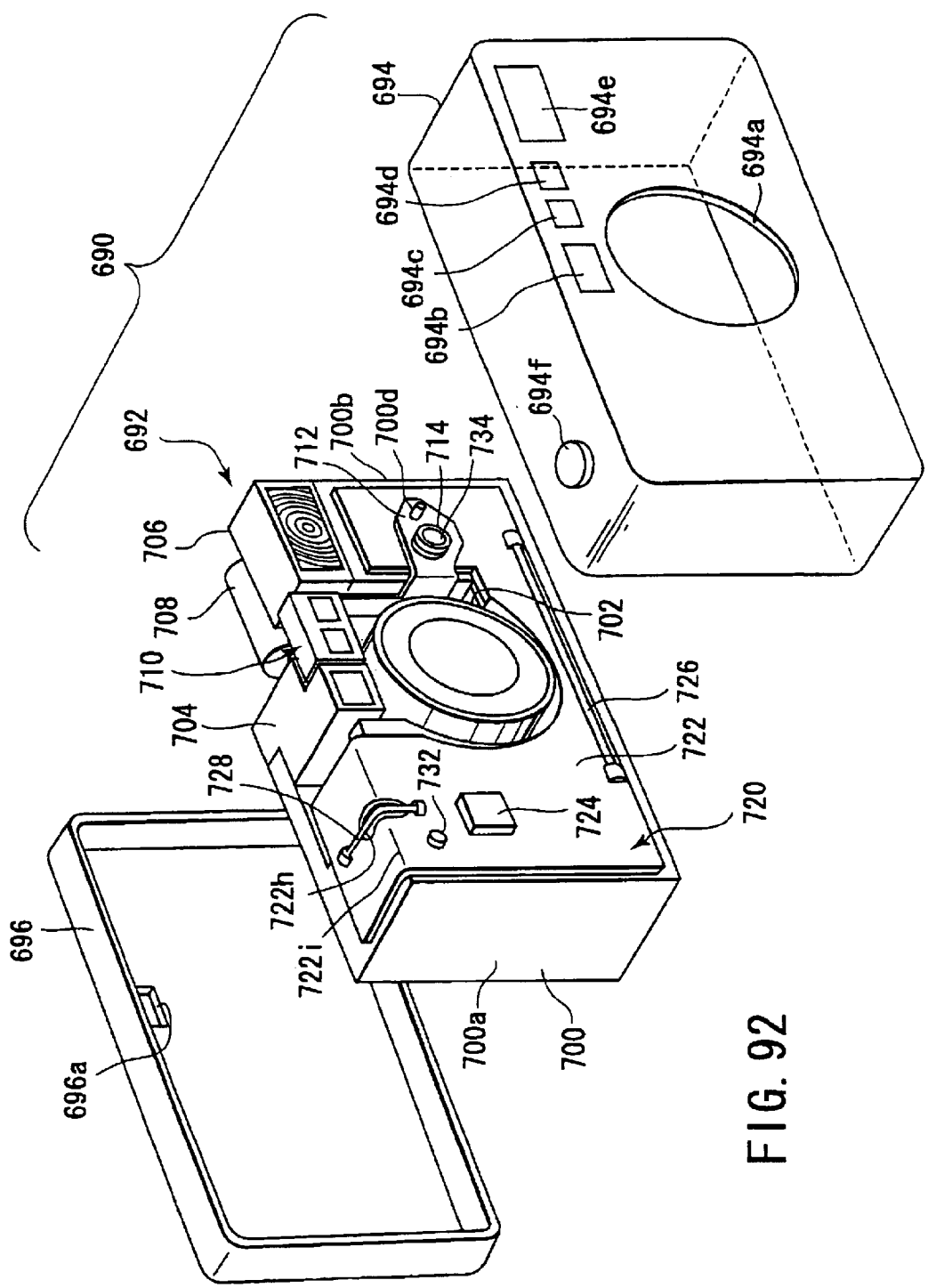
FIG. 92 is an exploded perspective view of the camera as the apparatus in which the FPC substrate is built according to a 25th embodiment of the present invention.
Figure 93:
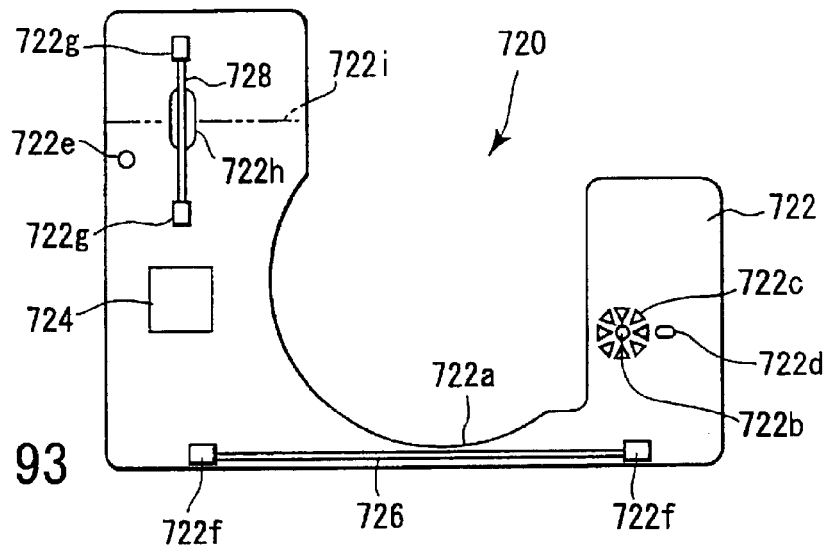
FIG. 93 is a front view of the FPC substrate unit for a control circuit which is built in the camera according to the 25th embodiment of FIG. 92.
Figure 94:
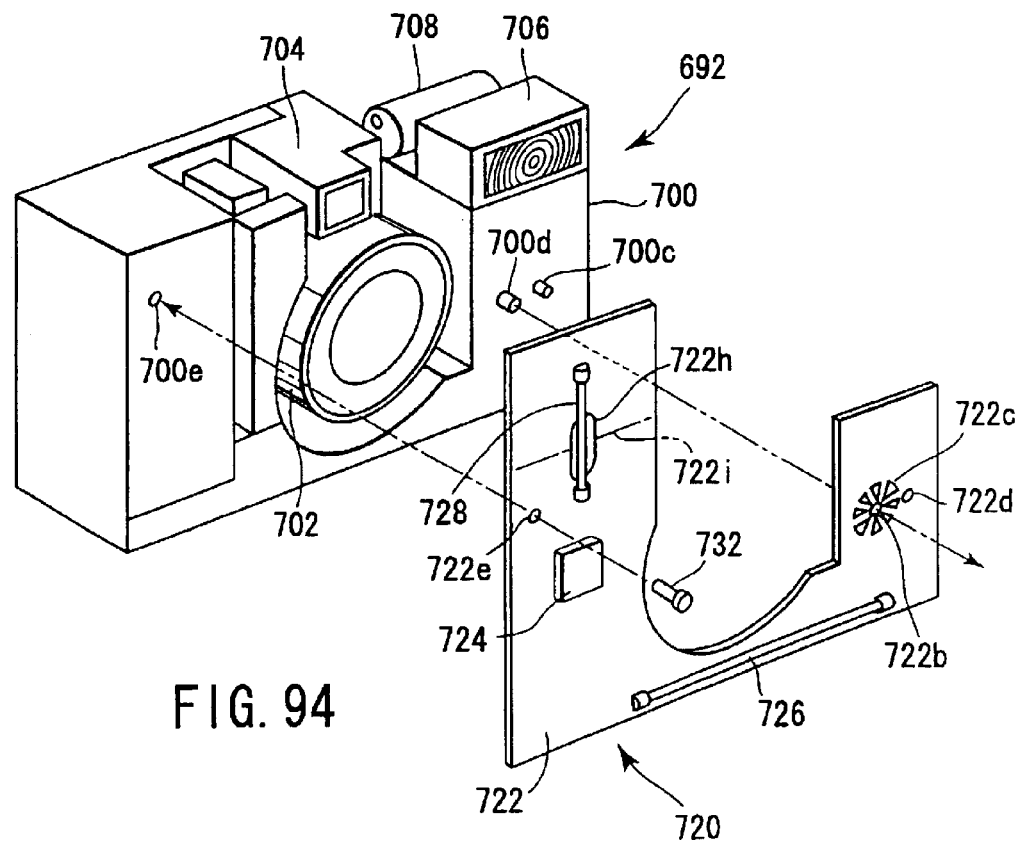
FIG. 94 is an exploded perspective view of the camera main body unit and the FPC substrate unit for the control circuit which are incorporated in the camera according to the 25th embodiment of FIG. 92.
Figure 95:
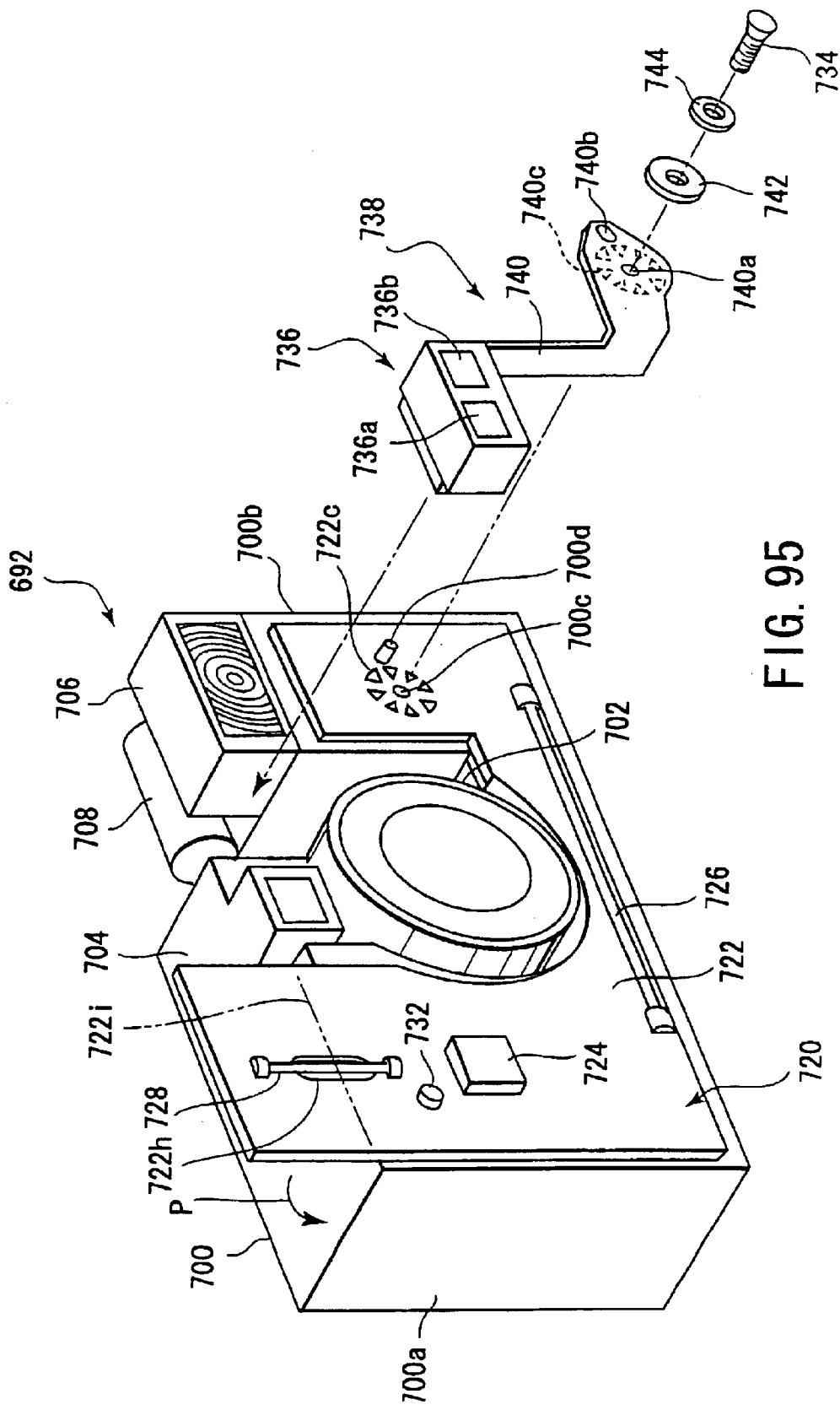
FIG. 95 is an exploded perspective view of the camera main body unit on which the FPC substrate unit for the control circuit is mounted, and the FPC substrate unit for AF in the camera according to the 25th embodiment of FIG. 92.

FIG. 92 is an exploded perspective view of the camera. FIG. 93 is a front view of the FPC unit for a control circuit which is built in the camera in a state before incorporated. FIG. 94 is an exploded perspective view of the camera main body unit and the FPC unit for the camera control circuit which are incorporated in the camera. FIG. 95 is an exploded perspective view of the camera main body unit on which the FPC unit for the control circuit is mounted, and the FPC unit for AF.

As shown in FIG. 92, the camera 690 comprises: a front cover 694 and a rear cover 696 which form a first assembly unit; and a camera main body unit 692 which is a second assembly unit constituting a part of the apparatus. When the front cover 694 and the rear cover 696 are attached to the front and rear of the camera main body unit 692, the camera 690 is completed.

The front cover 694 is a cover member with which the front surface of the camera main body unit 692 is covered, and includes a photography lens opening 694a, a finder window 694b, light receiving windows for ranging 694c, 694d, and a flash light emitting window 694e in the front-surface portion of the cover. A release button 694f is disposed in the upper-surface portion of the front cover 694.

The rear cover 696 is a cover member with which the rear surface of the camera main body unit 692 is covered, and includes a finder eyepiece window 696a disposed in the rear-surface portion of the cover.

The camera main body unit 692 mainly includes: a camera main body 700 including a film cartridge chamber portion 700a and a spool chamber portion 700b disposed on the left and right sides; and a photography lens body tube 702 disposed in the front-surface portion of the camera main body 700. Furthermore, the camera main body unit 692 comprises: an FPC unit for AF 712; an FPC unit for a control circuit 720 for. camera control; further a finder unit 704 disposed in the upper-surface portion; and a flash light emitting unit 706.

As shown in the perspective view of FIG. 95, the FPC unit for AF 712 comprises: an AF main body portion 736 as an auto focus circuit unit in which a ranging portion is built in; and an FPC substrate for AF 740 on which the AF main body portion 736 is mounted. The AF main body portion 736 includes light receiving lenses for ranging 736a, 736b.

Moreover, the FPC substrate for AF 740 includes: a contact pattern 740c which can be connected to a contact pattern 722c of an FPC substrate 722 for the control circuit; an attaching hole 740a into the camera main body; and a rotation stopper hole 740b. Furthermore, the tinned wire (not shown) similar to the tinned wire 654 described in the 22nd embodiment is disposed in the bent portion of the FPC substrate 740. Moreover, the tinned wire is bent to shape the FPC substrate 740 in a mounted state before or after attaching the substrate to the camera main body 700.

As shown in the front view of FIG. 93, the FPC unit for the control circuit 720 comprises: the FPC substrate 722; tinned wires 726, 728; and another electric member (not shown).

On the FPC substrate 722, mainly the tinned wires 726, 728, a CPU for camera control 724, and other necessary electric members are mounted. Moreover, on a large flat-surface portion as a first region on one side of a bend line 722i which is a boundary, the tinned wire 726, CPU 724, and the like are mounted. On the other hand, one end of the tinned wire 728 is soldered to the first region over the bend line 722i, and the other end of the wire is soldered to a small flat-surface portion as a second region on the other side of the bend line 722i which is a boundary. It is to be noted that the other electric components are appropriately mounted on the first and second regions as circumstances demand.

The FPC substrate 722 includes a constricted portion 722a to avoid the photography lens body tube 702 in the middle portion. On the right side of the constricted portion 722a (on FIG. 93), a contact pattern portion (electric connection portion) 722c including a contact group, a boss hole 722b for positioning the contact patterns, and a pin hole 722d are disposed. Moreover, a screw insertion through hole 722e for attaching the FPC substrate 722 is disposed on the left side of the constricted portion 722a (on FIG. 93).

Moreover, two lands 722f for soldering the tinned wire 726 are disposed via the constricted portion 722a. Furthermore, in the left upper portion, two lands 722g for soldering the tinned wire 728 are disposed via the bend line 722i extending in the left/right direction in the direction crossing at right angles to the bend line 722i. In the position with which the tinned wire 728 intersects on the bend line 722i, a relief hole 722h is disposed as an elongated hole of an intersection direction.

The tinned wires 726, 728 are soldered on the surface side (on FIG. 93) in the constricted portion 722a of the FPC substrate 722, or two lands 722f or 722g via the bend line 722i.

The tinned wire 726 does not have to be deformed at the attaching time, and does not have to be necessarily a plastically deformable line material. Moreover, when the line material 726 is formed of a single copper material having a certain degree of rigidity as described above, the flat surface of the constricted portion of the FPC substrate 722 can be secured, and it becomes easy to handle the substrate at the assembling time.

The tinned wire 728 is a plasticity electric wire which has slight rigidity but which can plastically be deformed by a certain degree of dynamic in the same manner as in the tinned wire 654 applied in the 22nd embodiment. After the plastic deformation, the deformed shape is held.

The relief hole 722h of the FPC substrate 722 functions as a relief hole at a time when the tinned wire 728 is bent after attached to the camera main body 700 described later.

Next, an assembling procedure of the camera 690 according to the present embodiment constituted as described above will be described.

First, as shown in the perspective views of FIGS. 94 and 95, the FPC unit for the control circuit 720 and an FPC unit for AF 738 are attached to the camera main body 700 of the camera main body unit 692 in which the finder unit 704 is incorporated. That is, as shown in the perspective view of FIG. 94, the tinned wires 726, 728 of the FPC unit for the control circuit 720 are disposed outside, and a boss portion 700c and positioning pin 700b of the camera main body 700 are inserted through the boss hole 722b and positioning pin hole 722d of the FPC substrate 722. Then, a screw 732 is inserted through the screw insertion through hole 722e of the FPC substrate 722 to mesh with a screw through 700e of the FPC substrate 722, and the FPC unit 720 is brought into an attached state (mounted state).

Subsequently, as shown in the perspective view of FIG. 95, the FPC unit for AF 738 on which the AF unit 736 is mounted is attached to the camera main body unit 692 on which the FPC unit for the control circuit 720 is mounted. In this case, the portion of the AF unit 736 is fixed to the predetermined position in the upper part of the camera main body 700, and the boss portion 722c of the 700 in which the contact pattern portion 722c of the FPC substrate 722 is inserted and the positioning pin 722d are inserted through the boss hole 740a and positioning pin hole 740b of the FPC substrate 740. The method further comprises: attaching a rubber seat 742 and washer 744 to a screw 734; allowing the screw to mesh with a thread portion of the boss portion 700c; and fixing the FPC substrate 722 to the FPC substrate 740 in a tightened state.

Then, an upward projecting portion (the portion of the second region) of the FPC substrate 722 of the FPC unit for the control circuit 720 in the main body is bent together with the tinned wire 728 along the bend line 722i in a P direction on the camera main body 700 side. In this state, the FPC substrate 722 extends along the upper-surface portion of the camera main body 700 (see FIG. 92).

That is, when the tinned wire 728 is bent and plastically deformed, and the plastically deformed state is held, the bent state of the second region of the FPC unit for the control circuit 720 is held. It is to be noted that in the bent/shaped state, as described in the structure of the modification example in which the bend direction is reversed with respect to the FPC unit 650 of the 22nd embodiment, the bent portion of the tinned wire 728 escapes in the relief hole 722h and therefore slack is not generated in the FPC substrate 722.

The camera main body unit 692 to which the FPC unit for the control circuit 720 and the AF unit including the FPC unit for AF 738 are attached indicates an completely assembled state of the unit. In this state, the contact pattern portion 722c of the FPC unit for the control circuit 720 is electrically connected to the contact pattern portion 740c of the FPC unit for AF 738, and an operation can be confirmed in the state.

Subsequently, the method comprises: attaching the front cover 694 and rear cover 696 to the camera main body unit 692 on the front-surface side and rear-surface side; and fixing the covers by the screws, so that the camera 690 is completed.

According to the structure of the camera 690 of the 22nd embodiment, with respect to the camera main body unit 692 before attaching the front cover 694 and rear cover 696 to the camera main body unit 692, the FPC unit for the control circuit 720 and the FPC unit for AF 738 are attached. In this state, the FPC substrates 722 and 740 are held without vibrating. Therefore, in an operation confirmation operation before attaching the front cover 694 and rear cover 696, and further in the attaching operation of the front cover 694 and rear cover 696, the FPC substrates 722, 740 are not obstacles, and accidents do not easily occur such as the FPC substrates caught by the obstacles.

Moreover, the bending/shaping operation of the upper part of the FPC substrate 722 along the bend line 722i is performed while the FPC substrate 722 is attached to the camera main body 700. Therefore, the bending operation is easily performed, and the bent portion of the FPC substrate 722 is securely bent securely along the camera main body 700.

Furthermore, since the bending/shaping operation of the FPC unit is simple, the FPC unit can be stored or conveyed in a flat-surface state as such.

Instead of the tinned wire applied to the above-described 22nd to 25th embodiments, a soft copper line material, or electric materials such as a thin plastically deformable metal plate may also be applied. When the line material is not used especially for electric connection, a plastically deformable nonconductive material may also be applied. Alternatively, a plastically deformable metal line material coated with an insulating material may also be applied.

When the surface is set to be nonconductive in this manner, there is not a possibility of contact with the metal line material on the FPC side or the conductive portion on the FPC or printed wiring substrate. It is to be noted that the tinned wire may be mounted onto the FPC substrate or the printed wiring substrate either automatically or manually.

Moreover, the bend angle of the tinned wire at the attaching time of the FPC substrate into the apparatus unit is not limited to right angles, and the wire may plastically be deformed with a predetermined curvature in accordance with the shapes of the apparatus unit other than the right-angled shape. Furthermore, in the 22nd to 25th embodiments, the tinned wire is fixed so as to cross at right angles to the bend line, but the present invention is not limited to this. The tinned wire may also be inclined and fixed to the bend line in a plastically deformable range in an allowable arrangement.

Furthermore, the mounted state of the tinned wire of the FPC unit 720 according to the 25th embodiment is not limited to the state shown in FIG. 93. In accordance with the shape of the camera main body unit, it is also possible to select and employ the mounted shape of the tinned wire shown in the FPC unit according to the 22nd to 25th embodiments.

Additionally, the present invention can variously be modified without departing from the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A camera comprising:
    a camera exterior housing which forms an outer appearance of the camera;
    a first capacitor; and
    a second capacitor having a longitudinal direction which is substantially parallel to a longitudinal direction of the first capacitor;
    wherein the camera exterior housing includes an inclined surface, and a first end surface of the first capacitor and a first end surface of the second capacitor are disposed along an inner wall of the inclined surface so as to form a step.

2. The camera according to claim 1, wherein the first capacitor and the second capacitor have different lengths along the longitudinal directions thereof.

3. The camera according to claim 1, wherein a second end surface of the first capacitor and a second end surface of the second capacitor are in substantially a same plane.

4. The camera according to claim 1, wherein the first capacitor and the second capacitor are electrically connected via a printed surface.

5. The camera according to claim 1, wherein the first capacitor and the second capacitor are electrically connected via a flexible printed substrate placed along the inner wall of the exterior housing.

6. The camera according to claim 1, further comprising a printed substrate connected to a second end surface of the first capacitor and a second end surface of the second capacitor so as to electrically connect the first capacitor and the second capacitor.

7. The camera according to claim 3, further comprising:
    a plurality of first lead terminals formed on the second end surface of the first capacitor and arranged in a predetermined direction;
    a plurality of second lead terminals formed on the first end surface of the second capacitor and arranged in the predetermined direction;
    wherein the predetermined direction is substantially normal to the longitudinal directions of the first and second capacitors.

8. The camera according to claim 7, wherein the first capacitor and the second capacitor are electrically connected by a printed substrate via the plurality of first and second lead terminals.

9. The camera according to claim 8, wherein the plurality of first and second lead terminals are arranged such that lead terminals to be connected to each other respectively face each other across the printed substrate.

10. The camera according to claim 8, wherein the first capacitor and the second capacitor are electrically connected in parallel.

11. The camera according to claim 7, wherein the first capacitor and the second capacitor are electrically connected by a flexible printed substrate placed along the inner wall of the exterior housing, via the plurality of first and second lead terminals.

12. The camera according to claim 7, wherein the plurality of first lead terminals includes at least a first positive lead terminal and a first negative lead terminal, and the plurality of second lead terminals includes at least a second positive lead terminal and a second negative lead terminal; and
    wherein the first positive lead terminal and the second positive lead terminal are arranged to face each other and the first negative lead terminal and the second negative lead terminal are arranged to face each other.

13. The camera according to claim 12, wherein the first positive lead terminal and the second positive lead terminal are electrically connected, and the first negative lead terminal and the second negative lead terminal are electrically connected by a flexible printed substrate placed along the inner wall of the exterior housing.

14. A camera comprising:
    a camera exterior housing which covers the camera;
    a first electric part; and
    a second electric part having a longitudinal direction which is substantially parallel to a longitudinal direction of the first electric part;
    wherein the camera exterior housing includes an inclined surface, and a first end surface of the first electric part and a first end surface of the second electric part are disposed along an inner wall of the inclined surface so as to form a step.

15. The camera according to claim 14, wherein the first electric part and the second electric part have different lengths along the longitudinal directions thereof.

16. The camera according to claim 14, wherein a second end surface of the first electric part and a second end surface of the second electric part are in substantially a same plane.

17. The camera according to claim 14, wherein the first electric part and the second electric part are electrically connected via a printed surface.

18. The camera according to claim 14, wherein the first electric part and the second electric part are electrically connected via a flexible printed substrate placed along the inner wall of the exterior housing.

19. The camera according to claim 14, further comprising a printed substrate connected to a second end surface of the first electric part and a second end surface of the second electric part so as to electrically connect the first electric part and the second electric part.

20. The camera according to claim 16, further comprising:

a plurality of first lead terminals formed on the second end surface of the first electric part and arranged in a predetermined direction;

a plurality of second lead terminals formed on the first end surface of the second electric part and arranged in the predetermined direction;

wherein the predetermined direction is substantially normal to the longitudinal directions of the first and second electric parts.

21. The camera according to claim 20, wherein the first electric part and the second electric part are electrically connected by a printed substrate via the plurality of first and second lead terminals.

22. The camera according to claim 21, wherein the plurality of first and second lead terminals are arranged such that lead terminals to be connected to each other respectively face each other across the printed substrate.

23. The camera according to claim 20, wherein the first electric part and the second electric part are electrically connected by a flexible printed substrate placed along the inner wall of the exterior housing, via the plurality of first and second lead terminals.

24. A camera comprising:

a first electric part;

a second electric part having a longitudinal direction which is substantially parallel to a longitudinal direction of the first electric part;

a plurality of first lead terminals formed on a first longitudinal end of the first electric part and arranged in a predetermined direction;

a plurality of second lead terminals formed on a first longitudinal end of the second electric part and arranged in the predetermined direction;

wherein the first electric part and the second electric part are arranged such that the first ends thereof on which the lead terminals are disposed form a step between the first electric part and the second electric part; and wherein the predetermined direction is substantially normal to the longitudinal directions of the first and second electric parts.

25. The camera according to claim 24, wherein the plurality of first lead terminals includes at least a first positive lead terminal and a first negative lead terminal, and the plurality of second lead terminals includes at least a second positive lead terminal and a second negative lead terminal; and wherein the first positive lead terminal and the second positive lead terminal are arranged to face each other and the first negative lead terminal and the second negative lead terminal are arranged to face each other.

26. The camera according to claim 24, wherein the first electric part and the second electric parts are electrically connected by a printed substrate via the plurality of first and second lead terminals.

27. The camera according to claim 26, wherein the printed substrate comprises a flexible printed substrate, and the flexible printed substrate is arranged along the step between the first electric part and second electric part.

* * * * *